(12) United States Patent
Iwai et al.

(10) Patent No.: US 12,532,473 B2
(45) Date of Patent: Jan. 20, 2026

(54) THREE-DIMENSIONAL MEMORY DEVICE CONTAINING ISOLATION STRUCTURES AND METHODS FOR FORMING THE SAME

(71) Applicant: SANDISK TECHNOLOGIES LLC, Addison, TX (US)

(72) Inventors: Takaaki Iwai, Yokkaichi (JP); Kazushi Komeda, Yokkaichi (JP); Zhen Chen, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 222 days.

(21) Appl. No.: 18/347,838

(22) Filed: Jul. 6, 2023

(65) Prior Publication Data
US 2023/0363165 A1    Nov. 9, 2023

Related U.S. Application Data

(63) Continuation-in-part of application No. 17/577,533, filed on Jan. 18, 2022, now Pat. No. 12,127,406.
(Continued)

(51) Int. Cl.
*H10B 43/27* (2023.01)
*H01L 23/00* (2006.01)
(Continued)

(52) U.S. Cl.
CPC ............. *H10B 43/27* (2023.02); *H01L 24/08* (2013.01); *H01L 24/80* (2013.01);
(Continued)

(58) Field of Classification Search
None
See application file for complete search history.

(56) References Cited

U.S. PATENT DOCUMENTS

| 5,915,167 A | 6/1999 | Leedy |
| 8,847,302 B2 | 9/2014 | Alsmeier et al. |

(Continued)

FOREIGN PATENT DOCUMENTS

| KR | 10-2016-0038145 A | 4/2016 |
| WO | WO2018-174966 A1 | 9/2018 |

OTHER PUBLICATIONS

Endoh et al., "Novel Ultra High-Density Memory with a Stacked-Surrounding Gate Transistor (S-SGT) Structured Cell," IEDM Proc. (2001) 33-36.
(Continued)

*Primary Examiner* — Anthony Ho
(74) *Attorney, Agent, or Firm* — THE MARBURY LAW GROUP PLLC

(57) ABSTRACT

A semiconductor structure includes an alternating stack of insulating layers and composite layers, each of the composite layers includes a plurality of electrically conductive word line strips and a plurality of dielectric isolation structures, and each of the insulating layers has an areal overlap with each electrically conductive word line strip and each dielectric isolation structure within the composite layers within a memory array region in a plan view along a vertical direction, rows of memory openings arranged along the first horizontal direction, where each row of memory openings of the rows of memory openings vertically extends through each insulating layer within the alternating stack and one electrically conductive strip for each of the composite layers, and rows of memory opening fill structures located within the rows of memory openings, where each of the memory opening fill structures includes a vertical stack of memory elements and a vertical semiconductor channel.

16 Claims, 77 Drawing Sheets

Related U.S. Application Data

(60) Provisional application No. 63/487,940, filed on Mar. 2, 2023.

(51) Int. Cl.
   *H01L 25/00* (2006.01)
   *H01L 25/065* (2023.01)
   *H01L 25/18* (2023.01)
   *H10B 80/00* (2023.01)

(52) U.S. Cl.
   CPC .......... *H01L 25/0657* (2013.01); *H01L 25/18* (2013.01); *H01L 25/50* (2013.01); *H10B 80/00* (2023.02); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(56) References Cited

U.S. PATENT DOCUMENTS

| | | |
|---|---|---|
| 9,455,267 B2 | 9/2016 | Zhang et al. |
| 9,917,093 B2 | 3/2018 | Chu et al. |
| 9,922,987 B1 | 3/2018 | Mizutani et al. |
| 9,972,640 B1 | 5/2018 | Kai et al. |
| 10,103,161 B2 | 10/2018 | Ito et al. |
| 10,192,878 B1 | 1/2019 | Tsutsumi et al. |
| 10,195,781 B2 | 2/2019 | Dygert et al. |
| 10,256,247 B1 | 4/2019 | Kanakamedala et al. |
| 10,276,583 B2 | 4/2019 | Sharangpani et al. |
| 10,283,493 B1 | 5/2019 | Nishida |
| 10,347,654 B1 | 7/2019 | Iwai et al. |
| 10,490,564 B2 | 11/2019 | Mushiga et al. |
| 10,510,738 B2 | 12/2019 | Kim et al. |
| 10,586,803 B2 | 3/2020 | Mushiga et al. |
| 10,615,172 B2 | 4/2020 | Nagata et al. |
| 10,629,616 B1 | 4/2020 | Kai et al. |
| 10,847,524 B2 | 11/2020 | Otsu et al. |
| 10,923,498 B2 | 2/2021 | Otsu et al. |
| 10,985,171 B2 | 4/2021 | Kaneko et al. |
| 11,018,151 B2 | 5/2021 | Kaneko |
| 11,049,807 B2 | 6/2021 | Li et al. |
| 11,114,459 B2 | 9/2021 | Iwai et al. |
| 11,139,237 B2 | 10/2021 | Shao et al. |
| 11,201,107 B2 | 12/2021 | Okina et al. |
| 11,393,836 B2 | 7/2022 | Tsutsumi et al. |
| 11,450,685 B2 | 9/2022 | Yoshida |
| 11,482,539 B2 | 10/2022 | Sharangpani et al. |
| 11,515,250 B2 | 11/2022 | Titus et al. |
| 11,532,570 B2 | 12/2022 | Mizuno et al. |
| 11,631,690 B2 | 4/2023 | Okina |
| 11,631,695 B2 | 4/2023 | Sharangpani et al. |
| 2013/0264631 A1 | 10/2013 | Alsmeier et al. |
| 2015/0137210 A1 | 5/2015 | Nam et al. |
| 2016/0086969 A1 | 3/2016 | Zhang et al. |
| 2017/0373078 A1 | 12/2017 | Chu et al. |
| 2017/0373087 A1 | 12/2017 | Ito et al. |
| 2018/0033646 A1 | 2/2018 | Sharangpani et al. |
| 2019/0221557 A1 | 7/2019 | Kim et al. |
| 2019/0326306 A1 | 10/2019 | Mushiga et al. |
| 2019/0326307 A1 | 10/2019 | Mushiga et al. |
| 2019/0348435 A1 | 11/2019 | Nagata et al. |
| 2020/0243382 A1 | 7/2020 | Chen et al. |
| 2021/0028111 A1 | 1/2021 | Kai et al. |
| 2021/0035965 A1 | 2/2021 | Mizutani et al. |
| 2021/0057336 A1 | 2/2021 | Shao et al. |
| 2021/0091063 A1 | 3/2021 | Ninomiya et al. |
| 2021/0134827 A1 | 5/2021 | Iwai et al. |
| 2021/0210424 A1 | 7/2021 | Otsu et al. |
| 2021/0210428 A1 | 7/2021 | Ohsawa et al. |
| 2021/0210503 A1 | 7/2021 | Matsuno et al. |
| 2021/0210504 A1 | 7/2021 | Otsu et al. |
| 2021/0408025 A1 | 12/2021 | Hinoue |
| 2021/0408035 A1 | 12/2021 | Sato et al. |
| 2022/0130853 A1 | 4/2022 | Sharangpani et al. |
| 2022/0157841 A1 | 5/2022 | Tsutsumi et al. |
| 2022/0157842 A1 | 5/2022 | Tsutsumi et al. |
| 2022/0189984 A1 | 6/2022 | Okina |
| 2022/0254733 A1 | 8/2022 | Mizuno et al. |
| 2022/0336484 A1 | 10/2022 | Iwai et al. |

OTHER PUBLICATIONS

ISR—Notification of Transmittal of The International Search Report and Written Opinion of the International Searching Authority for International Patent Application No. PCT/US2022/029818, mailed Oct. 20, 2022, 11 pages.

U.S. Appl. No. 17/577,533, filed Jan. 18, 2022, SanDisk Technologies LLC.

USPTO Office Communication, Non-Final Office Action for U.S. Appl. No. 17/577,533, mailed May 16, 2024, 22 pages.

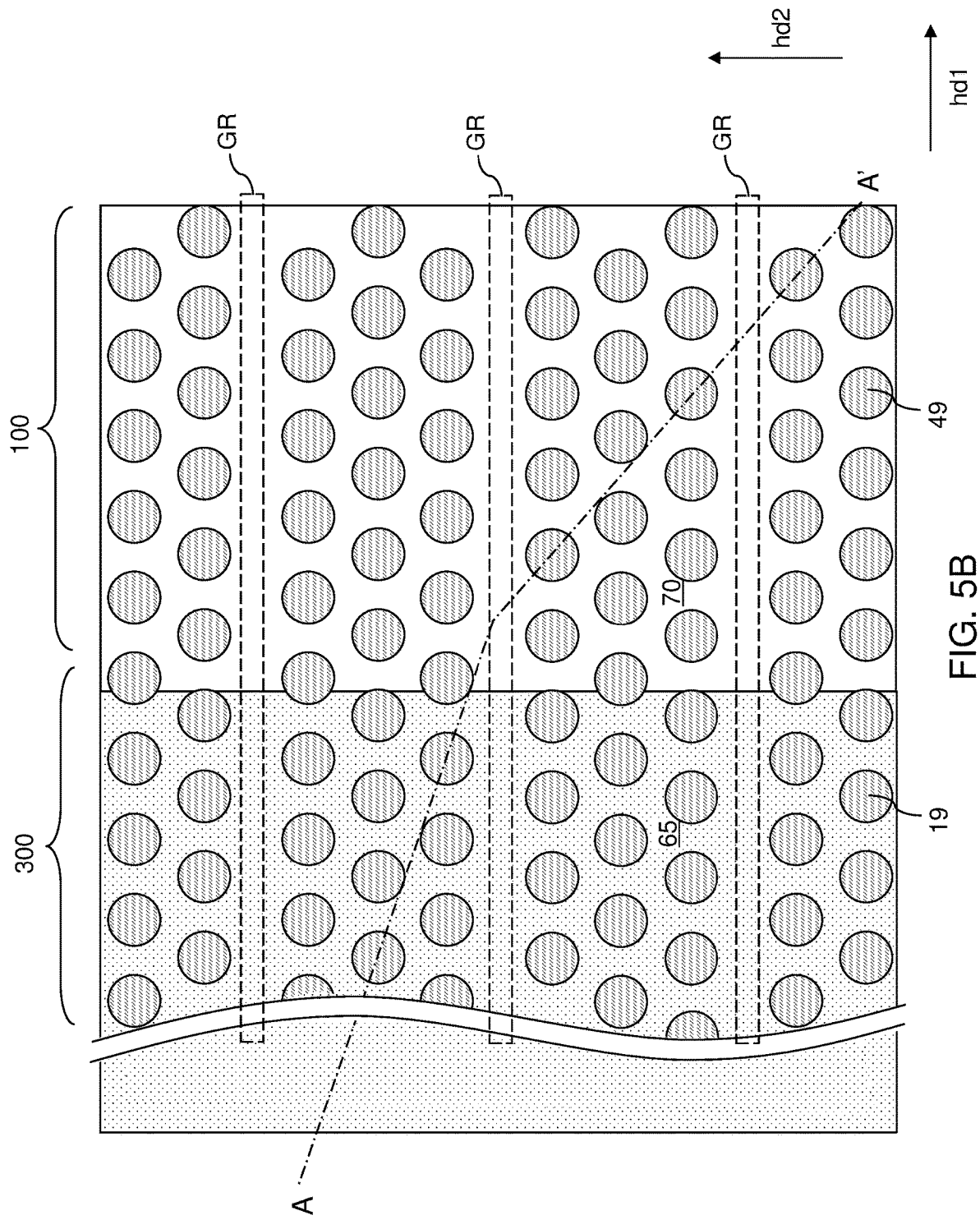

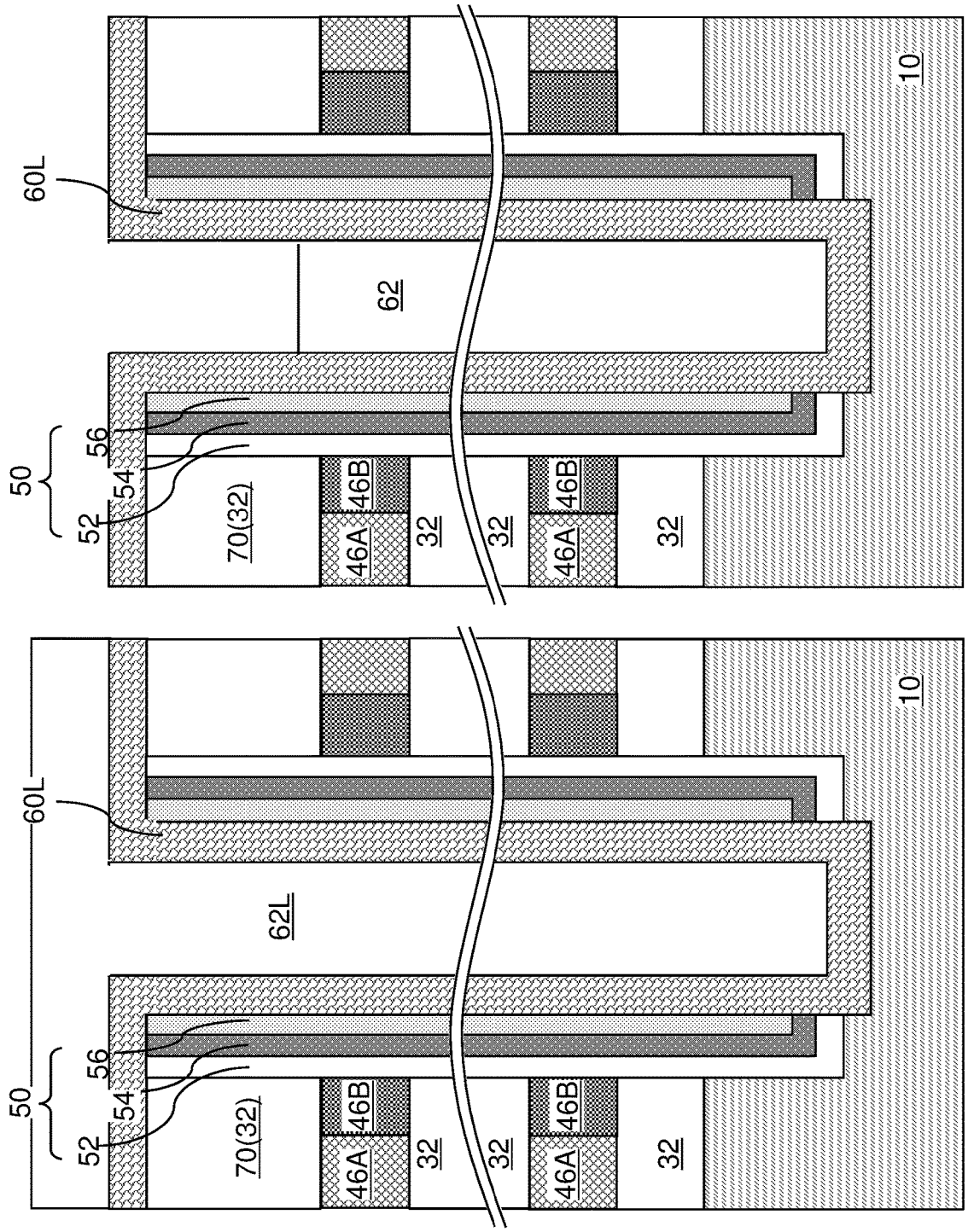

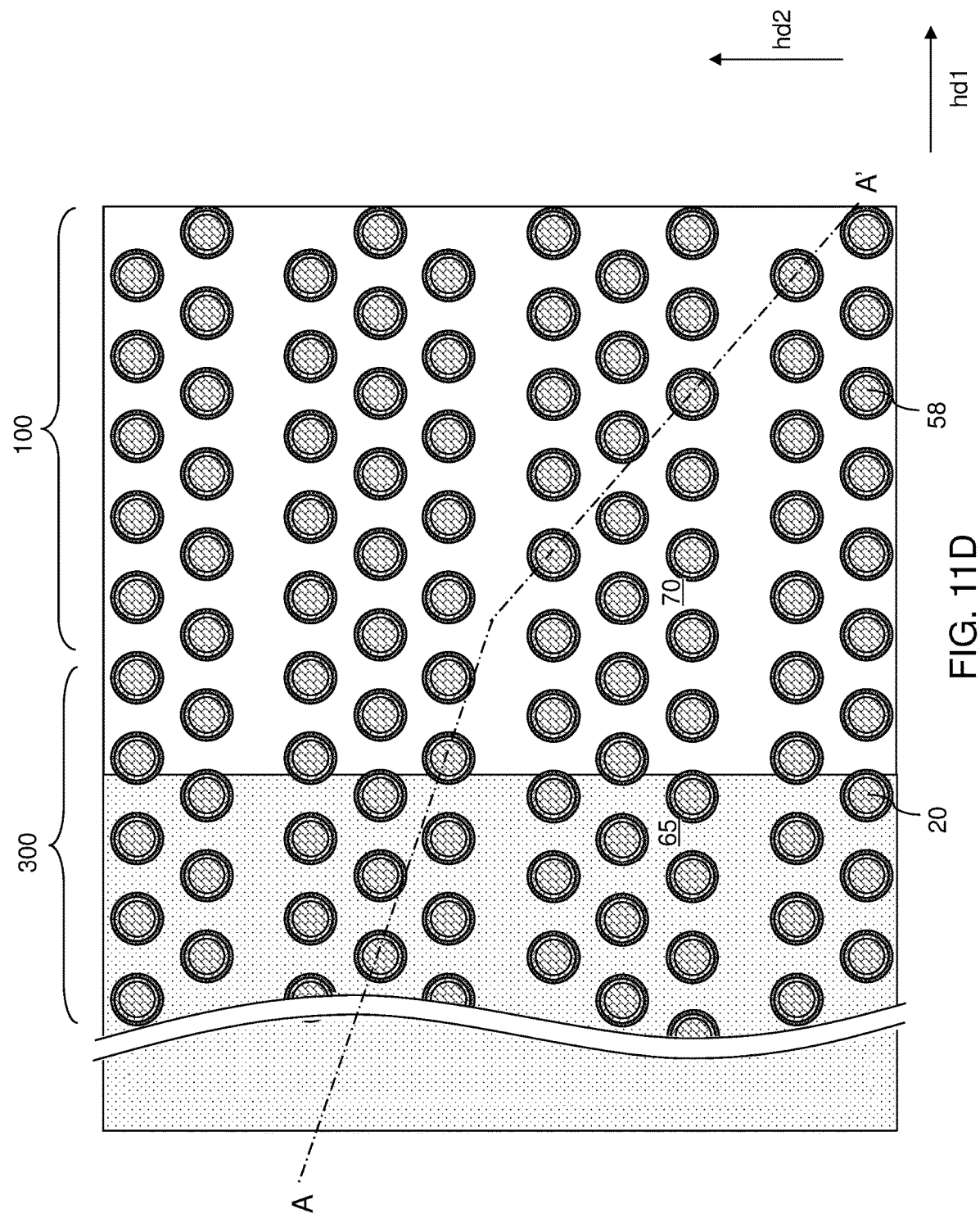

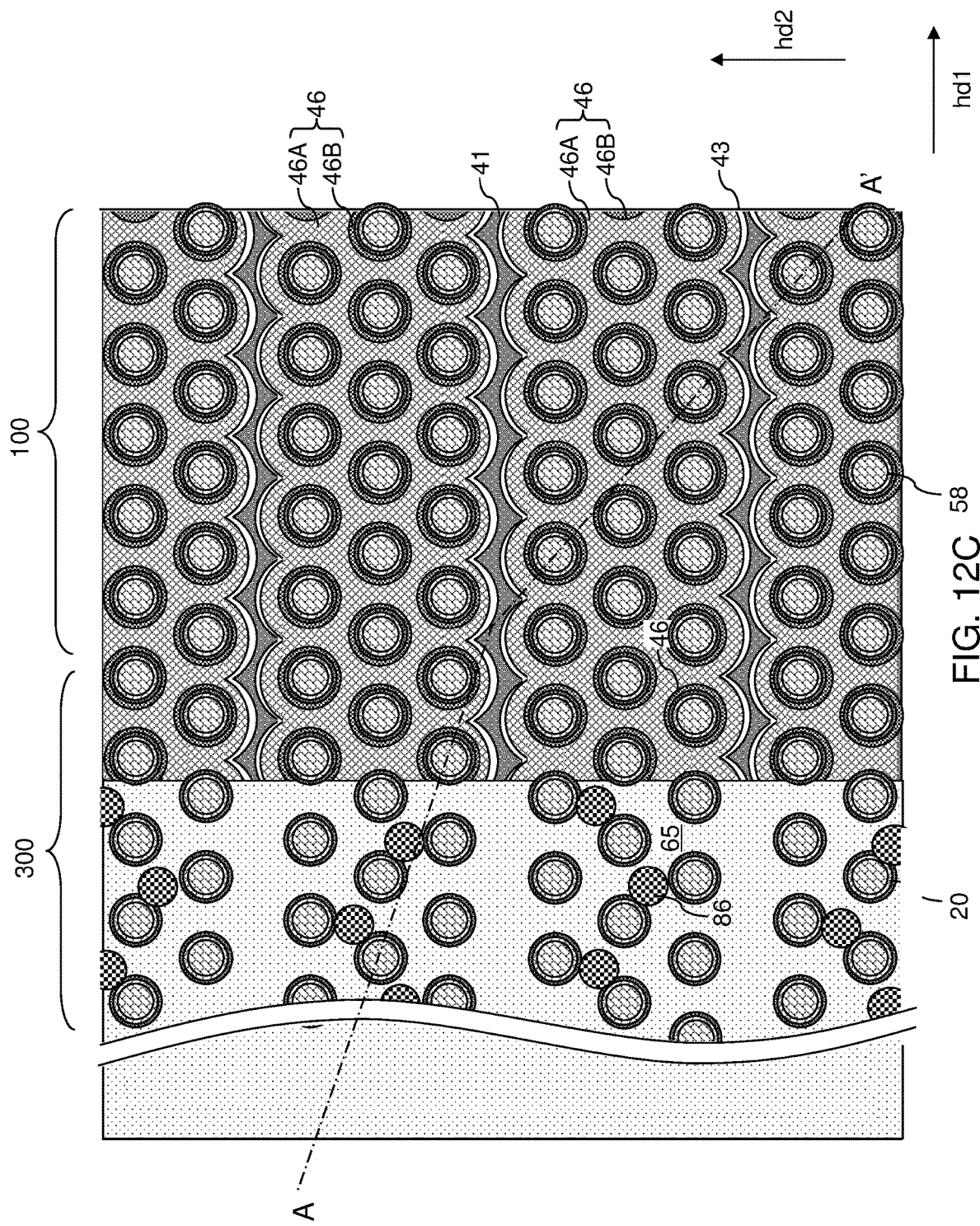

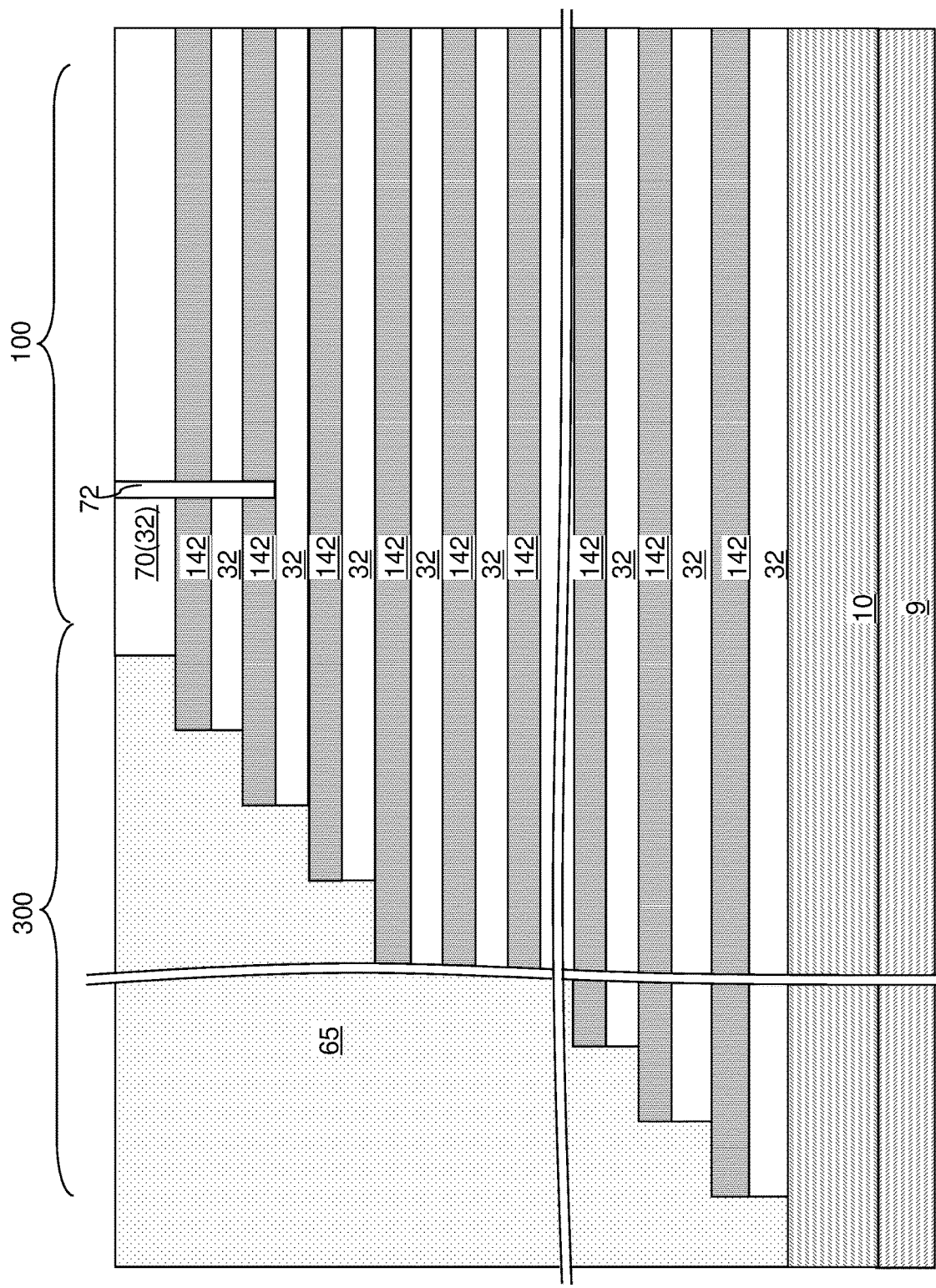

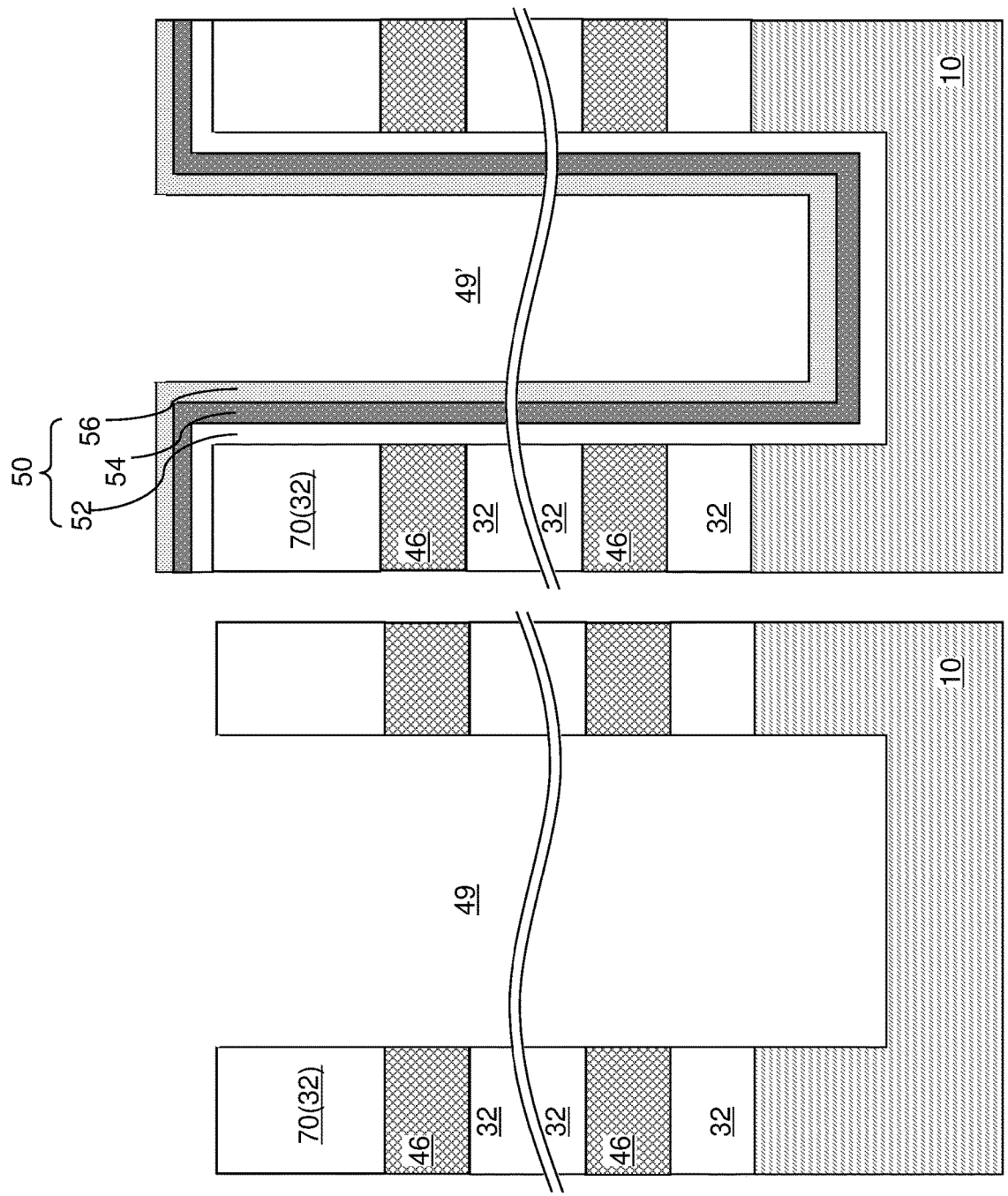

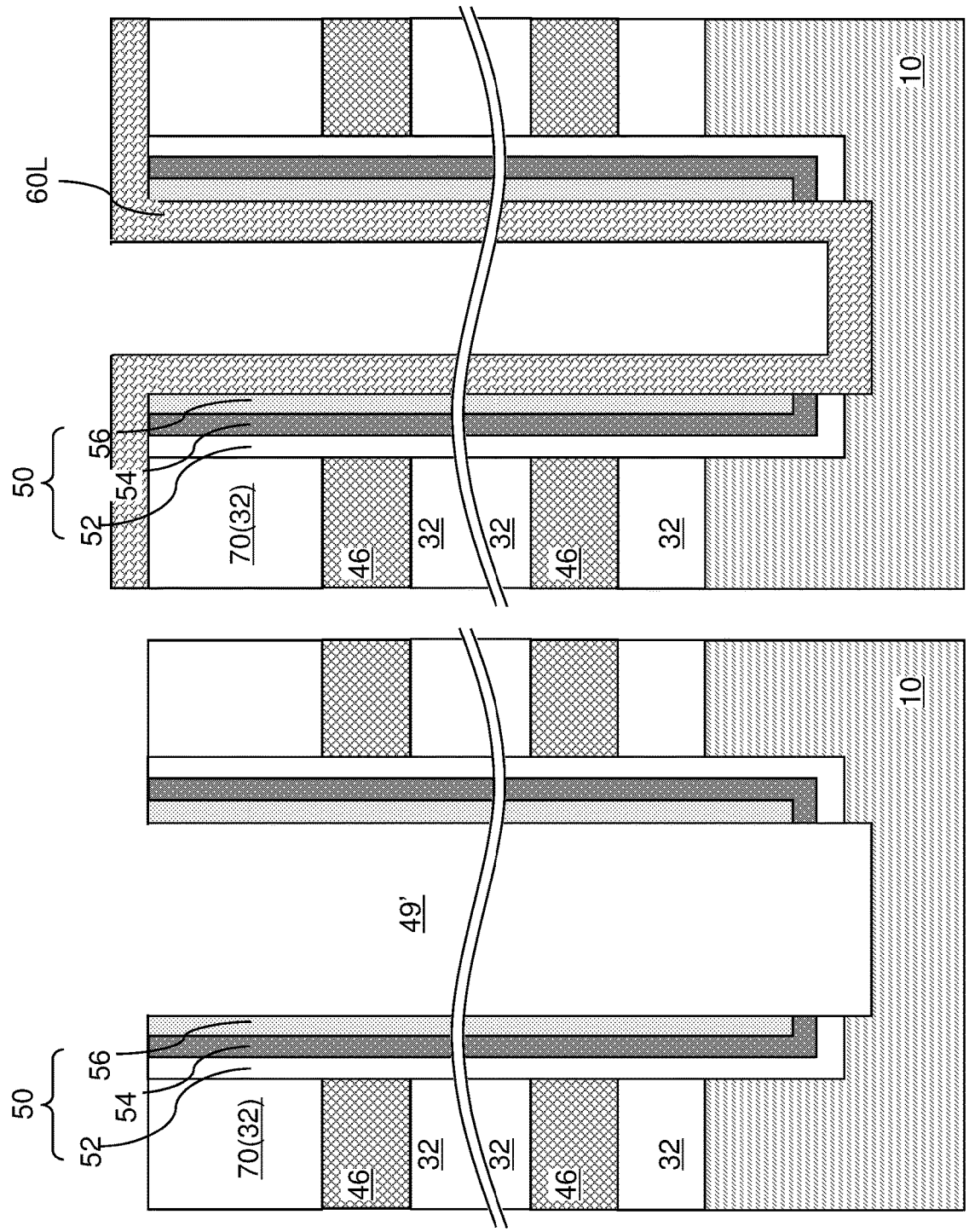

THREE-DIMENSIONAL MEMORY DEVICE CONTAINING ISOLATION STRUCTURES AND METHODS FOR FORMING THE SAME

RELATED APPLICATIONS

This application is a continuation-in-part (CIP) application of U.S. application Ser. No. 17/577,533 filed on Jan. 18, 2022, the entire contents of which are incorporated herein by reference.

FIELD

The present disclosure relates generally to the field of semiconductor devices, and particularly to a three-dimensional memory device containing an array of isolation structures and methods for forming the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure includes an alternating stack of insulating layers and composite layers, each of the composite layers includes a plurality of electrically conductive word line strips and a plurality of dielectric isolation structures, and each of the insulating layers has an areal overlap with each electrically conductive word line strip and each dielectric isolation structure within the composite layers within a memory array region in a plan view along a vertical direction, rows of memory openings arranged along the first horizontal direction, where each row of memory openings of the rows of memory openings vertically extends through each insulating layer within the alternating stack and one electrically conductive strip for each of the composite layers, and rows of memory opening fill structures located within the rows of memory openings, where each of the memory opening fill structures includes a vertical stack of memory elements and a vertical semiconductor channel.

According to another aspect of the present disclosure, a method of forming a semiconductor structure is provided. The method comprises: forming an alternating stack of insulating layers and spacer material layers over a substrate; forming a two-dimensional array of memory openings through the alternating stack, wherein the memory openings are located at a first subset of sites of a two-dimensional periodic array in a plan view, the first subset being less than an entirety of the sites of the two-dimensional periodic array, and the memory openings are not present at a second subset of the sites of the two-dimensional periodic array that is a complement of the first subset; laterally recessing the spacer material layers selective to the insulating layers by performing an isotropic etch process that supplies an isotropic etchant through the memory openings to form a plurality of laterally-extending cavities, wherein remaining portions of each of the spacer material layers comprise a respective two-dimensional array of spacer plate cores located at the second subset of the sites of the two-dimensional periodic array in the plan view; forming electrically conductive layers within the laterally-extending cavities such that each of the electrically conductive layers laterally surrounds the two-dimensional array of memory openings; and forming memory opening fill structures within the memory openings, wherein each of the memory opening fill structures comprises a respective vertical stack of memory elements and a respective vertical semiconductor channel.

According to an aspect of the present disclosure, a semiconductor structure is provided, which comprises: an alternating stack of insulating layers and composite layers, wherein each of the composite layers comprises a respective plurality of electrically conductive word line strips laterally extending along a first horizontal direction and a plurality of dielectric isolation strips laterally extending along the first horizontal direction, wherein the plurality of electrically conductive word line strips and the plurality of dielectric isolation strips are interlaced with each other along a second horizontal direction that is perpendicular to the first horizontal direction, and each of the insulating layers continuously extends along the second horizontal direction and has an areal overlap with each electrically conductive strip and each dielectric isolation strip within the composite layers within a memory array region in a plan view along a vertical direction; rows of memory openings arranged along the first horizontal direction, wherein each row of memory openings of the rows of memory openings vertically extends through each insulating layer within the alternating stack and one electrically conductive strip for each of the composite layers; and rows of memory opening fill structures located within the rows of memory openings, wherein each of the memory opening fill structures comprises a vertical stack of memory elements and a vertical semiconductor channel.

According to another aspect of the present disclosure, a method of forming a semiconductor structure is provided, which comprises: forming an alternating stack of insulating layers and dielectric material layers over a substrate; forming rows of memory openings arranged along a first horizontal direction through the alternating stack; laterally recessing the dielectric material layers selective to the insulating layers through the memory openings to form a plurality of laterally-extending cavities, wherein remaining portions of each of the dielectric material layers comprise a plurality of dielectric isolation strips that laterally extend along the first horizontal direction and that are laterally spaced apart along a second horizontal direction that is perpendicular to the first horizontal direction; forming electrically conductive word line strips through the memory openings within the laterally-extending cavities such that each of the electrically conductive word line strips laterally surrounds at least one row of memory openings; and forming memory opening fill structures within the memory openings, wherein each of the memory opening fill structures comprises a respective vertical stack of memory elements and a respective vertical semiconductor channel.

BRIEF DESCRIPTION OF THE DRAWINGS

FIG. 5B is a top-down view of the first exemplary structure of FIG. 5A.

FIGS. 10A-10G are sequential schematic vertical cross-sectional views of a memory opening within the first exemplary structure during formation of a memory opening fill structure therein according to an embodiment of the present disclosure.

FIG. 11D is a horizontal cross-sectional view of the first exemplary structure along the horizontal plane D-D' of FIG. 11A.

FIG. 12C is a horizontal cross-sectional view of the first exemplary structure along the horizontal plane C-C' of FIG. 12A.

FIG. 22A is a vertical cross-sectional view of a second exemplary structure after formation of stepped surfaces and a stepped dielectric material portion according to an embodiment of the present disclosure.

FIGS. 30A-30G are sequential vertical cross-sectional views of a region around a memory opening during formation of a memory opening fill structure according to an embodiment of the present disclosure.

DETAILED DESCRIPTION

Figure 1:
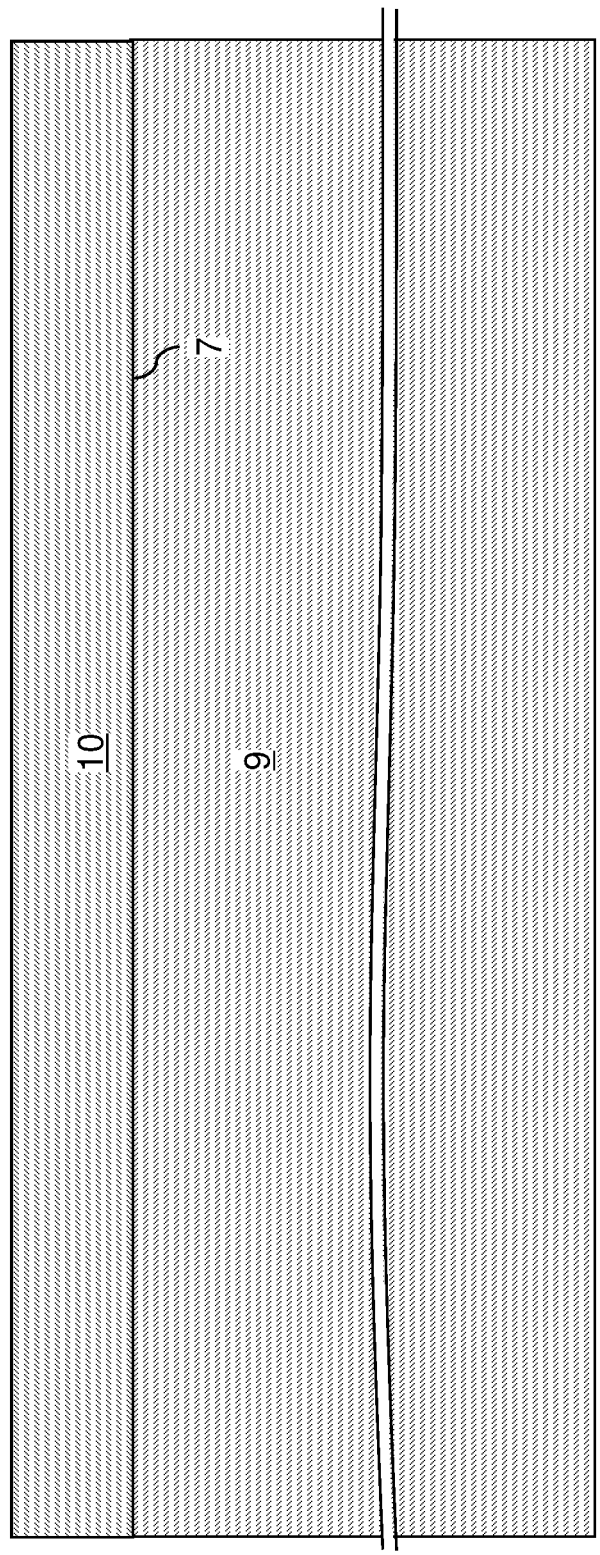
FIG. 1 is a schematic vertical cross-sectional view of an exemplary including a substrate material layer according to an embodiment of the present disclosure.

As discussed above, the embodiments of the present disclosure are directed to three-dimensional memory devices containing an array of isolation structures, such as self-aligned isolation strips and spacer plate structures and methods for forming word lines through memory openings, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Referring to FIG. 1, a first exemplary structure according to an embodiment of the present disclosure is illustrated, which can be used, for example, to fabricate a device structure containing vertical NAND memory devices. The first exemplary structure includes a substrate material layer 9 and a semiconductor material layer 10 located on a top surface of the substrate material layer 9. In one embodiment, the substrate material layer 9 and the semiconductor material layer 10 may be provided as a commercially available single crystalline semiconductor (e.g., silicon) wafer. A surface portion of the single crystalline semiconductor wafer can include the semiconductor material layer 10, and a bulk portion of the single crystalline semiconductor wafer can include the substrate material layer 9 that is subsequently removed, for example, by backside grinding. For example, the semiconductor material layer 10 may comprise a doped single crystalline silicon well in a top surface of a silicon wafer 9. In some embodiments, an interface 7 between the substrate material layer 9 and the semiconductor material layer 10 may be located at a depth that corresponds to a target stopping plane for the backside grinding process. Alternatively, the semiconductor material layer 10 can include a single crystalline or polycrystalline semiconductor material layer provided on the substrate material layer 9 including a material different from the material of the semiconductor material layer 10. In this case, the substrate material layer 9 can include an insulating material (such as sapphire or silicon oxide), a conductive material, or a semiconductor material different from the material of the semiconductor material layer 10. The thickness of the substrate material layer 9 can be thick enough to mechanically support the semiconductor material layer 10 and structures to be subsequently formed thereupon. For example, the substrate material layer 9 can have a thickness in a range from 60 microns to 1,000 microns. The thickness of the semiconductor material layer 10 may be in a range from 100 nm to 5,000 nm, although lesser and greater thicknesses can also be used. The semiconductor material layer 10 includes at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 2:
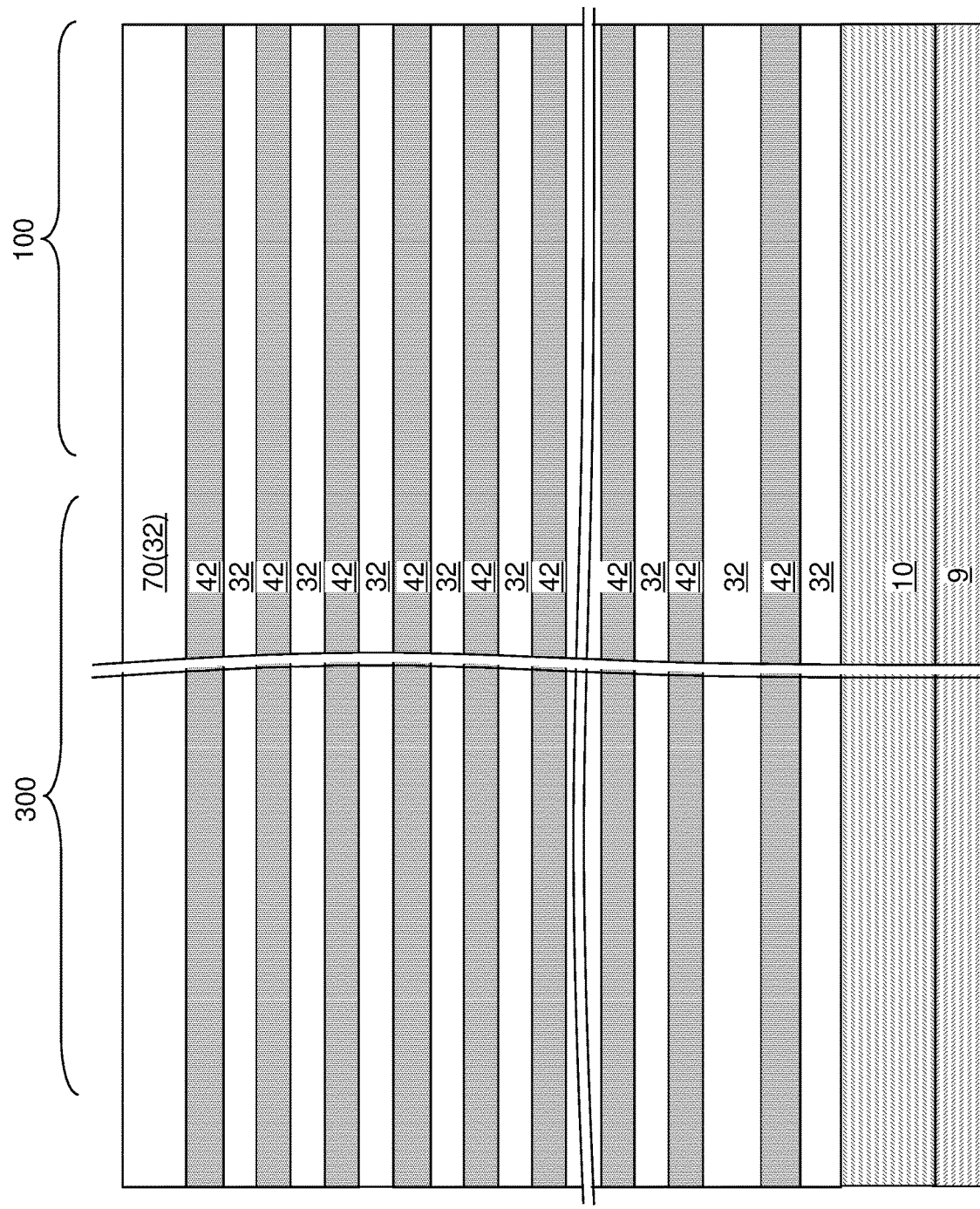
FIG. 2 is a schematic vertical cross-sectional view of the first exemplary structure after formation of an alternating stack of insulating layers and dielectric material layers according to an embodiment of the present disclosure.

Referring to FIG. 2, a stack of an alternating plurality of first material layers (which can be insulating layers 32) and second material layers (which can be dielectric material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a dielectric material layer. In this case, the stack can include an alternating plurality of insulating layers 32 and dielectric material layers 42, and constitutes a prototype stack of alternating layers comprising insulating layers 32 and dielectric material layers 42.

The stack of the alternating plurality is herein referred to as an alternating stack (32, 42). In one embodiment, the alternating stack (32, 42) can include insulating layers 32 composed of the first material, and dielectric material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the dielectric material layers 42 is a dielectric material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

Portions of the dielectric material layers 42 can be subsequently replaced with electrically conductive electrodes which can function, for example, as control gate electrodes of a vertical NAND device. Non-limiting examples of the second material include silicon nitride. In one embodiment, the dielectric material layers 42 can be spacer material layers that comprise silicon nitride.

In one embodiment, the insulating layers 32 can include silicon oxide, and dielectric material layers can include silicon nitride dielectric material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the dielectric material layers 42 can be formed, for example, CVD or atomic layer deposition (ALD). In one embodiment, the insulating layers 32 may comprise, and/or consist essentially of, silicon oxide, and the dielectric material layers 42 may comprise, and/or consist essentially of, silicon nitride.

The thicknesses of the insulating layers 32 and the dielectric material layers 42 can be in a range from 20 nm to 50 nm, although lesser and greater thicknesses can be used for each insulating layer 32 and for each dielectric material layer 42. The number of repetitions of the pairs of an insulating layer 32 and a dielectric material layer (e.g., a control gate electrode or a dielectric material layer) 42 can be in a range from 2 to 1,024, and typically from 8 to 256, although a greater number of repetitions can also be used. The top and bottom gate electrodes in the stack may function as the select gate electrodes. In one embodiment, each dielectric material layer 42 in the alternating stack (32, 42) can have a uniform thickness that is substantially invariant within each respective dielectric material layer 42.

Optionally, an insulating cap layer 70 can be formed over the alternating stack (32, 42). The insulating cap layer 70 includes a dielectric material that is different from the material of the dielectric material layers 42. In one embodiment, the insulating cap layer 70 can include the same material as the insulating layers 32. In this case, the insulating cap layer 70 is an additional insulating layer 32, which is a topmost insulating layer 32 among the set of layers including the insulating layers 32 and the insulating cap layer 70. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The first exemplary structure can include at least one memory array region 100 in which a three-dimensional array of memory elements is to be subsequently formed, and at least one staircase region 300 in which stepped surfaces of the alternating stack (32, 42) are to be subsequently formed.

Figure 3:
FIG. 3 is a schematic vertical cross-sectional view of the first exemplary structure after formation of stepped surfaces and a stepped dielectric material portion according to an embodiment of the present disclosure.

Referring to FIG. 3, stepped surfaces are formed in the staircase region 300, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located adjacent to the memory array region 100. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each dielectric material layer 42 other than a topmost dielectric material layer 42 within the alternating stack (32, 42) laterally extends farther than any overlying dielectric material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a dielectric material layer. In one embodiment, each vertical step can have the height of a single pair of an insulating layer 32 and a dielectric material layer 42. In another embodiment, multiple "columns" of staircases can be formed along a first horizontal direction hd1 such that each vertical step has the height of a plurality of pairs of an insulating layer 32 and a dielectric material layer 42, and the number of columns can be at least the number of the plurality of pairs. Each column of staircase can be vertically offset one from another such that each of the dielectric material layers 42 has a physically exposed top surface in a respective column of staircases. In the illustrative example, two columns of staircases are formed for each block of memory stack structures to be subsequently formed such that one column of staircases provide physically exposed top surfaces for odd-numbered dielectric material layers 42 (as counted from the bottom) and another column of staircases provide physically exposed top surfaces for even-numbered dielectric material layers (as counted from the bottom). Configurations using three, four, or more columns of staircases with a respective set of vertical offsets among the physically exposed surfaces of the dielectric material layers 42 may also be used. Each dielectric material layer 42 has a greater lateral extent, at least along one direction, than any overlying dielectric material layers 42 such that each physically exposed surface of any dielectric material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the substrate material layer 9.

Optionally, drain select level isolation structures 72 can be formed through the insulating cap layer 70 and a subset of the dielectric material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
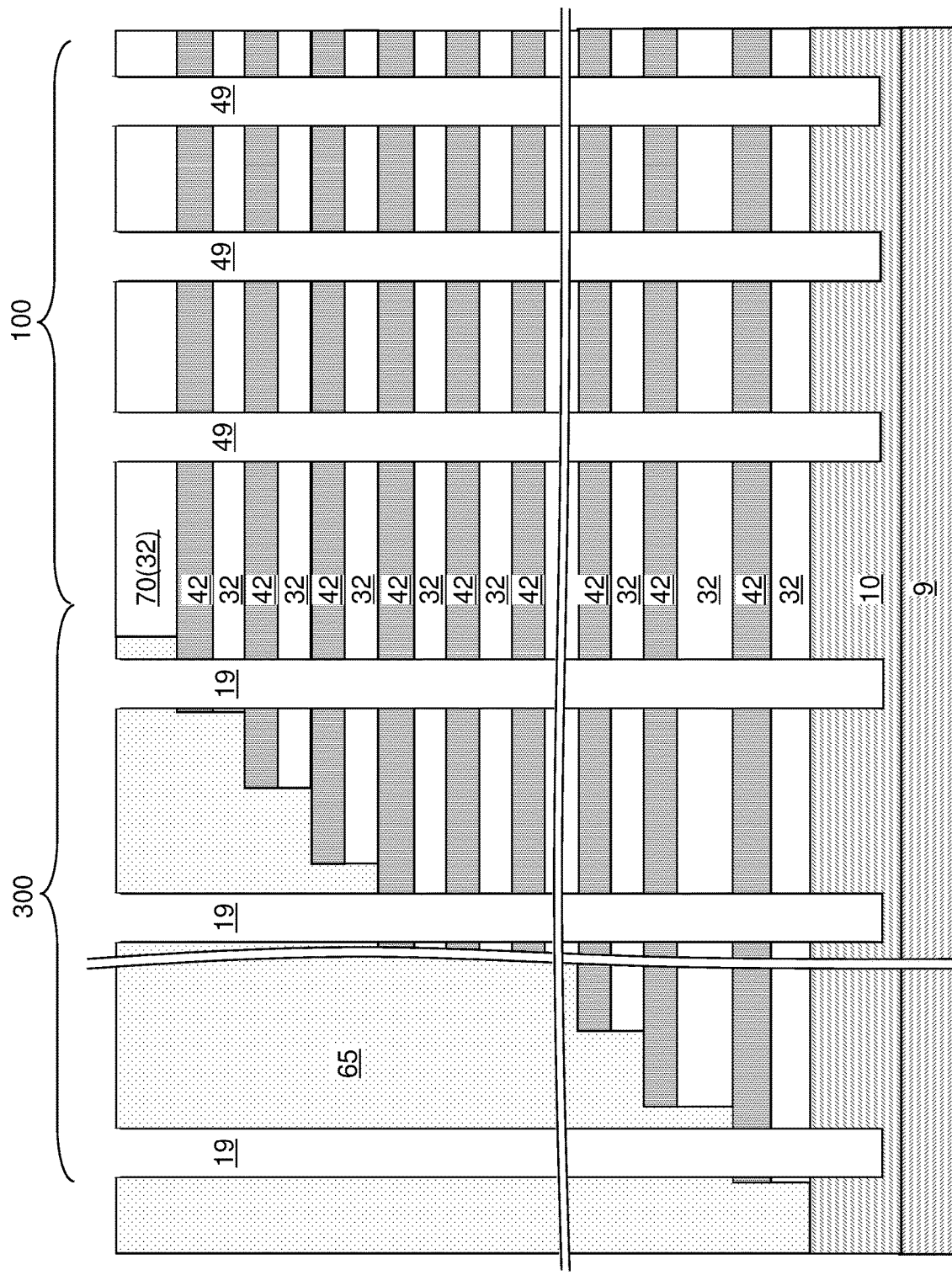
FIG. 4A is a schematic vertical cross-sectional view of the first exemplary structure after formation of memory openings and support openings according to an embodiment of the present disclosure.
Figure 4B:
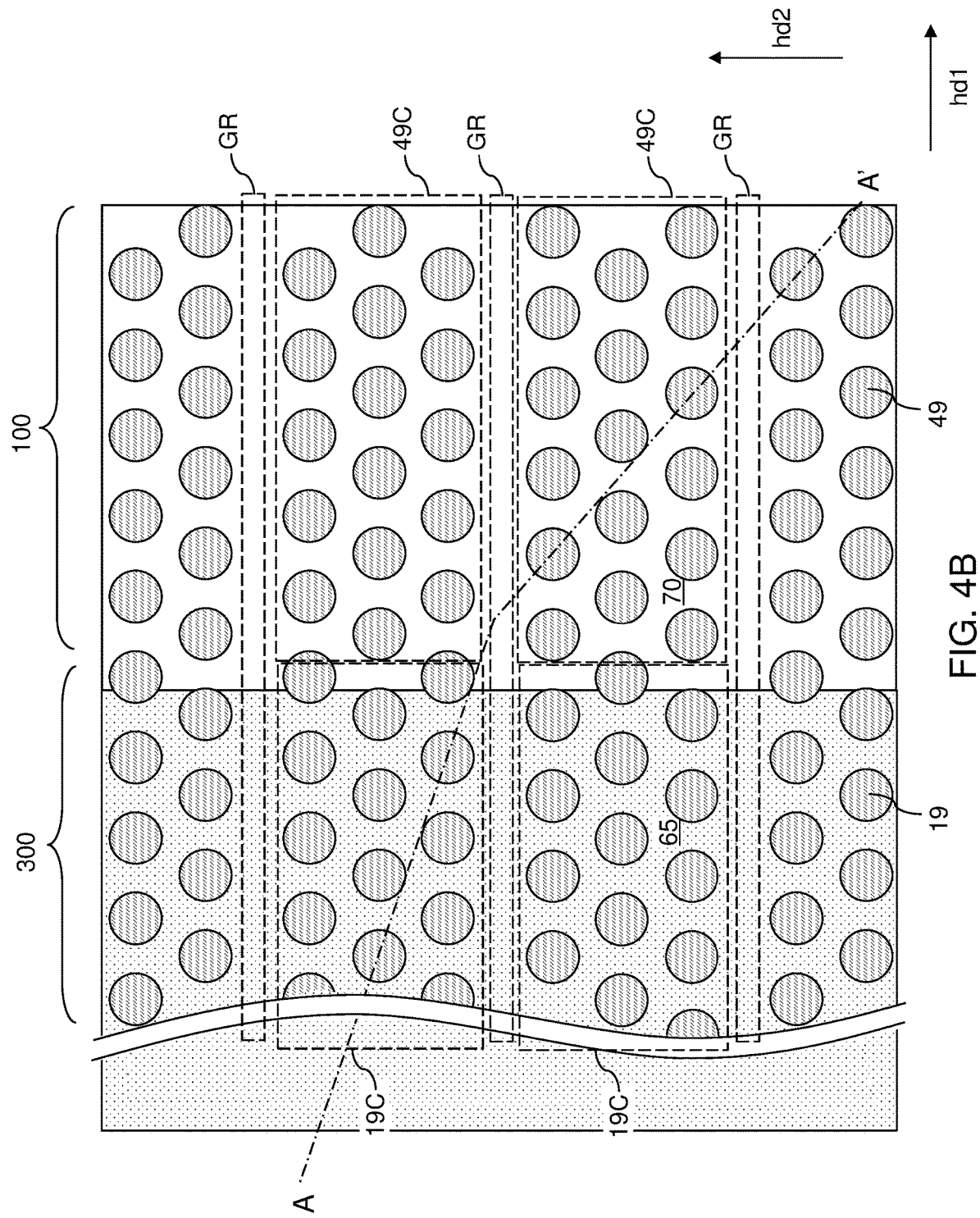
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300.

According to an aspect of the present disclosure shown in FIG. 4B, the two-dimensional array of memory openings 49 may comprise multiple memory opening clusters 49C that are laterally spaced apart from each other along the second horizontal direction (e.g., bit line direction) hd2 by gap regions GR that laterally extend along the first horizontal direction hd1 (e.g., word line direction). Each gap region can be defined as a region of a largest rectangle located between a neighboring pair of memory opening clusters 49C, not contacting any of the memory openings 49, and having a lateral extent along the first horizontal direction hd1 that is not greater than the combined lateral extent of the two-dimensional array of memory openings 49 and the two-dimensional array of support openings 19. In one embodiment, the width of each gap region GR along the second horizontal direction hd2 may be less than the maximum lateral dimension of each memory opening 49 along the second horizontal direction hd2. Each memory opening cluster 49C comprises at least one row, such as two or more rows, such as three or four rows for example, of memory openings 49 arranged along the first horizontal direction hd1. In one embodiment, each memory opening cluster 49C may comprise respective rows of memory openings 49 arranged along the first horizontal direction hd1 and vertically extending through the alternating stack (32, 42). Each row of memory openings 49 may comprise a one-dimensional periodic array of memory openings 49 having a uniform pitch along the first horizontal direction hd1.

According to an aspect of the present disclosure, the two-dimensional array of support openings 19 may comprise multiple support opening clusters 19C that are laterally spaced apart from each other along the second horizontal direction hd2 by the gap regions GR. Each support opening cluster 19C comprises at least one row of support openings 49 arranged along the first horizontal direction hd1. In one embodiment, each support opening cluster 19C may comprise at least one row of support openings 19 arranged along the first horizontal direction hd1 and vertically extending through the alternating stack (32, 42). Each row of support openings 19 may comprise a one-dimensional periodic array of support openings 19 having a uniform pitch along the first horizontal direction hd1.

In one embodiment, each row of memory openings 49 may be aligned to a respective row of support openings 19 along the second horizontal direction hd2. In one embodiment, a row of memory openings 49 and a row of support openings 19 may be portions of a periodic array of openings having a uniform pitch along the first horizontal direction hd1. In this case, the row of memory openings 49 may be a portion of the periodic array of openings located in the memory array region 100, and the row of support openings 19 may be a portion of the periodic array of openings located in the staircase region 300.

Figure 5A:
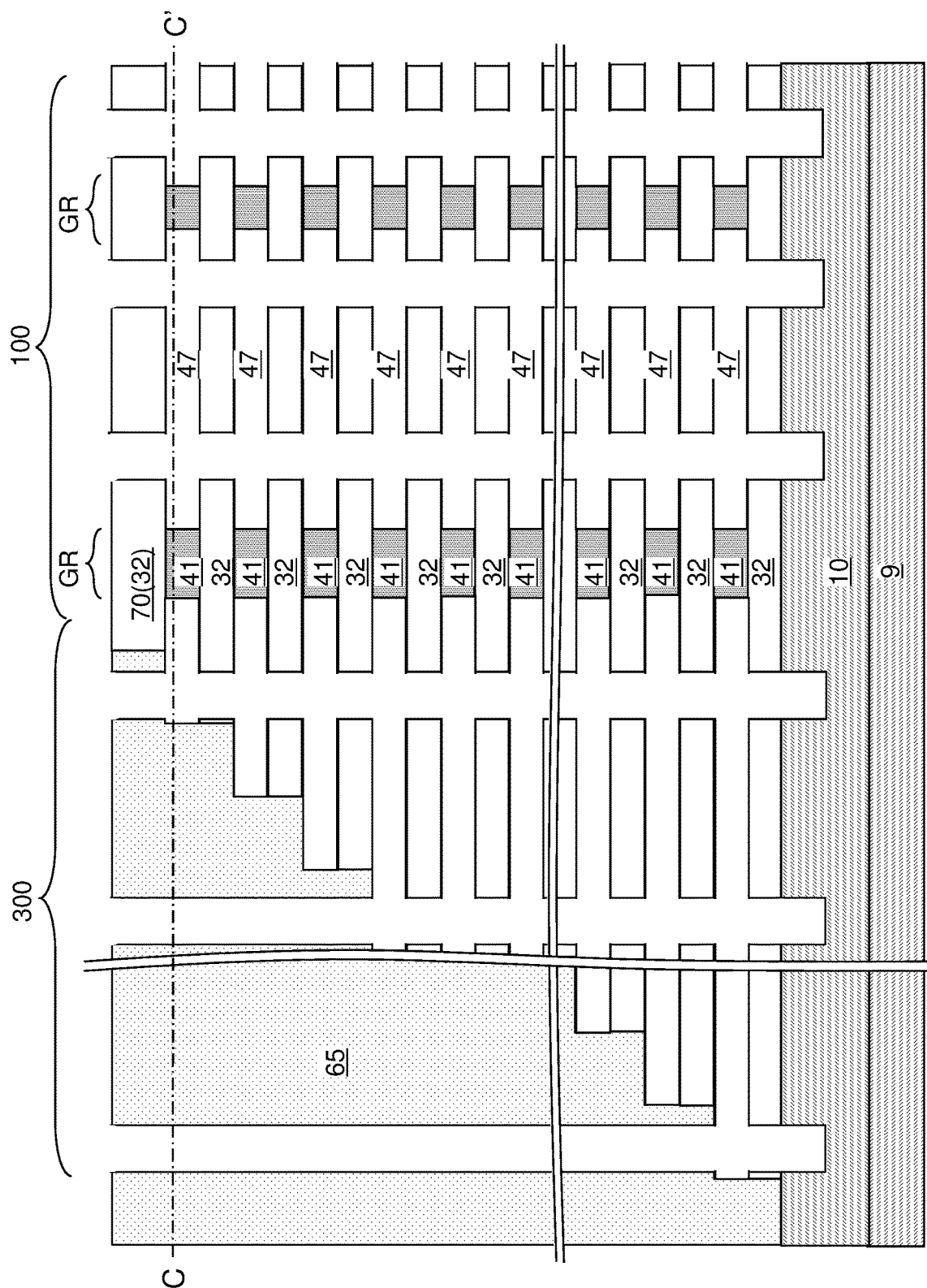
FIG. 5A is a vertical cross-sectional view of the first exemplary structure after formation of laterally-extending cavities by isotropically laterally recessing the dielectric material layers selective to the insulating layers according to an embodiment of the present disclosure.
Figure 5C:
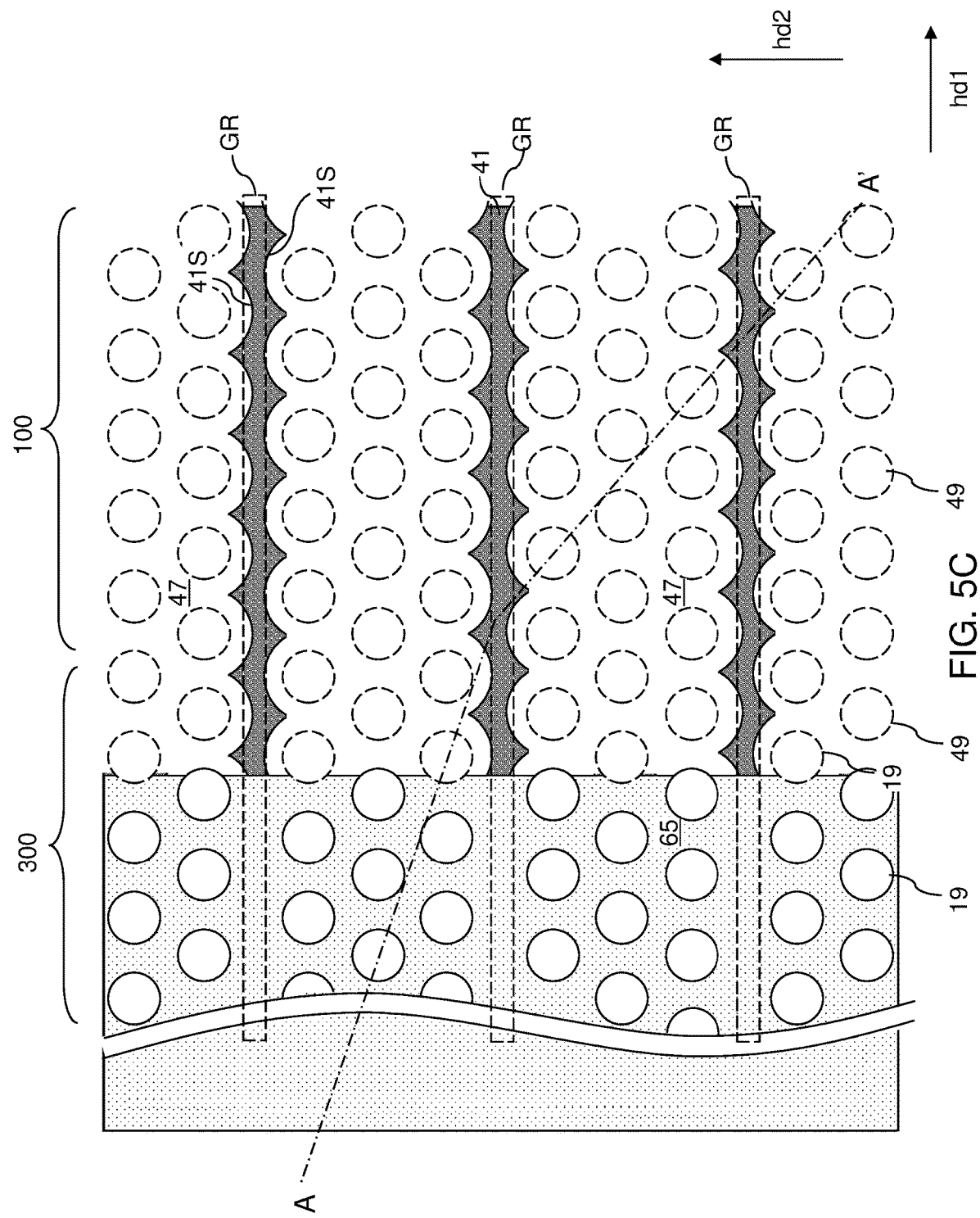
FIG. 5C is a horizontal cross-sectional view of the first exemplary structure along the horizontal plane C-C' of FIG. 5A.

Referring to FIGS. 5A-5C, an isotropic etch process is performed through the memory openings 49 and the support openings 19. The etch process etches the material of the dielectric material layers 42 selective to the material of the insulating layers 32 and the semiconductor material layer 10. In other words, the isotropic etch process etches the material of the dielectric material layers 42 at an etch rate that is at least twice the etch rate of the material of the insulating layers 32, and is at least twice the etch rate of the semiconductor material layer 10. In one embodiment, the ratio of the etch rate of the material of the dielectric material layers 42 to the etch rate of the material of the insulating layers 32 during the isotropic etch process may be at least two, and/or at least 10, and/or at least 100, and/or at least 1,000. In one embodiment, the ratio of the etch rate of the material of the dielectric material layers 42 to the etch rate of the material of the semiconductor material layer 10 during the isotropic etch process may be at least two, and/or at least 10, and/or at least 100, and/or at least 1,000.

In an illustrative example, the semiconductor material layer 10 may comprise silicon, the insulating layers 32 may comprise, and/or consist essentially of, silicon oxide, and the dielectric material layers 42 may comprise, and/or consist essentially of, silicon nitride. In this case, the isotropic etch process may comprise a wet etch process that etches silicon nitride selective to silicon oxide and silicon. In one embodiment, wet etch process may employ hot phosphoric acid as an isotropic etchant.

According to an aspect of the present disclosure, the duration of the isotropic etch process is selected such that portions of the dielectric material layers 42 located between neighboring rows of memory openings 49 are completely removed within each of memory opening cluster 49C, while a continuous remaining portion of each dielectric material layer 42 remains in each of the gap regions GR. In other words, the dielectric material layers 42 are partially etched in the horizontal directions. Each continuous cavity formed by removal of a continuous portion of a dielectric material layer 42 comprises a laterally-extending cavity 47 that laterally surrounds each memory opening 49 within a memory opening cluster 49C. Generally, the laterally-extending cavities 47 are formed by isotropically laterally recessing the dielectric material layers 42 selective to the insulating layers 32.

Remaining portions of each dielectric material layer 42 comprise a plurality of dielectric isolation strips 41 that laterally extend along a first horizontal direction hd1 and are laterally spaced apart along a second horizontal direction hd2 that is perpendicular to the first horizontal direction hd1. Voids formed by lateral recessing of each of the dielectric material layers 42 after formation of the memory openings 49 merge between each laterally neighboring pair of dielectric isolation strips 41 to form the laterally-extending cavities 47. In one embodiment, the insulating layers 32 comprise silicon oxide, and each of the dielectric isolation strips 41 comprises, and/or consists essentially of, a respective silicon nitride portion. Generally, each of the dielectric isolation strips 41 may be located laterally within a respective gap region GR, and located vertically between a vertically neighboring pair of insulating layers 32. A plurality of dielectric isolation strips 41 and a plurality of laterally-extending cavities 47 may be laterally interlaced along the second horizontal direction hd2 between each vertically neighboring pair of insulating layers 32, as shown in FIG. 5C. The plurality of dielectric isolation strips 41 and the plurality of laterally-extending cavities 47 located between each vertically neighboring pair of insulating layers 32 can be laterally bounded by a vertical plane including a sidewall of one of the vertically neighboring pair of insulating layers 32 that contacts the stepped dielectric material portion 65.

In one embodiment shown in FIG. 5C, each of the dielectric isolation strips 41 has a wavy or wiggled shape in a horizontal plane. Each dielectric isolation strip 41 may comprise a respective pair of contoured lengthwise sidewalls that generally extend along the first horizontal direction hd1 and have a lateral undulation along the second horizontal direction hd2. As used herein, a lateral undulation refers to a non-uniform lateral deviation of surface from a vertical plane or a vertical line. In one embodiment, each contoured lengthwise sidewall of the dielectric isolation strips 41 comprises a set of concave sidewall segments 41S that are arranged along the first horizontal direction hd1, adjoined to each other, have a concave profile in a horizontal cross-sectional view, and extend vertically along the vertical direction. Thus, each concave sidewall segment 41S may be laterally concave and vertically straight. In one embodiment, each concave sidewall segment 41S of the dielectric isolation strips 41 is equidistant from a vertical plane including a sidewall of a most proximate memory opening 49 of the rows of memory openings 49. In one embodiment, the distance between the concave sidewall segments 41S and a respective vertical plane can be the same as the lateral recess distance of the isotropic etch process that forms the laterally-extending cavities 47.

Each memory opening 49 can vertically extend straight through each layer within the alternating stack (32, 42). As such, for each set of dielectric isolation strips 41 located at different levels (at different distances from the semiconductor material layer 10) and having an areal overlap with each other, portions of the contoured lengthwise sidewalls of the dielectric isolation strips 41 that are located within the memory array region 100 are vertically coincident with each other. As used herein, a first surface and a second surface are vertically coincident with each other if the second surface overlies or underlies the first surface, and if there exists a vertical plane that contains the first surface and the second surface. In one embodiment, the minimum lateral separation distance between a pair of contoured lengthwise sidewalls of a dielectric isolation strip 41 may be in a range from 1 nm to 30 nm, such as from 2 nm to 15 nm, although lesser and greater minimum lateral separation distances may also be employed.

Generally, the dielectric isolation strips 41 are self-aligned to the gap regions GR, and can have physically exposed surfaces (i.e., contoured lengthwise sidewalls) that are equidistant from a respective vertical plane including sidewalls of a most proximate memory opening 49 that contact the insulating layers 32. As such, the dielectric isolation strips 41 can provide electrical isolation between each laterally neighboring pair of memory opening clusters 49.

Figure 6A:
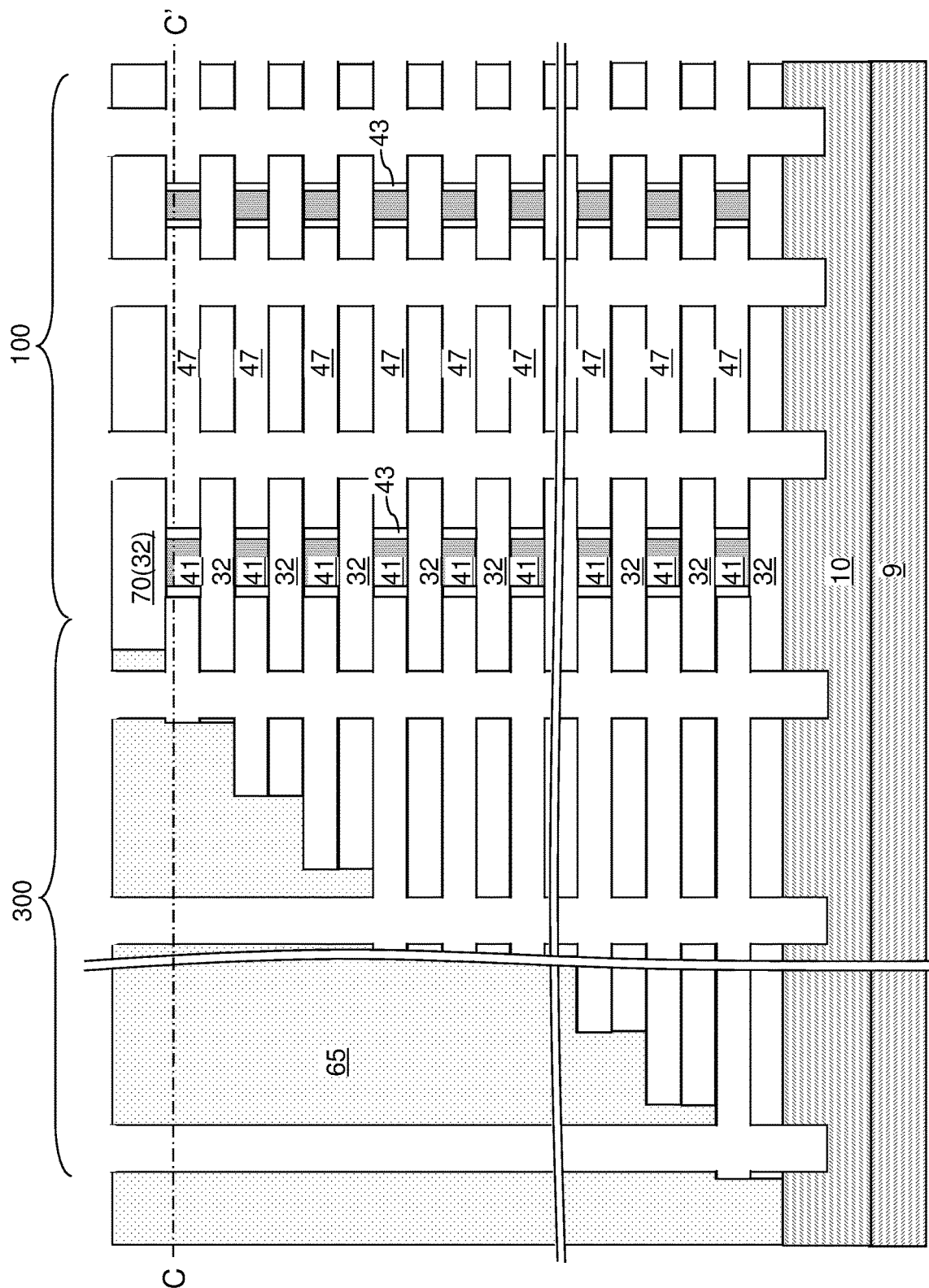
FIG. 6A is a vertical cross-sectional view of the first exemplary structure after formation of silicon oxide strips according to an embodiment of the present disclosure.
Figure 6B:
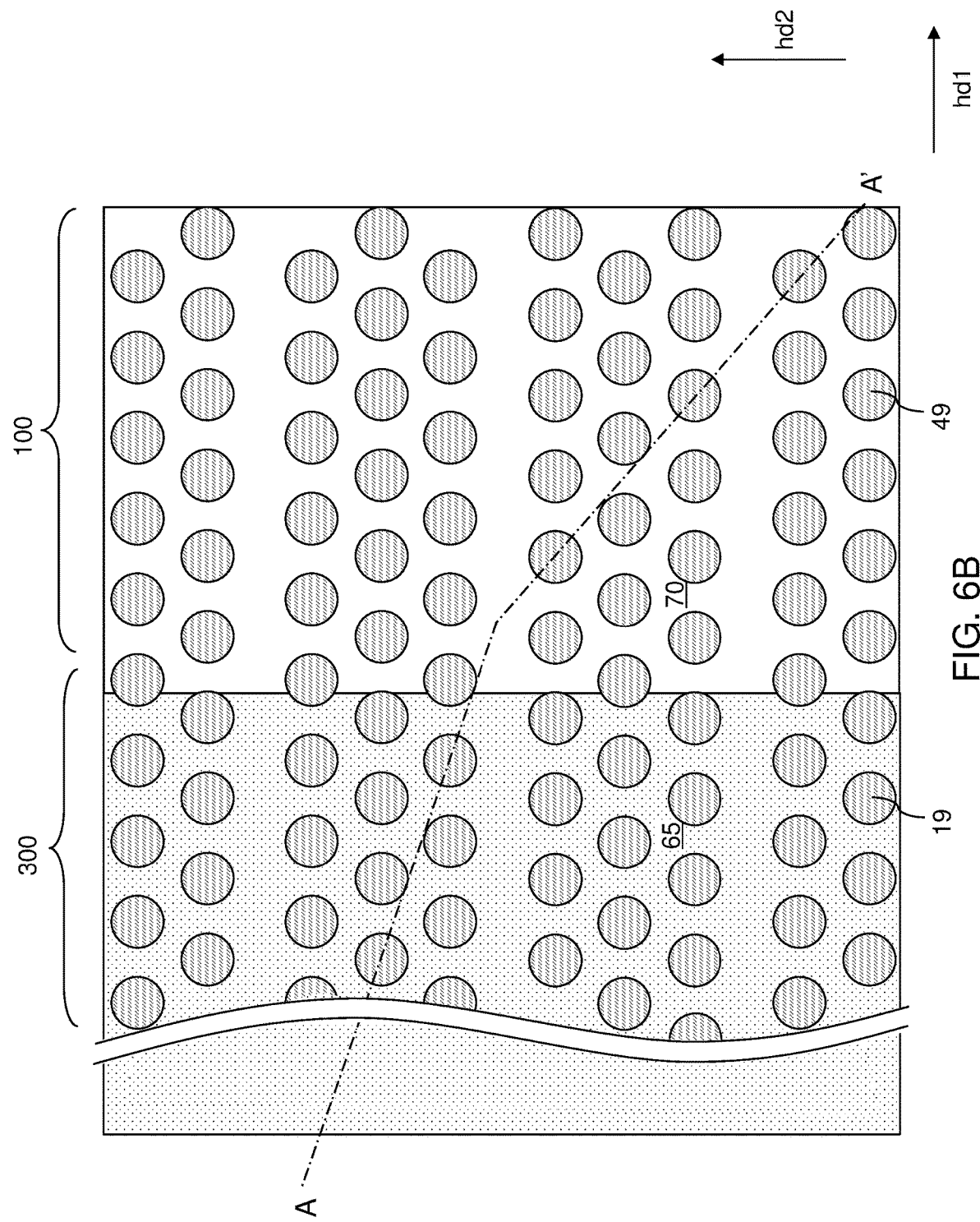
FIG. 6B is a top-down view of the first exemplary structure of FIG. 6A.
Figure 6C:
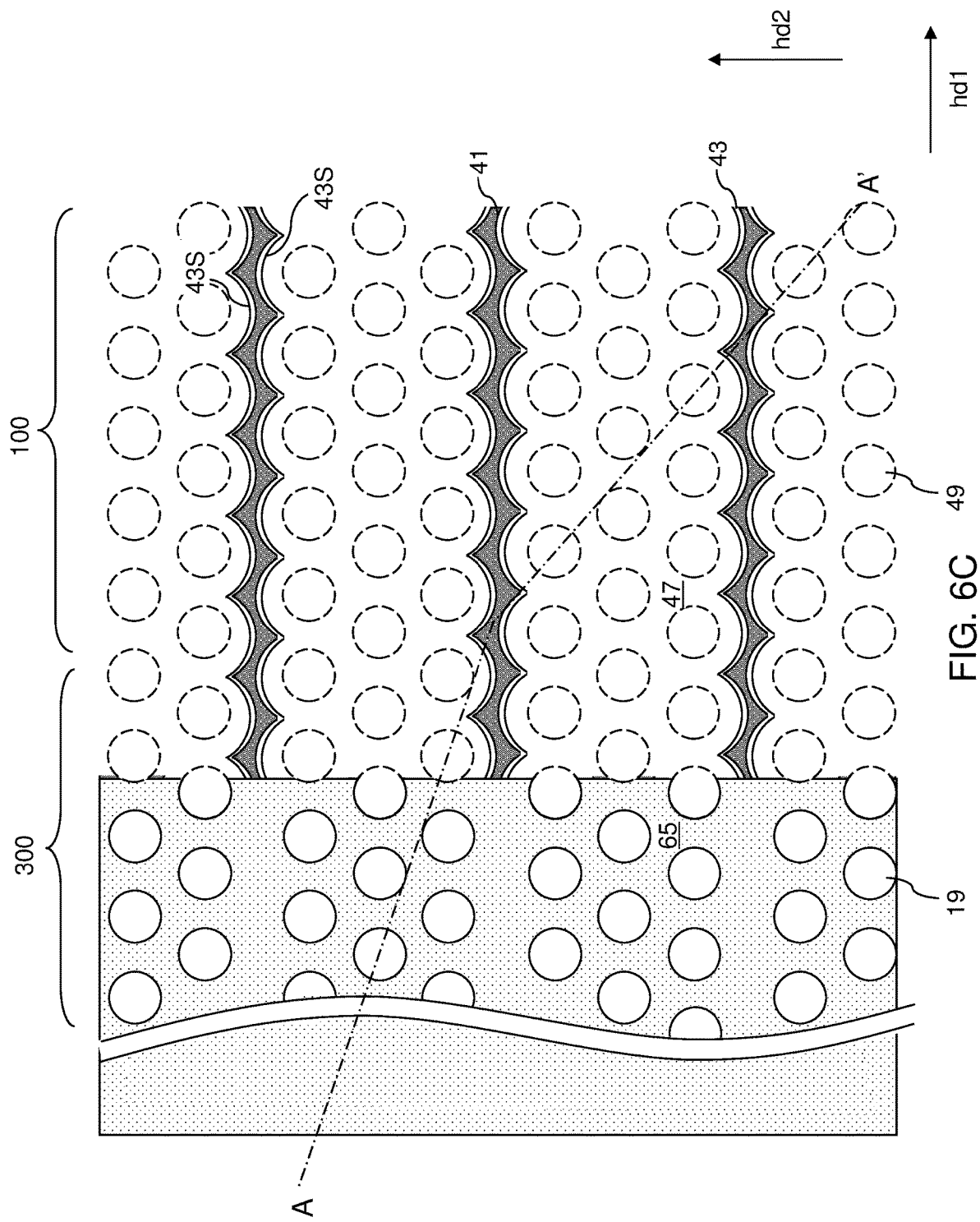
FIG. 6C is a horizontal cross-sectional view of the first exemplary structure along the horizontal plane C-C' of FIG. 6A.

Referring to FIGS. 6A-6C, in case the dielectric isolation strips 41 comprise silicon nitride, an oxidation process may be optionally performed to convert exposed surface portions of the dielectric isolation strips 41 into silicon oxide strips 43. A thermal oxidation process or a plasma oxidation process may be employed to convert physically exposed surface portions of the dielectric isolation strips 41 into the silicon oxide strips 43. Residual nitrogen atoms can be present within surface regions of the silicon oxide strips 43 that are proximal to interfaces with remaining (i.e., unoxidized) portions of the dielectric isolation strips 41. Thus, the dielectric isolation strips 41 are partially oxidized.

In one embodiment, each of the dielectric isolation strips 41 may be laterally contacted by a respective pair of silicon oxide strips 43 including nitrogen atoms as a dopant, and an atomic concentration of the nitrogen atoms decreases with a distance from an interface with a respective dielectric isolation strip 41. In one embodiment, each of the silicon oxide strips 43 comprises a first contoured lengthwise sidewall and a second contoured lengthwise sidewall that generally extend along the first horizontal direction hd1 and have a lateral undulation along the second horizontal direction hd2. In one embodiment shown in FIG. 6C, the first contoured lengthwise sidewall of each silicon oxide strip 43 comprises a set of concave sidewall segments 43S that are arranged along the first horizontal direction hd1, adjoined to each other, have a concave profile in a horizontal cross-sectional view, and extend vertically along the vertical direction. In one embodiment, the second contoured lengthwise sidewall of each silicon oxide strip 43 comprises a set of concave sidewall segments 43S that are arranged along the first horizontal direction hd1, adjoined to each other, have a concave profile in a horizontal cross-sectional view, extend vertically along the vertical direction, and contact a contoured lengthwise sidewall of a respective dielectric isolation strip 41.

Figure 7A:
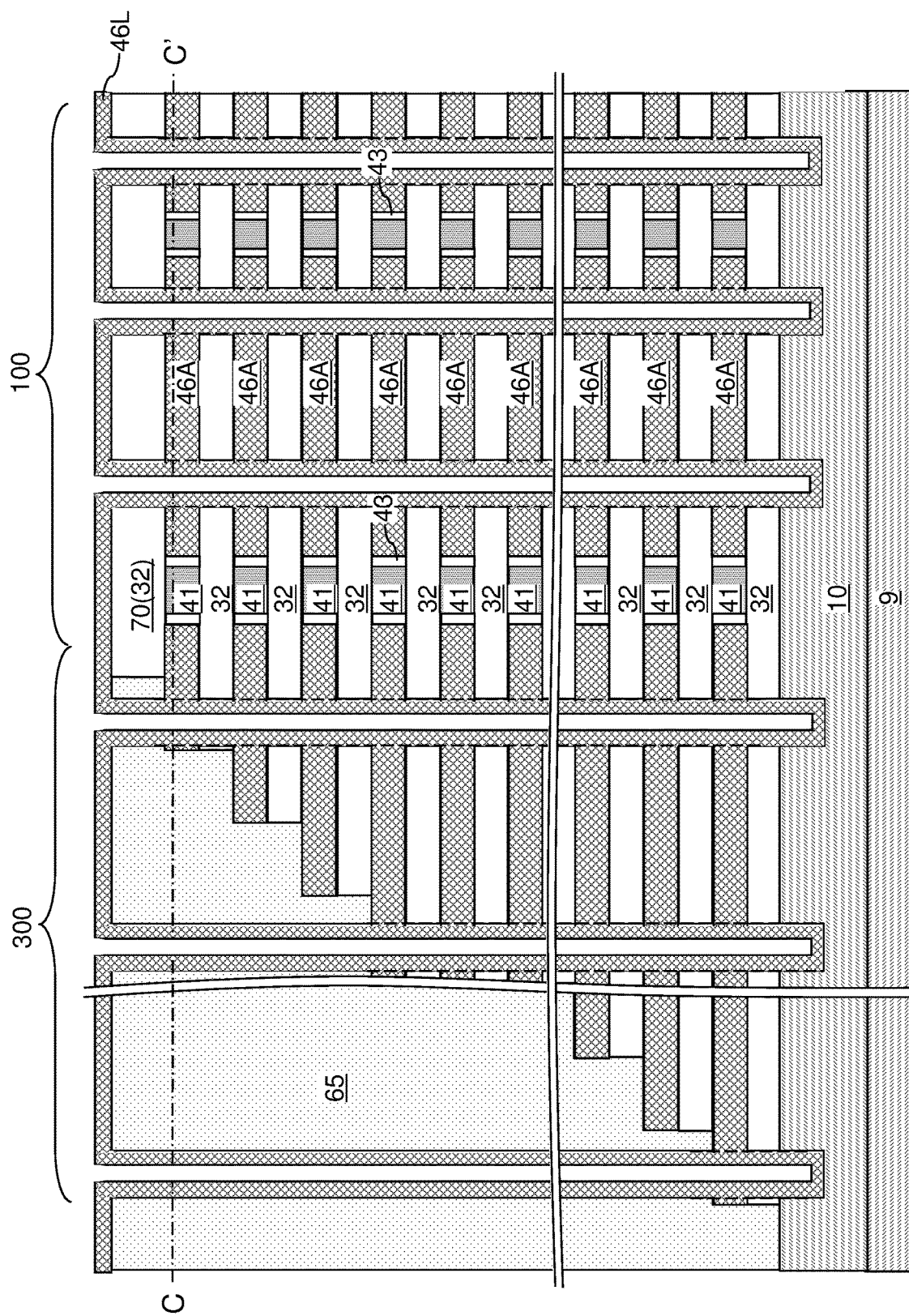
FIG. 7A is a vertical cross-sectional view of the first exemplary structure after formation of first metallic material portions and a first metallic material layer according to an embodiment of the present disclosure.
Figure 7B:
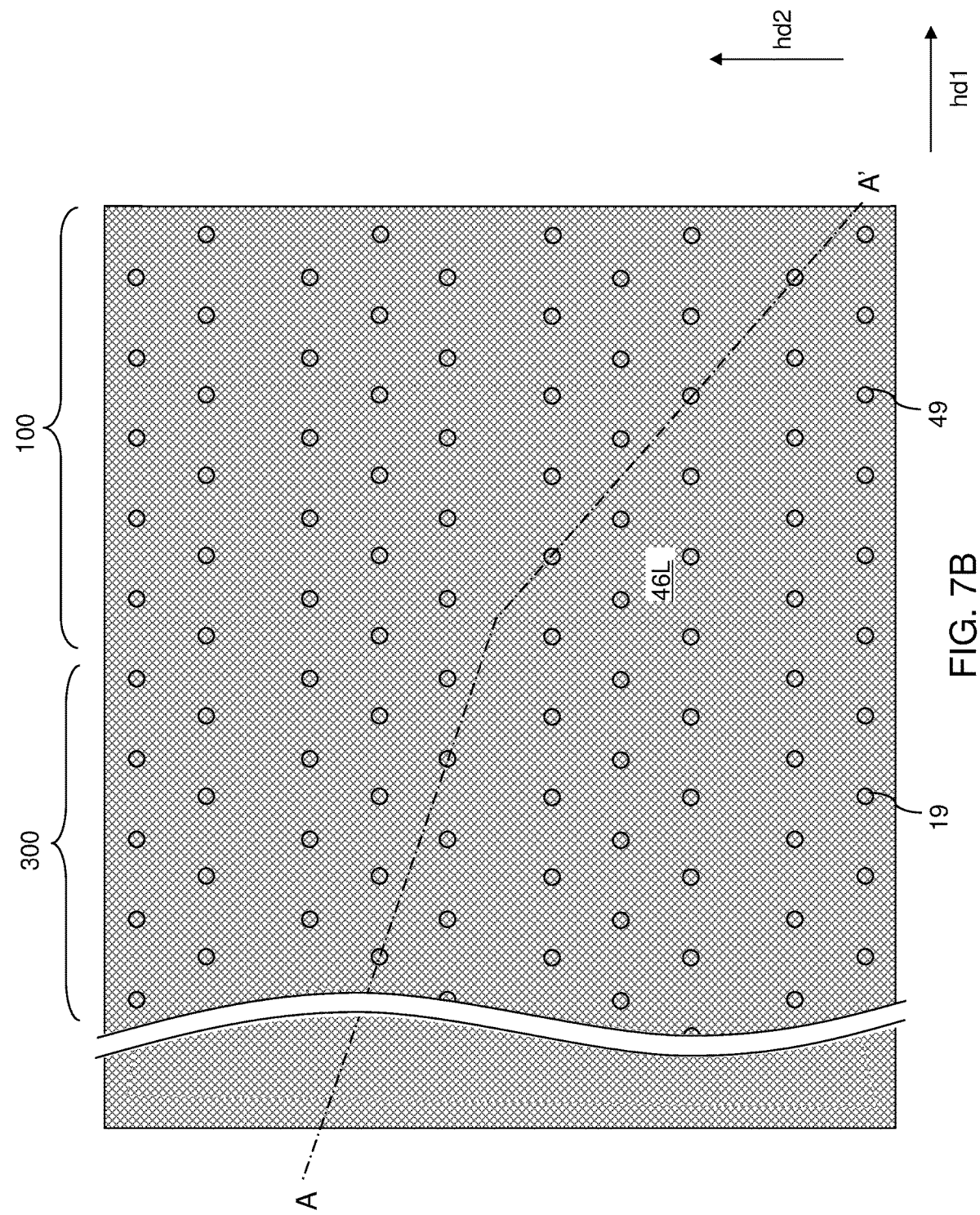
FIG. 7B is a top-down view of the first exemplary structure of FIG. 7A.
Figure 7C:
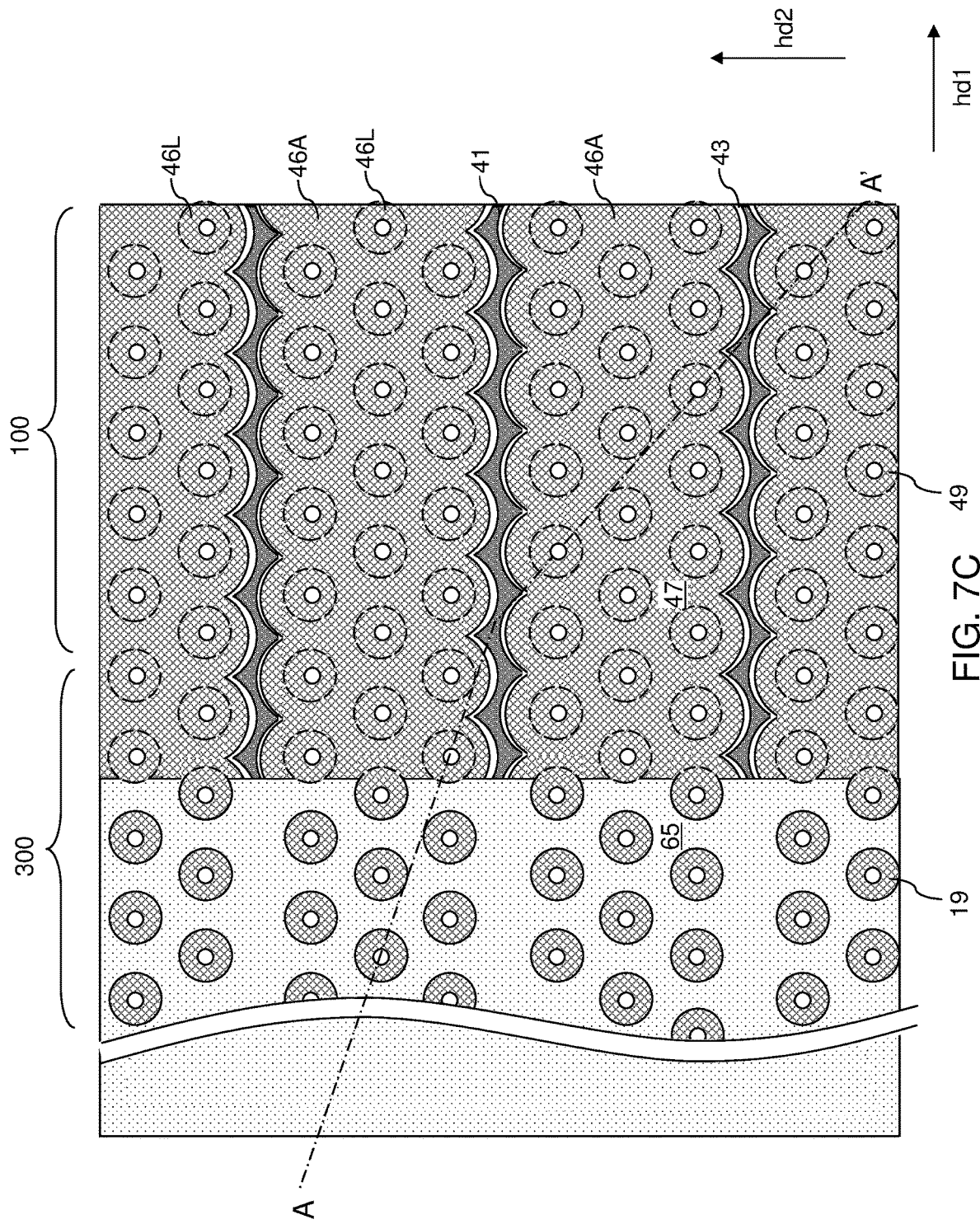
FIG. 7C is a horizontal cross-sectional view of the first exemplary structure along the horizontal plane C-C' of FIG. 7A.

Referring to FIGS. 7A-7C, a first metallic material can be isotropically deposited in the laterally-extending cavities 47 and peripheral portions of the memory openings 49 and peripheral portions of the support openings 19. In one embodiment, the lateral recess distance of the isotropic etch process that forms the laterally-extending cavities 47 at the processing steps of FIGS. 5A-5C may be less than the one half of the radius of each memory opening 49 (in case the memory openings 49 have a horizontal cross-sectional shape of a circle), or less than a semi-minor axis of each memory opening 49 (in case the memory openings 49 have a horizontal cross-sectional shape of an ellipse). In this case, the entire volume of the laterally-extending cavities 47 may be filled with the first metallic material without filling a core portion of each of the memory openings 49 and the support openings 19.

The first metallic material may be deposited by a conformal deposition process such as a chemical vapor deposition process or an atomic layer deposition process. The first metallic material may comprise, and/or may consist essentially of, W, Mo, Co, Ru, Ta, Ti, Co, Al, or a combination thereof. Optionally, a metallic barrier liner including a metallic barrier material (such as TiN, TaN, or WN) may be deposited by a conformal deposition process on physically exposed surfaces of the insulating layers 32 and on physically exposed surfaces of the silicon oxide strips 43 (if present) or the dielectric isolation strips 41 (if silicon oxide strips 43 are not present).

Generally, the first metallic material can be isotropically deposited in the laterally-extending cavities 47, in peripheral regions of the memory openings 49, in peripheral portions of the support openings, and over the insulating cap layer 70. The portions of the first metallic material that fills the laterally-extending cavities 47 are herein referred to as first metallic material portions 46A. The contiguous portion of the first metallic material that overlie the insulating cap layer 70 or vertically extend in the peripheral portions of the memory openings 49 or the support openings 19 is herein referred to as a first metallic material layer 46L. In one embodiment, a horizontally-extending seam at which horizontally-extending portions of the first metallic material contact each other may be formed within each of the laterally-extending cavities 47. In this case, the first metallic material portions 46A may comprise a respective horizontally-extending seam. An unfilled cavity, i.e., a void, may be present within each of the memory openings 49 and within each of the support openings 19.

Figure 8A:
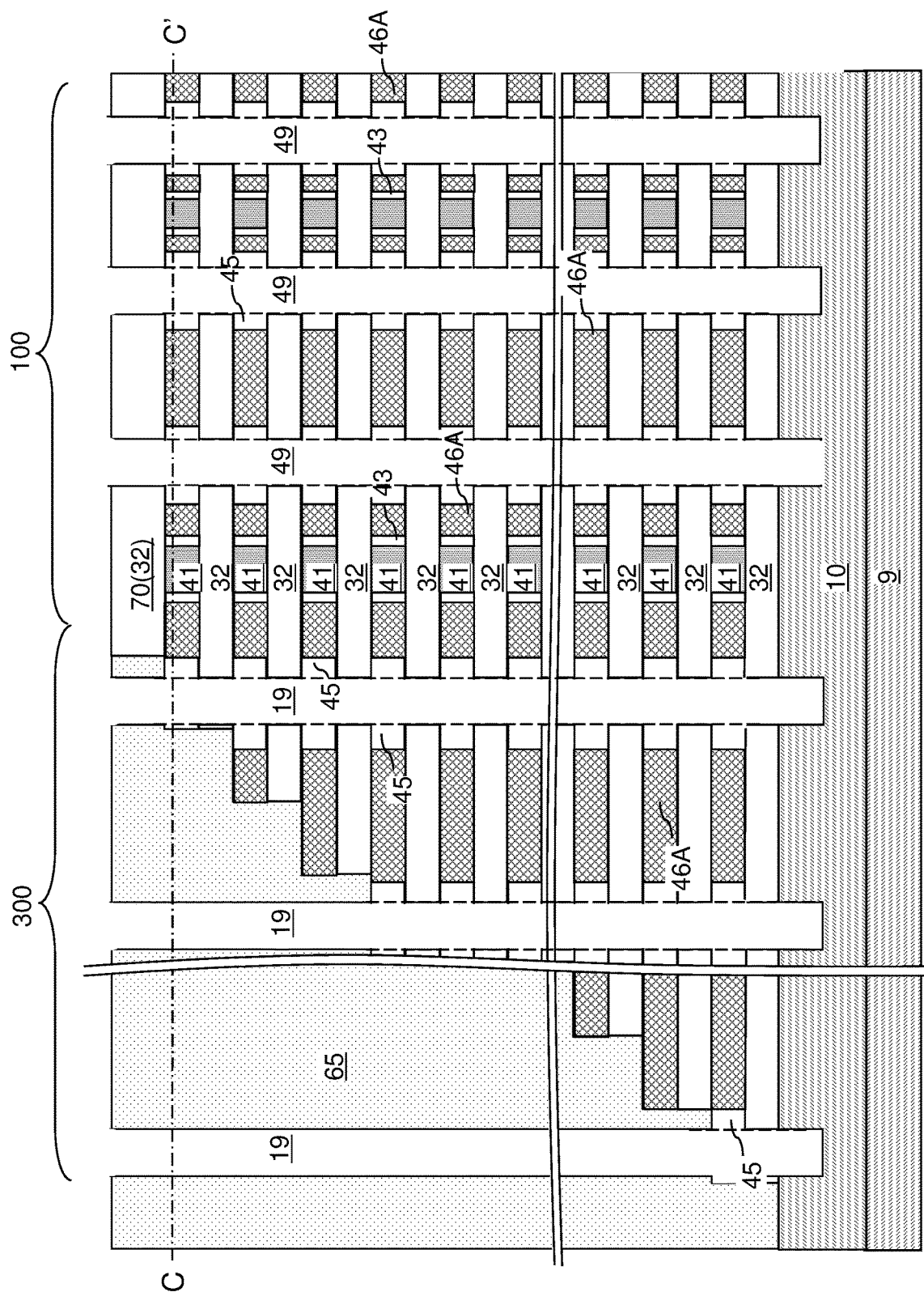
FIG. 8A is a vertical cross-sectional view of the first exemplary structure after removal of the first metallic material layer and lateral recessing of the first metallic material portions according to an embodiment of the present disclosure.
Figure 8B:
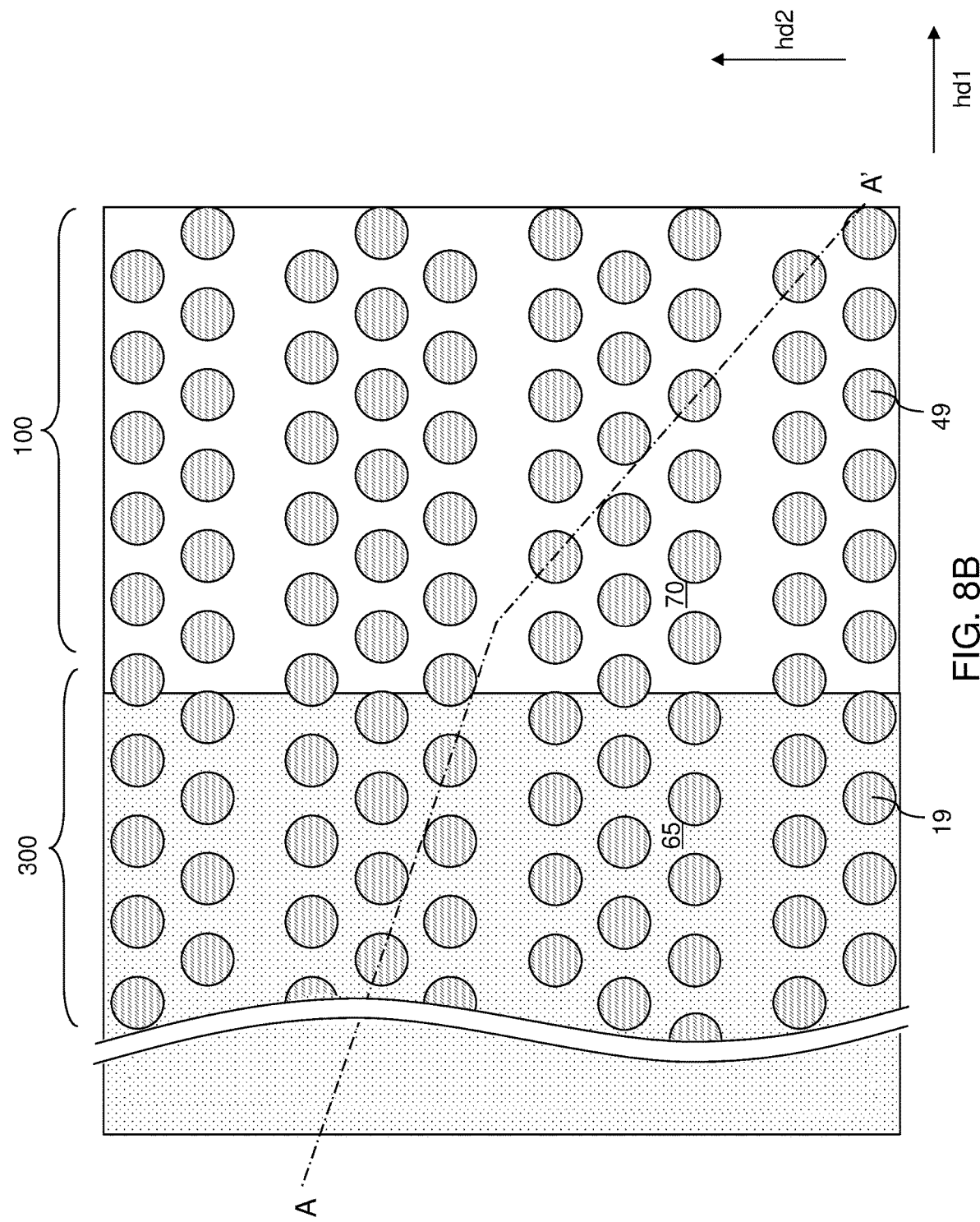
FIG. 8B is a top-down view of the first exemplary structure of FIG. 8A.
Figure 8C:
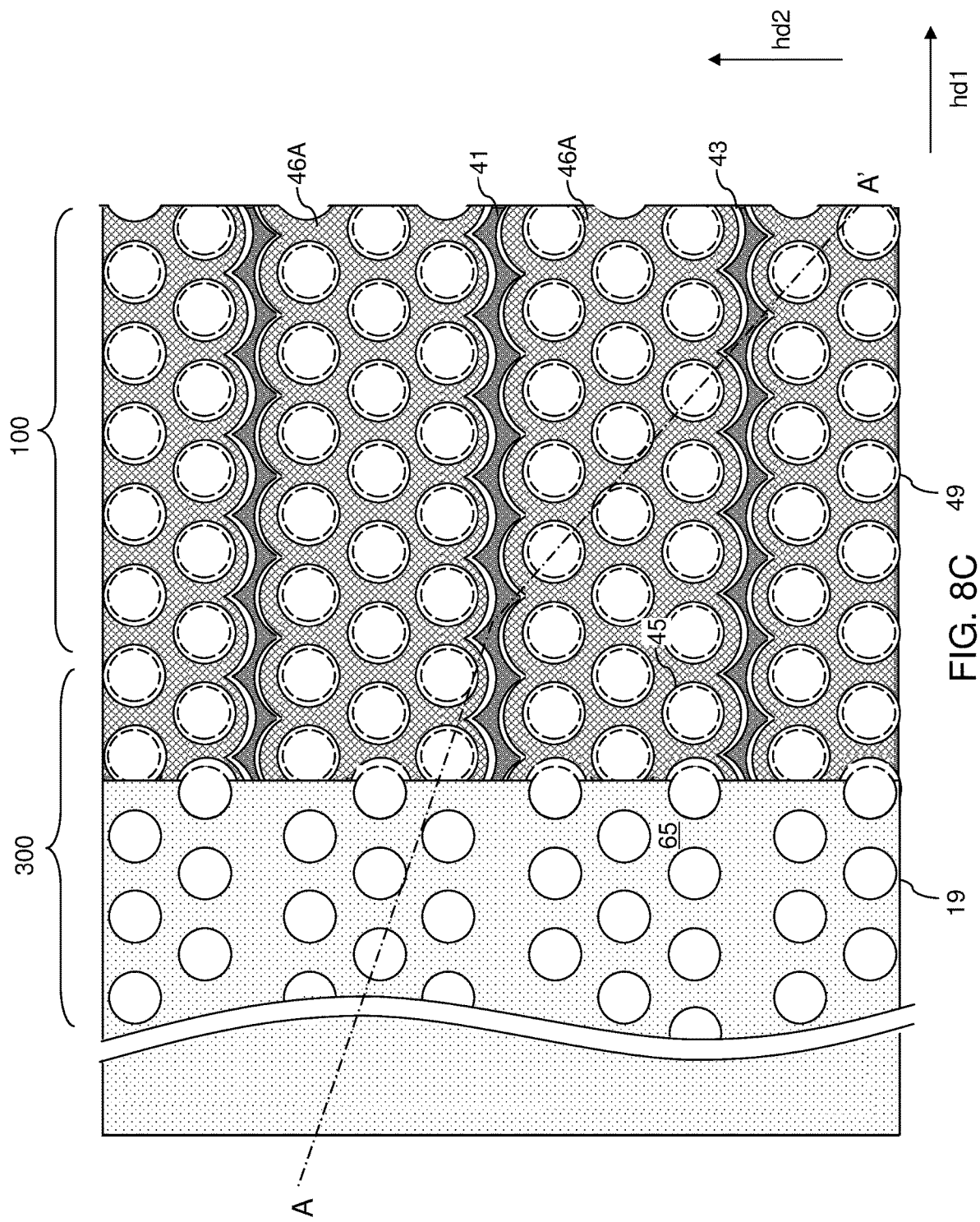
FIG. 8C is a horizontal cross-sectional view of the first exemplary structure along the horizontal plane C-C' of FIG. 8A.

Referring to FIGS. 8A-8C, the first metallic material layer 46L (i.e., the portions of the first metallic material that are deposited outside the laterally-extending cavities 47) can be removed by performing an etch back process, which may include an anisotropic etch process and/or an isotropic etch process. In one embodiment, the first metallic material layer 46L may be isotropically etched selective to the material of the insulating layers 32, for example, by performing an isotropic etch process such as a wet etch process. The duration of the isotropic etch process can be selected such that the entirety of the first metallic material layer 46L is removed, and sidewalls of the insulating layers 32 are physically exposed around each memory opening 49 and around each support opening 19. In one embodiment, the isotropic etch process may comprise a wet etch process that etches the first metallic material selective to the dielectric material of the insulating layers 32.

Optionally, the isotropic etch process may be continued after complete removal of the first metallic material layer 46L. In this case, portions of the first metallic material in the first metallic material portions 46A may be partially removed around each of the memory openings 49 and around each of the support openings. In this case, the lateral recess distance of the sidewalls of the first metallic material portions 46A can be selected such that each of the first metallic material portions 46A remains as a respective continuous structure after the isotropic etch process. In one embodiment, the lateral recess distance may be in a range from 0 nm to 20 nm, such as from 0 nm to 10 nm, although greater lateral recess distances may also be employed. In case the lateral recess distance is non-zero, tubular recess cavities 45 can be formed around each memory opening 49 and around each support openings 19. Thus, each memory opening 49 and each support opening may be laterally surrounded by a respective vertical stack of tubular recess cavities 45.

Figure 9A:
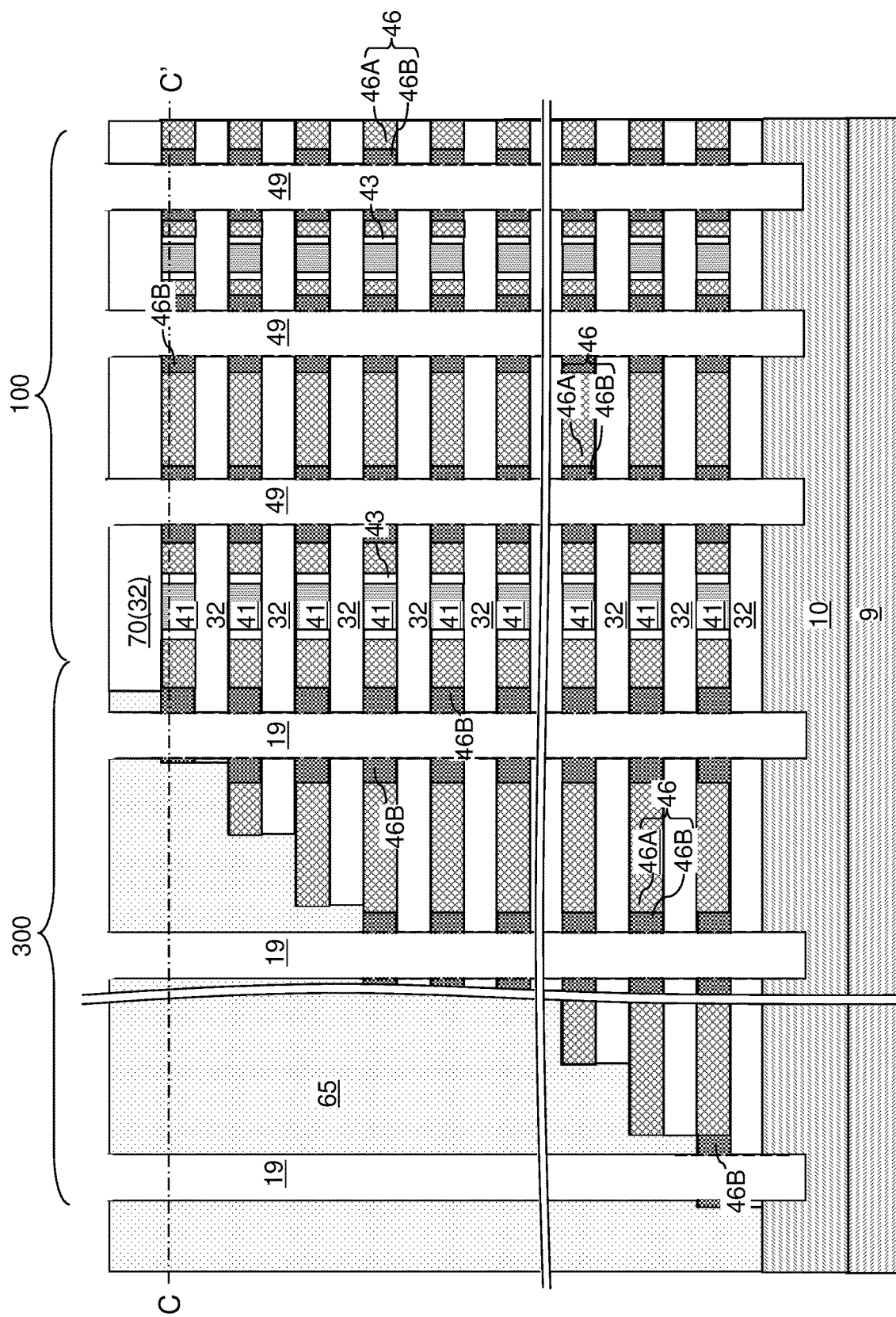
FIG. 9A is a vertical cross-sectional view of the first exemplary structure after formation of second metallic material portions according to an embodiment of the present disclosure.
Figure 9B:
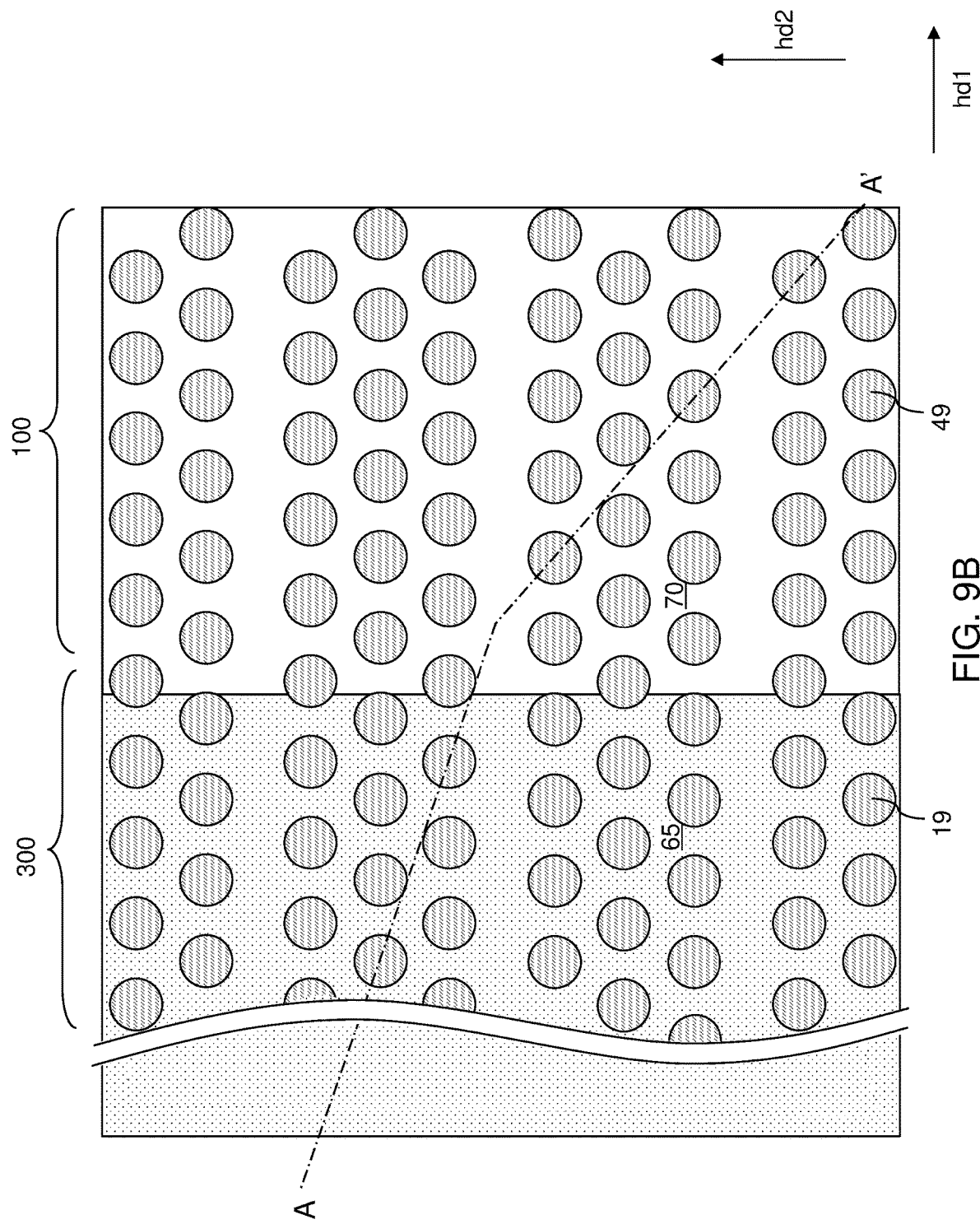
FIG. 9B is a top-down view of the first exemplary structure of FIG. 9A.
Figure 9C:
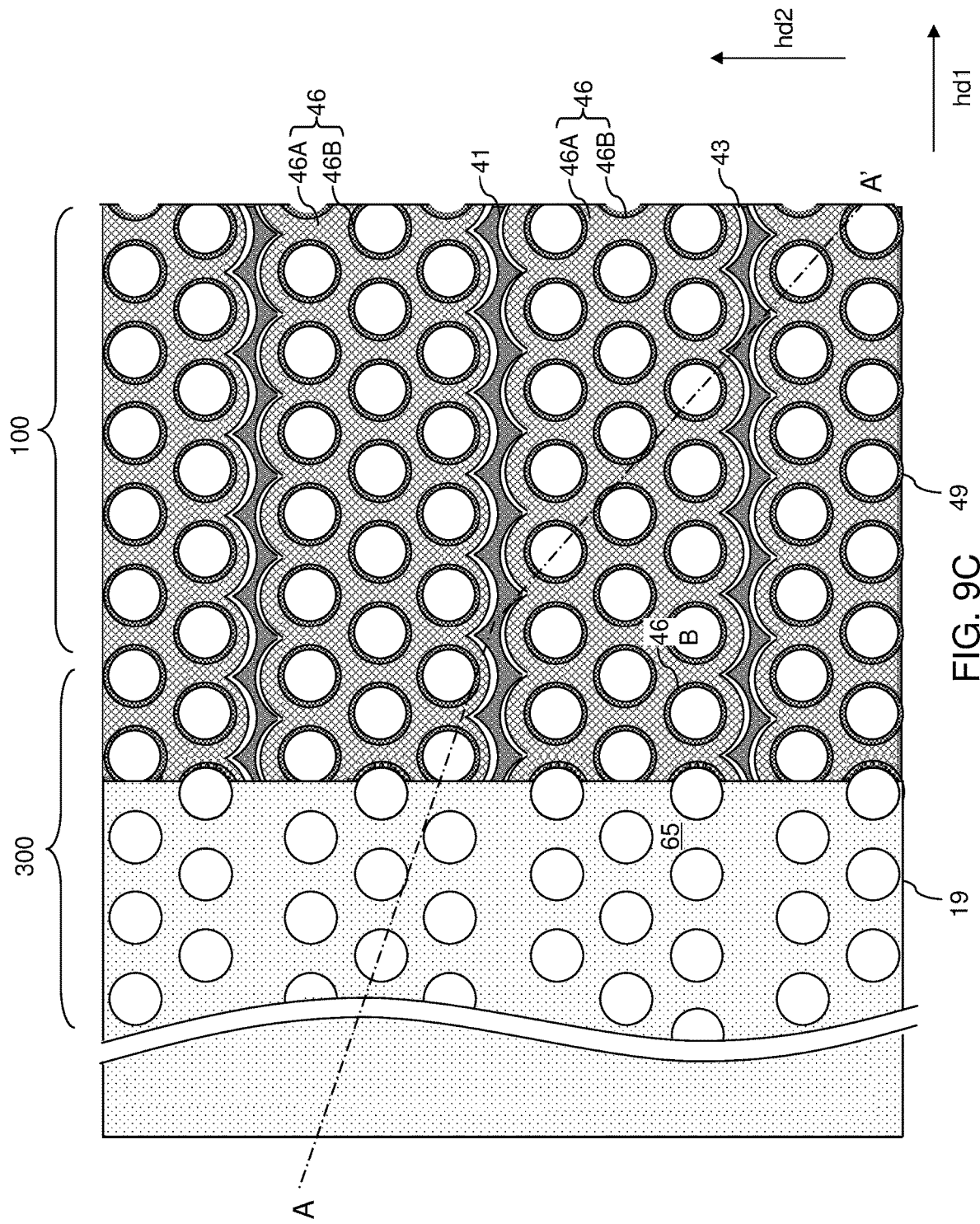
FIG. 9C is a horizontal cross-sectional view of the first exemplary structure along the horizontal plane C-C' of FIG. 9A.

Referring to FIGS. 9A-9C, an optional second metallic material can be selectively deposited in the recess cavities 45 on the physically exposed surfaces of the first metallic material portions 46A while suppressing growth of the second metallic material from dielectric surfaces such as the physically exposed surfaces of the insulating layers 32. For example, a selective metal deposition process can be employed, which grows the second metallic material only from metallic surfaces and suppresses growth of the second metallic material from dielectric surfaces. For example, a chemical vapor deposition process that employs tungsten hexafluoride can induce growth of tungsten only from metallic surfaces while avoiding growth of tungsten from dielectric surfaces such as silicon oxide surfaces.

In one embodiment, the second metallic material may comprise, and/or may consist essentially of, W, Mo, Co, Ru, or a combination thereof. The second metallic material may be the same as, or many be different from, the first metallic material. In case the second metallic material is the same as the first metallic material in material composition, then the first metallic material deposited by a non-selective deposition process, and the second metallic material may be deposited by a selective deposition process that employs a different precursor gas or different processing conditions. Second metallic material portions 46B are formed in the tubular recess cavities 45. Each of the second metallic material portions 46B may have a tubular configuration in which an inner cylindrical sidewall is laterally offset from an outer cylindrical sidewall by a uniform lateral distance, which is the growth distance of the second metallic material. In one embodiment, the duration of the selective deposition process that deposits the second metallic material may be selected so that the inner cylindrical sidewalls of the second metallic material portions 46B are flush, or substantially flush, with sidewalls of the insulating layers 32 around each memory opening 49 and around each support opening 19. The lateral thickness of each second metallic material portion 46B (i.e., the distance between the inner cylindrical sidewall and an outer cylindrical sidewall) may be in a range from 0.1 nm to 20 nm, such as from 2 nm to 10 nm, although lesser and greater lateral thicknesses may also be employed.

A vertical stack of second metallic material portions 46B can be formed around each memory opening 49 and around each support opening 19. Each contiguous combination of a first metallic material portion 46A and second metallic material portions 46B constitutes an electrically conductive strip 46. Each second metallic material portion 46B can be located within a respective opening in a first metallic material portion 46A. The number of second metallic material portions 46B in contact with, and laterally surrounded by, a first metallic material portion 46A can be at least the total number of memory openings 49 that the first metallic material portion 46A laterally surrounds.

Generally, the electrically conductive strips 46 can be formed by selectively growing a second metallic material from physically exposed surfaces of the portions of the first metallic material that remain in the laterally-extending cavities 47 while suppressing deposition of the second metallic material from physically exposed surfaces of the insulating layers 32 around the memory openings 49 and the support openings 19. Each of the electrically conductive strips 46 may comprise a respective set of second metallic material portions 46B, which are selectively grown portions of the second metallic material.

The electrically conductive strips 46 are formed within the laterally-extending cavities 47 such that each of the electrically conductive strips 46 laterally surrounds at least one row of memory openings 49. In one embodiment, each of the electrically conductive strips 46 laterally surrounds multiple rows, such as two to four rows of memory openings 49. In the illustrated example, each of the electrically conductive strips 46 laterally surrounds three rows of memory openings 49. Each of the electrically conductive strips 46 comprises a respective continuous portion of the first metallic material including a plurality of openings therein. A plurality of second metallic material portions 46B that comprise the second metallic material can optionally be located within a respective opening in the first metallic material portion 46A.

Each contiguous combination of material portions located within the volume of a dielectric material layer 42 as provided at the processing steps of FIG. 3 constitutes a composite layer (41, 43, 46). Each composite layer (41, 43, 46) comprises a plurality of electrically conductive strips 46 interlaced with a plurality of dielectric isolation strips 41 along the second horizontal direction hd2. An optional silicon oxide strip 43 may be located between each dielectric isolation strip 41 and the laterally adjacent electrically conductive strip 46. One or more uppermost electrically conductive strips 46 may function as drain select gate electrodes. One or more bottommost electrically conductive strips 46 may function as source select gate electrodes. The remaining electrically conductive strips located between the drain and source select gate electrodes may function as word lines which extend in the first horizontal direction hd1 and which are separated in the second horizontal direction hd2.

The first exemplary structure comprises an alternating stack of insulating layers 32 and composite layers (41, 43, 46) located over a substrate (9, 10), wherein each of the composite layers (41, 43, 46) comprises a respective plurality of electrically conductive strips 46 laterally extending along a first horizontal direction hd1 and a plurality of dielectric isolation strips 41 laterally extending along the first horizontal direction hd1, wherein the plurality of electrically conductive strips 46 and the plurality of dielectric isolation strips 41 are interlaced with each other along a second horizontal direction hd2 that is perpendicular to the first horizontal direction hd1. Each of the insulating layers 32 continuously extends along the first and second horizontal directions and has an areal overlap with each electrically conductive strip 46 and each dielectric isolation strip 41 within the composite layers (41, 43, 46) within a memory array region 100 in a plan view along a vertical direction.

The first exemplary structure comprises rows of memory openings 49 arranged along the first horizontal direction hd1, wherein each row of memory openings 49 vertically extends through each insulating layer 32 within the alternating stack{32, (41, 43, 46)} and a respective subset of electrically conductive strips 46 that includes one electrically conductive strip 46 per composite layer (41, 43, 46) for each of the composite layers (41, 43, 46). The alternating stack {32, (41, 43, 46)} in the staircase region 300 comprises stepped surfaces, and lateral extents of the composite layers (41, 43, 46) along the first horizontal direction hd1 decrease with a vertical distance from the substrate (9, 10).

In one embodiment, a set of all electrically conductive strips 46 located within each composite layer (41, 43, 46) has a same lateral extent along the first horizontal direction hd1 as and contacts a top surface of a respective underlying insulating layer 32 within the alternating stack {32, (41, 43, 46)}. In one embodiment, a set of all dielectric isolation strips 41 located within each composite layer (41, 43, 46) has a same lateral extent along the first horizontal direction hd1 as and contacts a top surface of a respective underlying insulating layer 32 within the alternating stack {32, (41, 43, 46)}.

In an embodiment in which stepped surfaces in the staircase region 300 are patterned such that each vertical sidewall of the insulating layers 32 within the stepped surfaces is vertically coincident with a vertical sidewall of an overlying dielectric material layer 42 at a processing step that corresponds to the processing steps of FIG. 3, a set of all dielectric isolation strips 46 located within each composite layer (41, 43, 46) has a same lateral extent along the first horizontal direction hd1 as and contacts a bottom surface of a respective overlying insulating layer 32 within the alternating stack {32, (41, 43, 46)}.

In one embodiment, a stepped dielectric material portion 65 can contact, and can overlie, the stepped surfaces of the alternating stack {32, (41, 43, 46)}. In one embodiment, the stepped dielectric material portion 65 contacts each of the electrically conductive strips 46 and each of the dielectric isolation strips 41 within the alternating stack {32, (41, 43, 46)}.

In one embodiment, for each of the composite layers (41, 43, 46), each of the respective plurality of electrically conductive strips 46 and each of the plurality of dielectric isolation strips 41 comprise a respective sidewall segment that is located within a same vertical plane that is perpendicular to the first horizontal direction hd1. Each such sidewall segment contacts a respective sidewall surface segment of the stepped dielectric material portion 65.

FIGS. 10A-10G are sequential schematic vertical cross-sectional views of a memory opening 49 within the first exemplary structure during formation of a memory opening fill structure 58 therein according to an embodiment of the present disclosure.

Figures 10A, 10B:
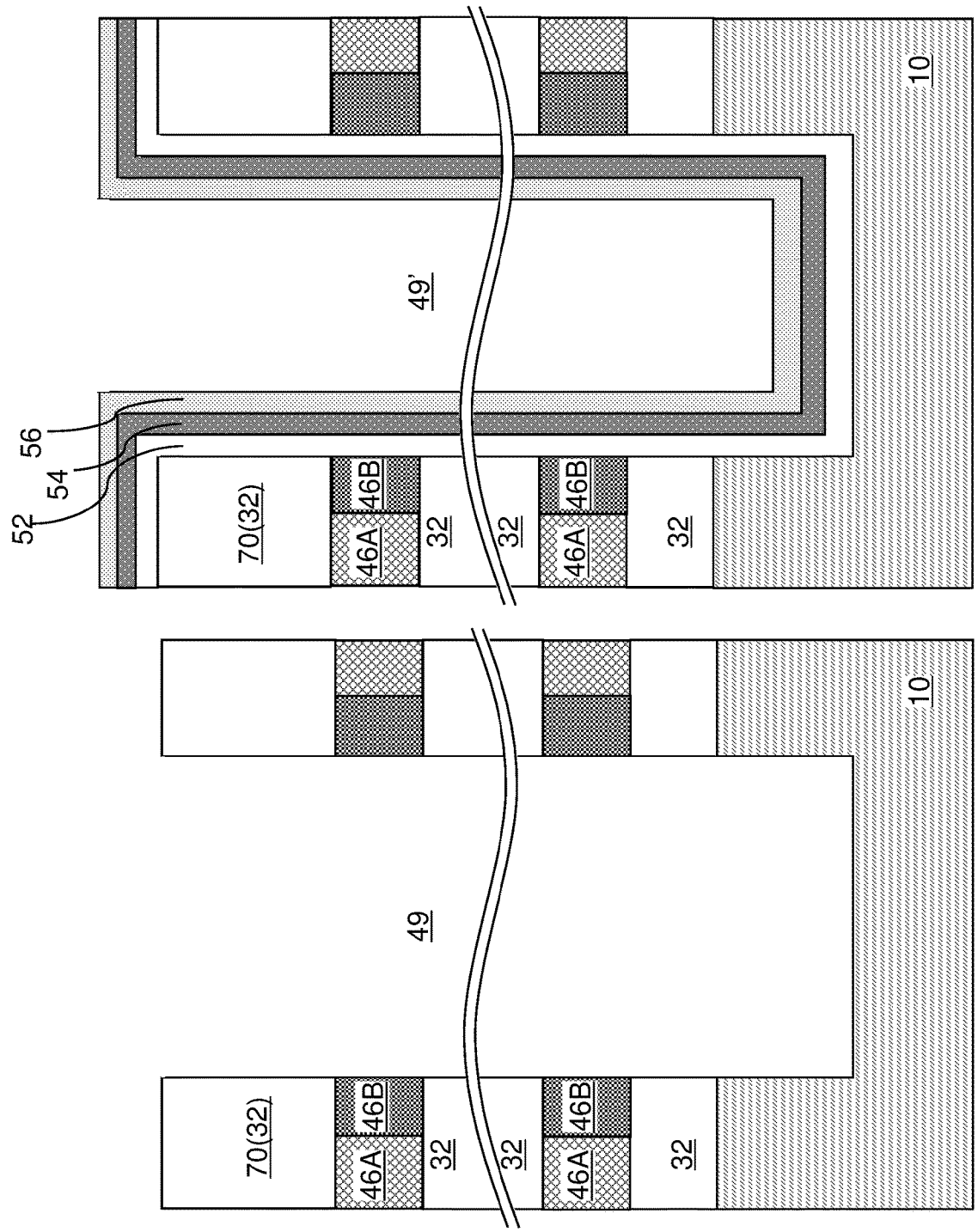

Referring to FIG. 10A, a memory opening 49 in the exemplary device structure of FIGS. 9A-9C is illustrated. The memory opening 49 extends through the alternating stack {32, (41, 43, 46)} of insulating layers 32 and composite layers (41, 43, 46), and optionally into an upper portion of the semiconductor material layer 10. Each support opening 19 can extend through the stepped dielectric material portion 65, a subset of layers in the alternating stack {32, (41, 43, 46)}, and optionally into the upper portion of the semiconductor material layer 10. The recess depth of the bottom surface of each memory opening with respect to the top surface of the semiconductor material layer 10 can be in a range from 0 nm to 30 nm, although greater recess depths can also be used.

Referring to FIG. 10B, a stack of layers including a blocking dielectric layer 52, a memory material layer 54, and an optional dielectric material liner 56 can be sequentially deposited in the memory openings 49, in the support openings 19, and over the insulating cap layer 70.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

The memory material layer 54 can be deposited as a continuous material layer by a conformal deposition process such as a chemical vapor deposition process or an atomic layer deposition process. The memory material layer 54 includes a memory material, i.e., a material that can store data by selecting a state of the material. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a charge storage layer in which each portion adjacent to the electrically conductive strips 46 constitutes a charge storage region. For example, the memory material layer 54 may include a charge storage material, such as silicon nitride, polysilicon, or a metallic material, a ferroelectric material that can store information in the form of a polarization direction, or any other memory material that can store date by altering electrical resistivity.

The memory material layer 54 can be formed as a single memory material layer of homogeneous composition, or can include a stack of multiple memory material layers. In one embodiment, the memory material layer 54 may comprise an insulating charge trapping material, such as one or more silicon nitride segments. The thickness of the memory material layer 54 can be in a range from 2 nm to 20 nm, although lesser and greater thicknesses can also be employed.

The optional dielectric material liner 56, if present, includes a dielectric material. The dielectric material liner 56 can be formed on the memory material layer 54 employing a conformal deposition process. In one embodiment, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed. A memory cavity 49' is present in an unfilled volume of each memory opening 49.

Figures 10C, 10D:
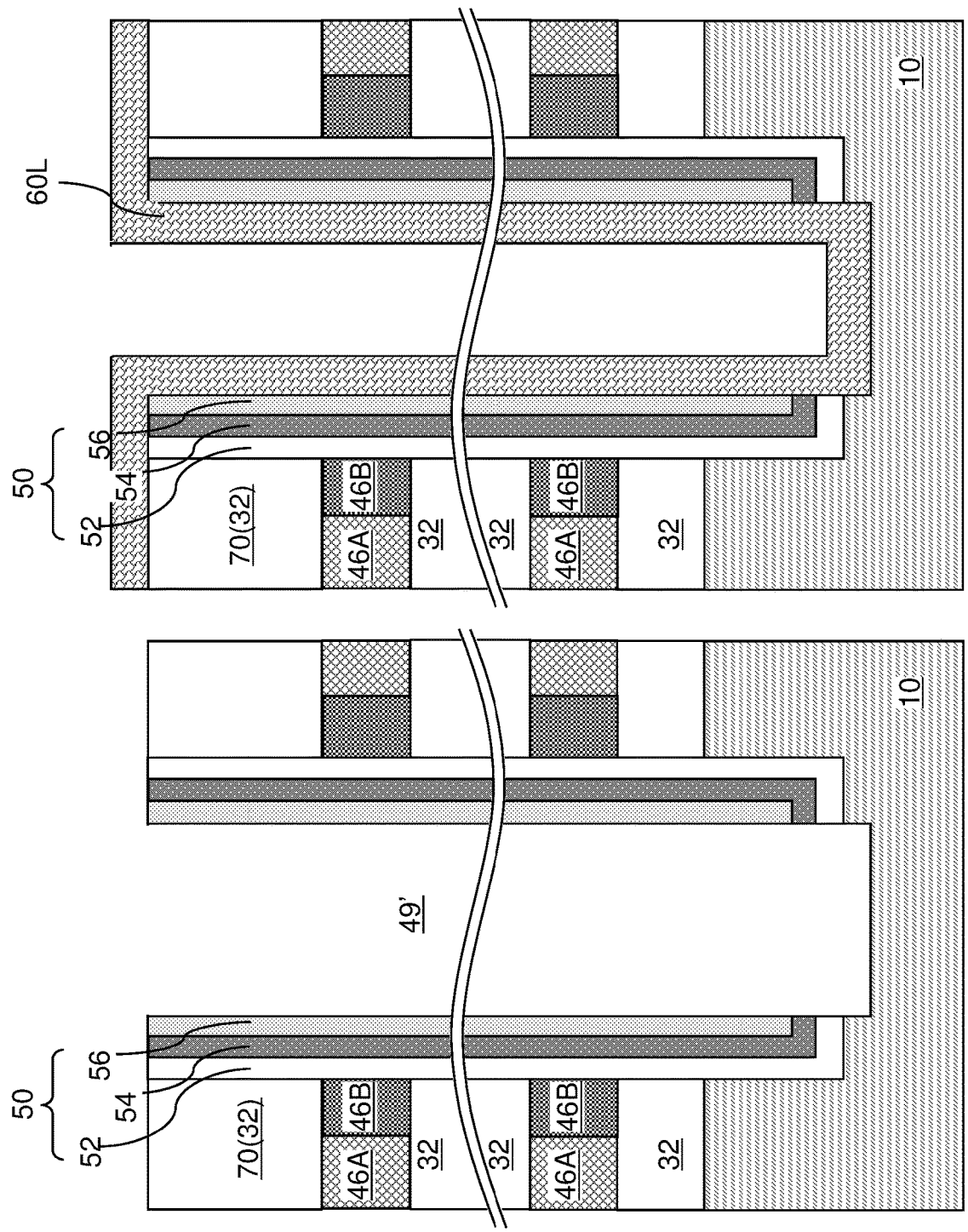

Referring to FIG. 10C, a sacrificial cover layer (not shown) may be optionally deposited over the dielectric material liner 56. The sacrificial cover layer, if present, comprises a sacrificial material that may be subsequently removed selective to the material of the dielectric material liner 56. In one embodiment, the sacrificial cover layer comprises amorphous carbon, diamond-like carbon, or a sacrificial semiconductor material.

At least one anisotropic etch process can be performed to sequentially etch horizontally-extending portions of the sacrificial cover layer (if present), the dielectric material liner 56, the memory material layer 54, and the blocking dielectric layer 52. The horizontally-extending portions of the optional sacrificial cover layer, the dielectric material liner 56, the memory material layer 54, and the blocking dielectric layer 52 located above the top surface of the insulating cap layer 70 can be removed by the at least one anisotropic etch process. Further, the horizontally-extending portions of the optional sacrificial cover layer, the dielectric material liner 56, the memory material layer 54, and the blocking dielectric layer 52 at a bottom of each memory cavity 49' can be removed to form openings in remaining portions thereof. Each of the optional sacrificial cover layer, the dielectric material liner 56, the memory material layer 54, and the blocking dielectric layer 52 can be etched by a respective anisotropic etch process employing a respective etch chemistry, which may, or may not, be the same for the various material layers. Remaining portions of the sacrificial cover layer can be removed selective to the dielectric material liner 56, for example, by an isotropic etch process such as a wet etch process.

Each remaining portion of the dielectric material liner 56 may have a tubular configuration. Each remaining portion of the memory material layer 54 may have a tubular configuration. Each remaining portion of the blocking dielectric layer 52 may have a tubular configuration. Each contiguous combination of a blocking dielectric layer 52, a memory material layer 54, and a dielectric material liner 56 constitutes a memory film 50. A surface of the semiconductor material layer 10 can be physically exposed underneath a bottom opening in the memory film 50 within each memory opening 49.

Referring to FIG. 10D, a semiconductor channel layer 60L can be conformally deposited directly on the physically exposed surface of the semiconductor material layer 10 and on the inner sidewall of the memory film 50 within each memory opening 49. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be used. A memory cavity 49' is formed in the volume of each memory opening 49 that is not filled with the deposited material layers (52, 54, 56, 60L).

Referring to FIG. 10E, in case the memory cavity 49' in each memory opening 49 is not completely filled with the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 10F, the dielectric core layer 62L can be recessed selective to the material of the semiconductor channel layer 60L, for example, by a recess etch. The material of the dielectric core layer 62L is vertically recessed below the horizontal plane including the top surface of the insulating cap layer 70. Each remaining portion of the dielectric core layer 62L constitutes a dielectric core 62.

Figure 10G:
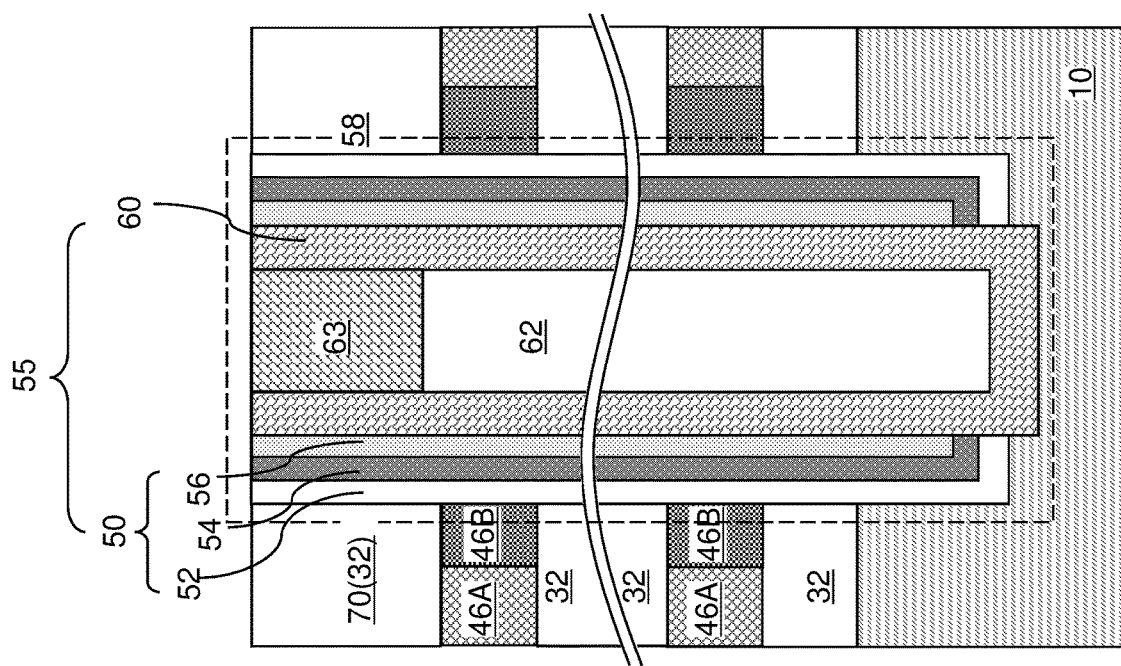
Figure 11A:
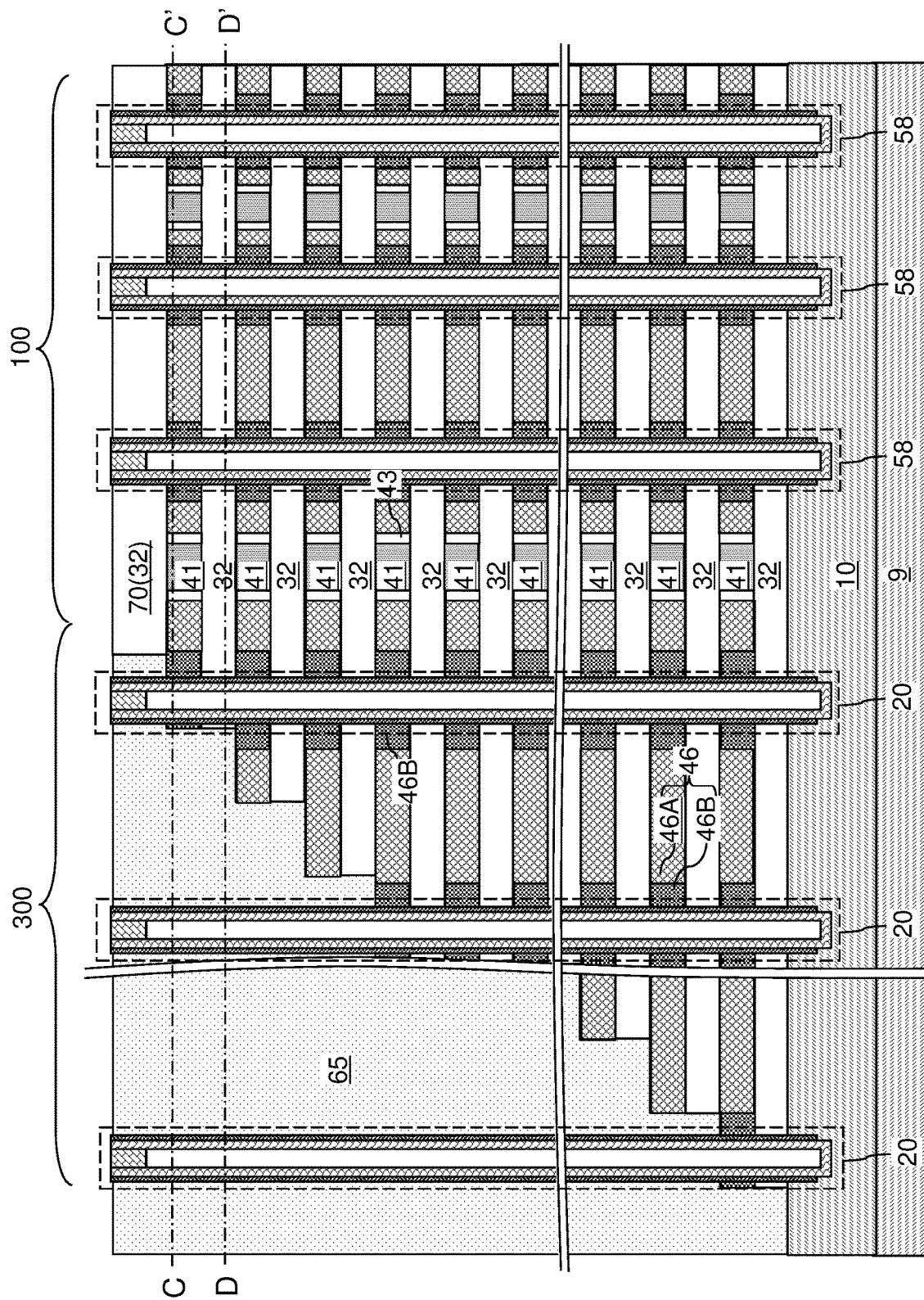
FIG. 11A is a vertical cross-sectional view of the first exemplary structure after formation of memory opening fill structures and support pillar structures according to an embodiment of the present disclosure.
Figure 11B:
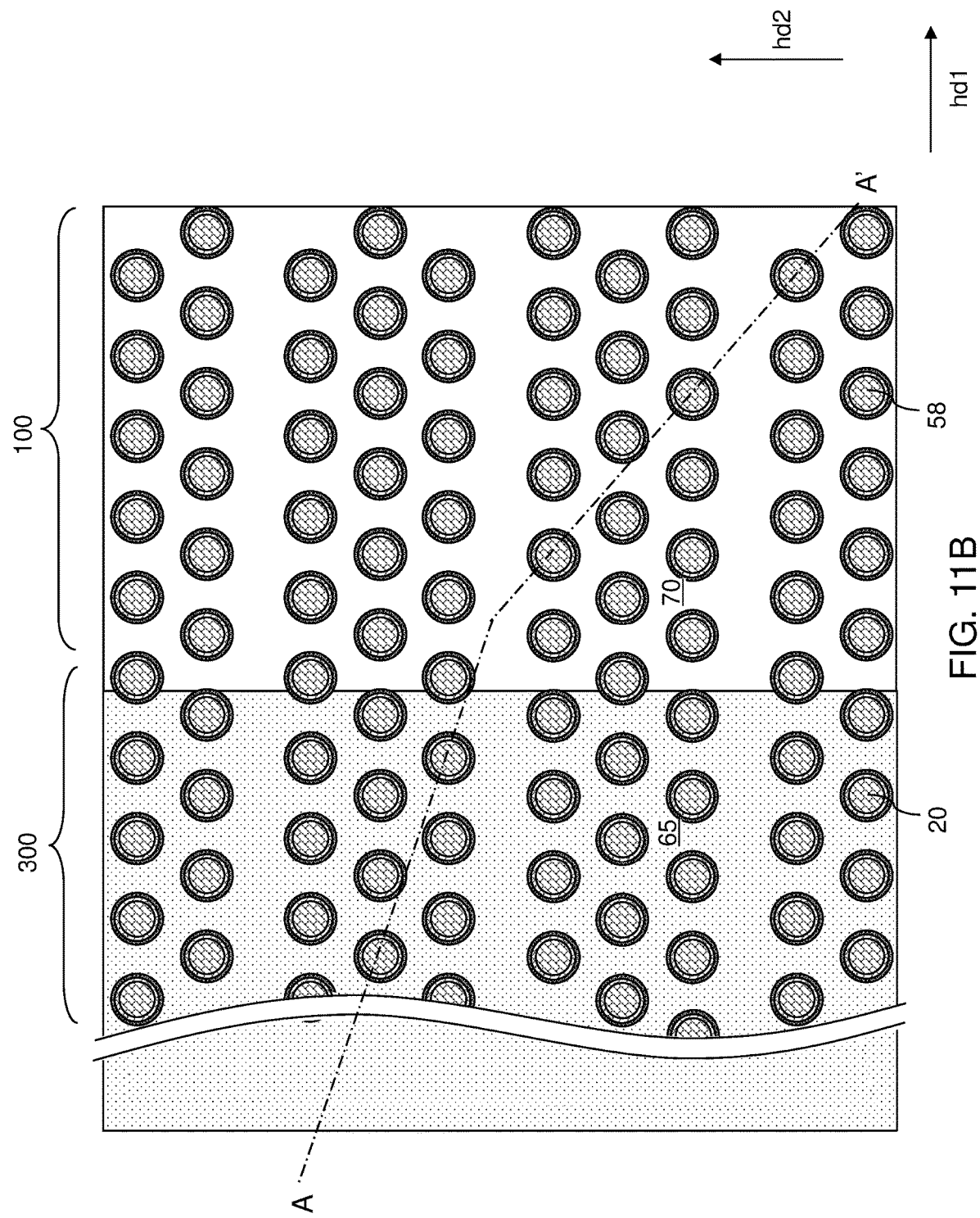
FIG. 11B is a top-down view of the first exemplary structure of FIG. 11A.
Figure 11C:
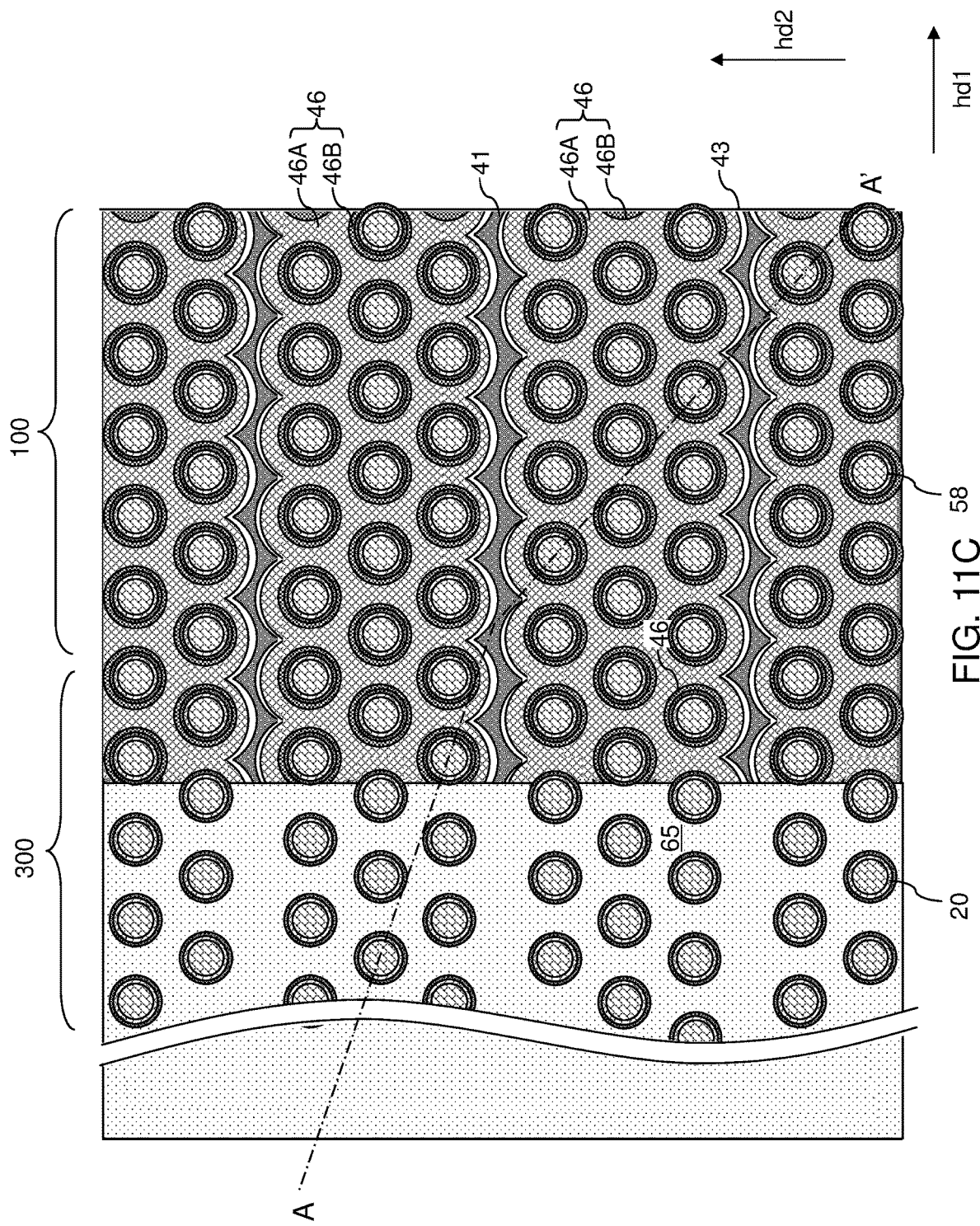
FIG. 11C is a horizontal cross-sectional view of the first exemplary structure along the horizontal plane C-C' of FIG. 11A.

Referring to FIG. 10G, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a dielectric material liner 56, a plurality of memory elements as embodied as portions of the memory material layer 54, and a blocking dielectric layer 52. An entire set of material portions that fills a memory opening 49 is herein referred to as a memory opening fill structure 58. An entire set of material portions that fills a support opening 19 constitutes a support pillar structure.

Referring to FIGS. 11A-11D, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 9A-9C. An instance of the support pillar structure 20 can be formed within each support opening 19 of the structure of FIGS. 9A-9C. The support pillar structures 20 are formed through a region of the alternating stack {32, (41, 43, 46)} that underlie the stepped surfaces and through a region of the stepped dielectric material portion 65 that overlie the stepped surfaces. Each of the support pillar structures 20 comprises a semiconductor material portion (i.e., dummy vertical semiconductor channel 60 of the support pillar structure 20) having a same composition as the vertical semiconductor channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described using the illustrated configuration for the memory stack structure, the methods of the present disclosure can be applied to alternative memory stack structures including different layer stacks or structures for the memory film 50 and/or for the vertical semiconductor channel 60.

Generally, memory opening fill structures 58 are formed within the memory openings 49 such that each of the memory opening fill structures 58 comprises a respective vertical stack of memory elements and a respective vertical semiconductor channel 60. In one embodiment, each of the memory opening fill structures 58 may be formed directly on a vertical stack of a respective subset of the second metallic material portions 46B. Rows of memory opening fill structures 58 may be located within rows of memory openings 49 in a same memory opening cluster 49C. In some embodiments, each of the memory opening fill structures 58 comprises a memory film 50 including a dielectric material liner 56 that contacts the vertical semiconductor channel 60, a vertical of memory elements as portions of a memory material layer 54 that are located at levels of the electrically conductive strips 46, and a blocking dielectric layer 52 that surrounds the memory material layer 54.

Referring to FIGS. 12A-12D, a contact-level dielectric layer 73 can be formed over the insulating cap layer 70 and the stepped dielectric material portion 65. The contact-level dielectric layer 73 comprises a dielectric material such as undoped silicate glass, a doped silicate glass, or organosilicate glass. The thickness of the contact-level dielectric layer 73 may be in a range from 100 nm to 600 nm, although lesser and grater thicknesses may also be employed.

Additional contact via structures (88, 86) can be formed through the contact-level dielectric layer 73, and optionally through the stepped dielectric material portion 65. For example, drain contact via structures 88 can be formed through the contact-level dielectric layer 73 on each drain region 63. Word line contact via structures 86 can be formed on the electrically conductive strips 46 through the contact-level dielectric layer 73, and through the stepped dielectric material portion 65. These steps complete formation of a memory die 1000.

In one embodiment, the memory die 1000 also includes at least one drain select composite layer 48D and at least one source select composite layer 48S. The drain select composite layer 48D comprises a plurality of electrically conductive drain select gate electrode strips 46D laterally extending along the first horizontal direction hd1 and a plurality of drain select dielectric isolation strips 41D laterally extending along the first horizontal direction hd1. The drain select silicon oxide strips 43D are located between the silicon nitride drain select dielectric isolation strips 41D and electrically conductive drain select gate electrode strips 46D. The source select composite layer 48S comprises a plurality of electrically conductive source select gate electrode strips 46S laterally extending along the first horizontal direction hd1 and a plurality of source select dielectric isolation strips 41S laterally extending along the first horizontal direction hd1. The source select silicon oxide strips 43S are located between the silicon nitride source select dielectric isolation strips 41S and electrically conductive source select gate electrode strips 46S. The drain and source select gate electrode strips (46D, 46S) function as respect drain and source select gate electrodes of the NAND device. The alternating stack {32, (41, 43, 46)} is located between the bottommost drain select composite layer 48D and the topmost source select composite layer 48S. The electrically conductive strips 46 in the alternating stack comprise word line electrically conductive strips which function as word lines of the NAND device.

Figure 13:
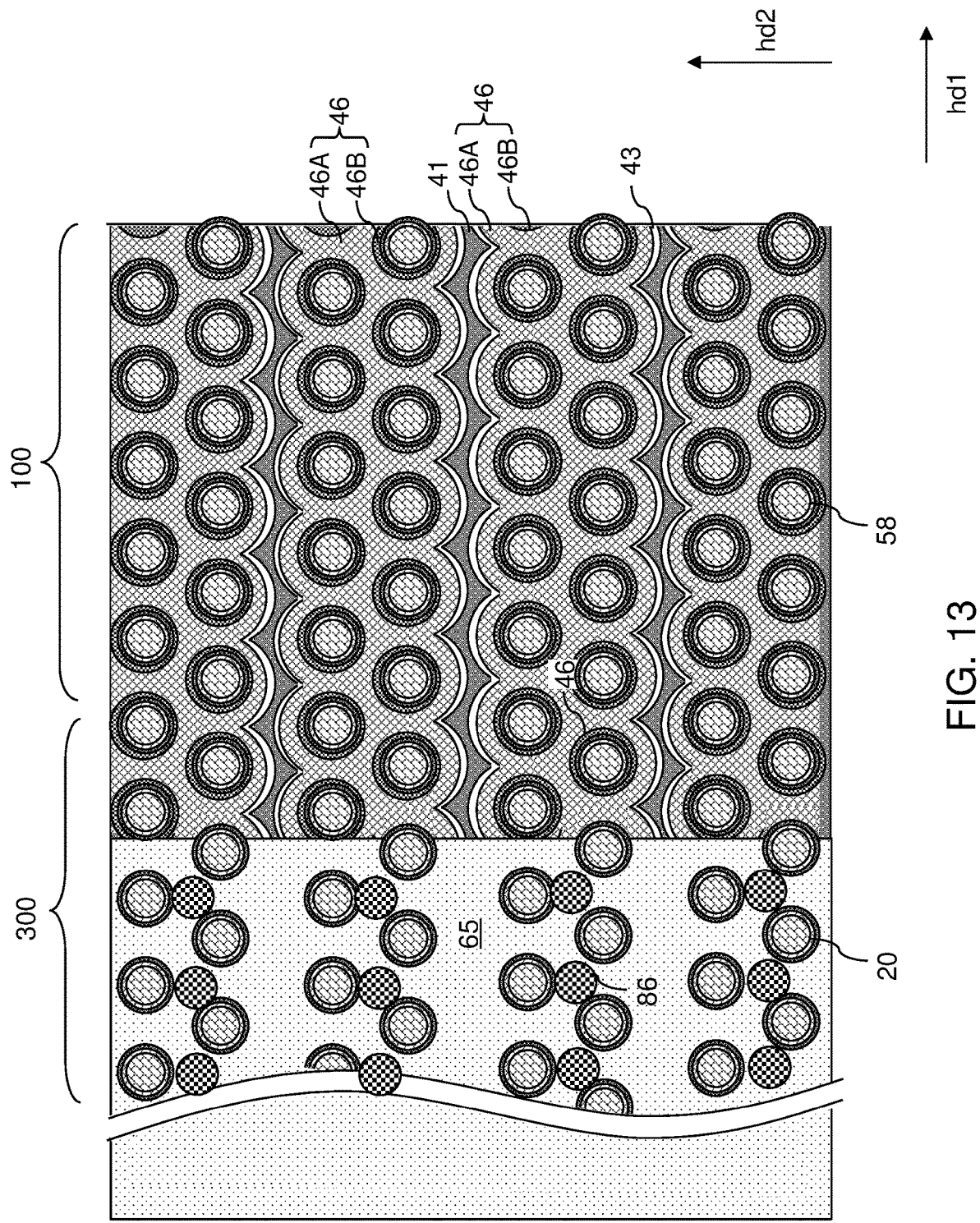
FIG. 13 is a horizontal cross-sectional view of a first alternative embodiment of the first exemplary structure according to an embodiment of the present disclosure.
Figure 14:
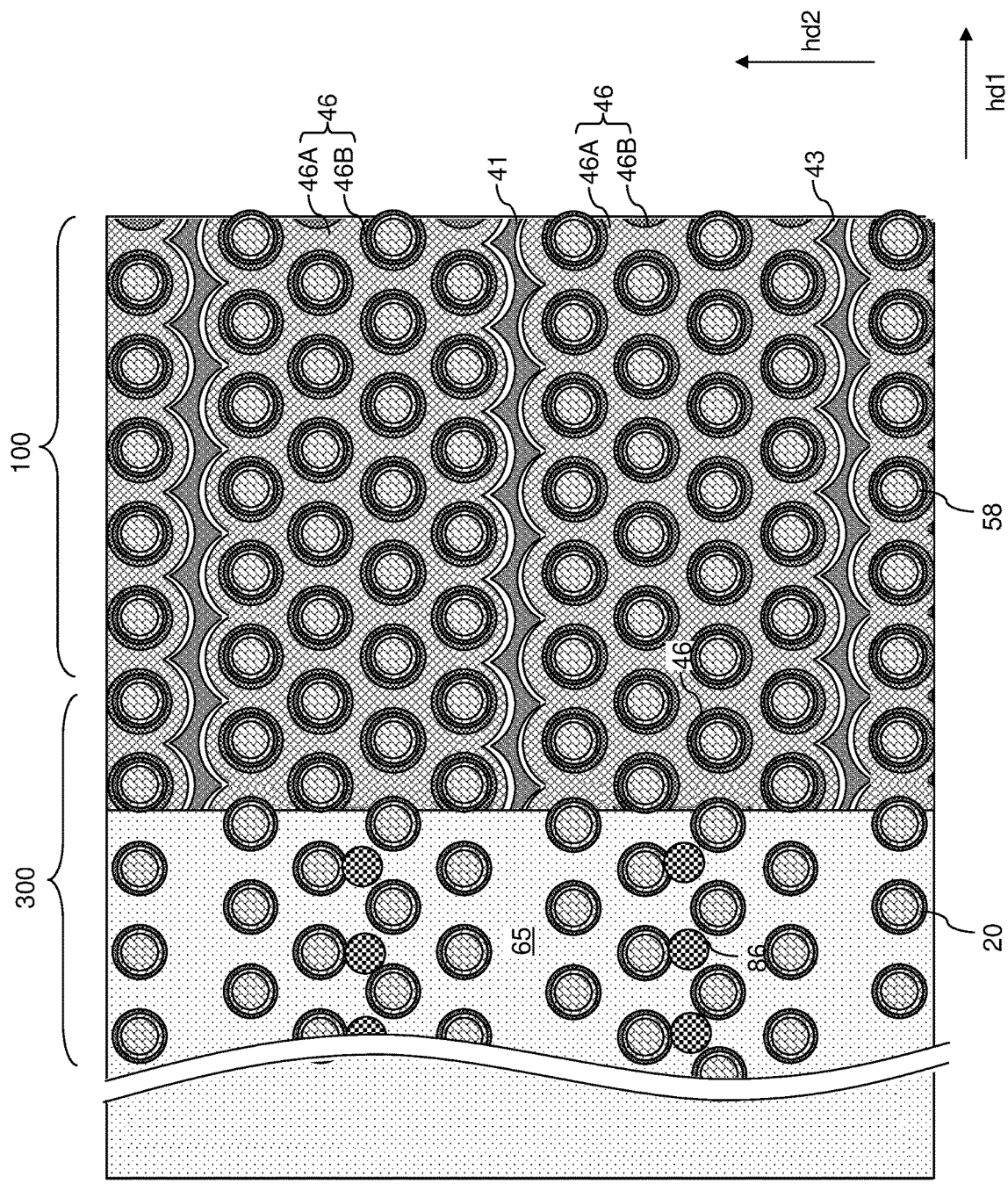
FIG. 14 is a horizontal cross-sectional view of a first alternative embodiment of the first exemplary structure according to an embodiment of the present disclosure.

Generally, the number of rows of memory openings 49 within each memory opening cluster 49C may be 1, 2, 3, or any integer greater than 3. Referring to FIG. 13, a horizontal cross-sectional view of a first alternative embodiment of the first exemplary structure according to an embodiment of the present disclosure is illustrated. In this example, the number of rows of memory openings 49 within each memory opening cluster 49C is two. Referring to FIG. 14, a horizontal cross-sectional view of a second alternative embodiment of the first exemplary structure according to an embodiment of the present disclosure is illustrated. In this example, the number of rows of memory openings 49 within each memory opening cluster 49C is four.

Figure 15:
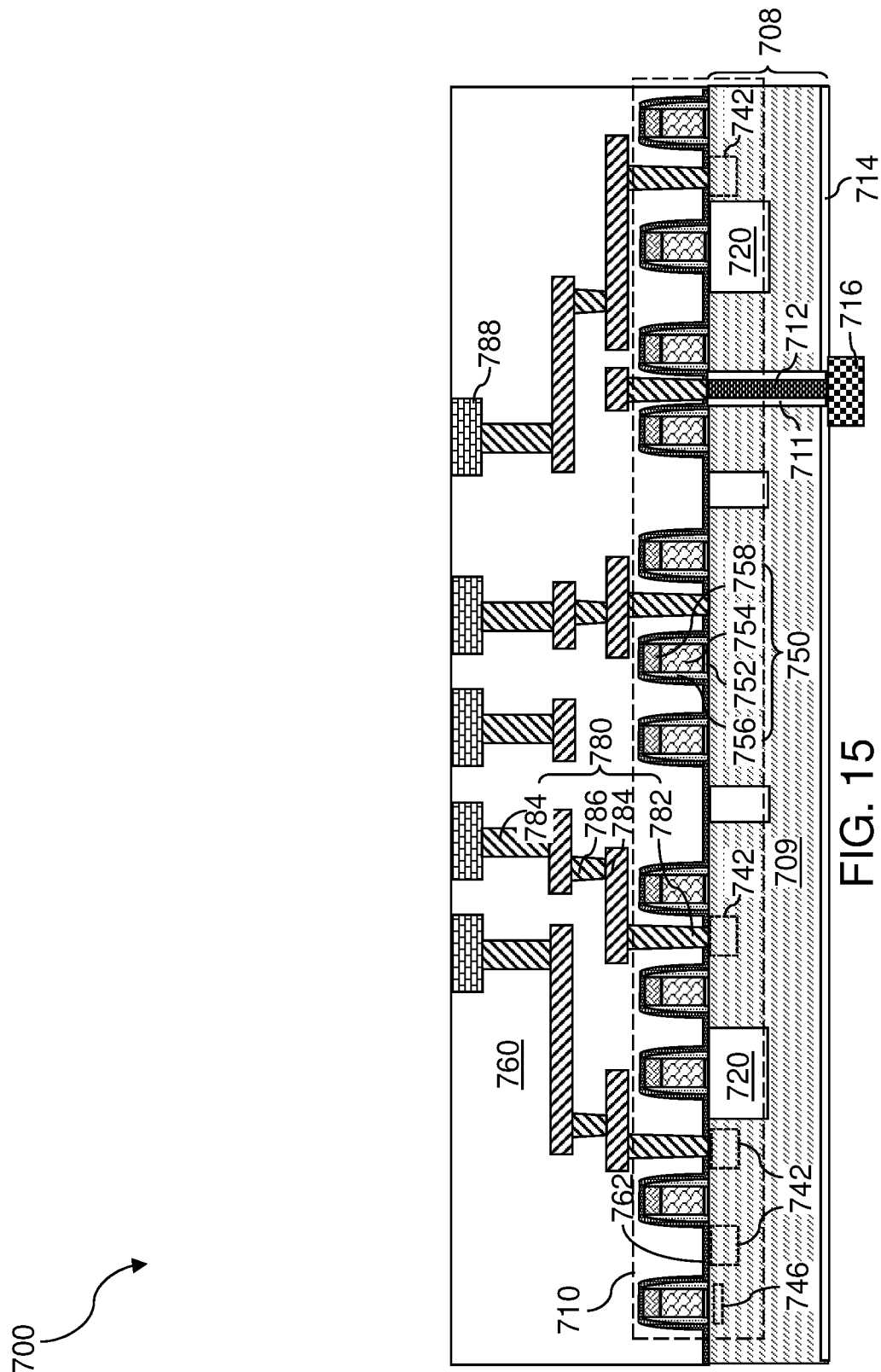
FIG. 15 is a schematic vertical cross-sectional view of a semiconductor logic die according to an embodiment of the present disclosure.

Referring to FIG. 15, a second semiconductor die can be provided, which can be a logic die 700 including various semiconductor devices 710. The semiconductor devices 710 includes a peripheral circuitry for operation of the three-dimensional memory arrays in the memory die 1000. The peripheral circuitry can include a word line driver that drives the electrically conductive layers 46 within the memory die 1000, a bit line driver that drives the bit lines in the memory die 1000, a word line decoder circuitry that decodes the addresses for the electrically conductive layers 46, a bit line decoder circuitry that decodes the addresses for the bit lines, a sense amplifier circuitry that senses the states of memory elements within the memory stack structures 55 in the memory die 1000, a power supply/distribution circuitry that provides power to the memory die 1000, a data buffer and/or latch, and/or any other semiconductor circuitry that can be used to operate the array of memory stack structures 55 in the memory die 1000. The logic die 700 can include a logic-die substrate 708, which can be a semiconductor substrate. The logic-die substrate can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 can be formed in an upper portion of the substrate semiconductor layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 1000 comprising the electrically conductive layers 46.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and second bonding structures 788 (such as metallic pad structures) that may be configured to function as bonding pads.

The logic die 700 can include an optional backside insulating layer 714 located on the backside surface of the logic die substrate 708. Optional laterally-insulated through-substrate via structures (711, 712) can be formed through the logic die substrate 708 to provide electrical contact to various input nodes and output nodes of the periphery circuitry. Each laterally-insulated through-substrate via structure (711, 712) includes a through-substrate conductive via structure 712 and a tubular insulating liner 711 that laterally surrounds the through-substrate conductive via structure 712. Backside bonding pads 716 can be formed on surface portions of the laterally-insulated through-substrate via structures (711, 712). Generally, a semiconductor die is provided, which includes semiconductor devices 710 located on a semiconductor substrate (such as the substrate semiconductor layer 709). The second bonding structures 788 overlie, and are electrically connected to, the semiconductor devices 710, and laterally-insulated through-substrate via structures (711, 712) can extend through the semiconductor substrate.

Figure 16:
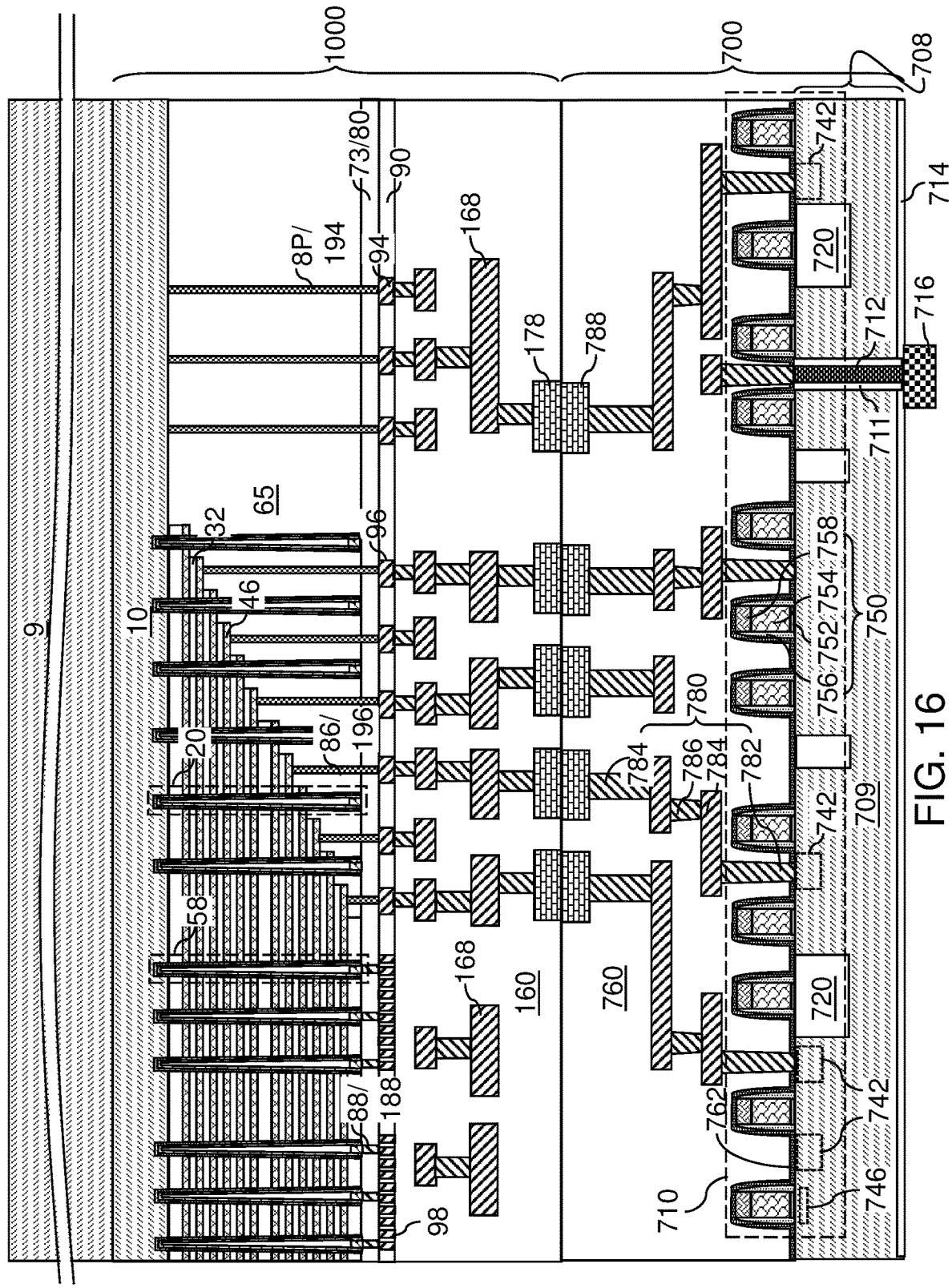
FIG. 16 is a schematic vertical cross-sectional view of a bonded assembly of the memory die and the logic die according to an embodiment of the present disclosure.

Referring to FIG. 16, a via level dielectric layer 80 is formed over the contact level dielectric layer 73. Various contact via structures (198, 196, 194) can be formed through the via level dielectric layer 80. For example, bit line connection via structures 198 can be formed on the drain contact via structures 88, word line connection via structures 196 can be formed on the word line contact via structures 86, and optional peripheral extension via structures 194 can be formed on optional pass-through via structures 8P.

A first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and peripheral metal interconnect lines 94 that are electrically connected to a respective one of the pass-through via structures 8P (for example, through a peripheral extension via structure 194).

The bit lines 98 are electrically connected to the drain regions 63 located on upper ends of a respective subset of the vertical semiconductor channels 60 in the memory stack structures 55 in the memory array region 100. In one embodiment, the memory stack structures 55 are arranged in rows that extend along the first horizontal direction hd1, and the bit lines 98 laterally extend along the second horizontal direction hd2.

Additional metal interconnect structures 168 included in additional interconnect level dielectric layers 160 are then formed. In an illustrative example, the additional interconnect level dielectric layers 160 can include a via level dielectric layer 110, a second line level dielectric layer 120, a second via level dielectric layer 130, and a metallic pad structure level dielectric layer 140. The metal interconnect structures 168 can include first metal via structures 108 included in the first via level dielectric layer 110, second metal line structures 118 included within the second line level dielectric layer 120, second metal via structures 128 included in the second via level dielectric layer 130, and first bonding structures 178 (such as metallic pad structures) included in the metallic pad structure level dielectric layer 140. While the present disclosure is described using an example in which the additional interconnect level dielectric layers 160 include the first via level dielectric layer 110, the second line level dielectric layer 120, the second via level dielectric layer 130, and the metallic pad structure level dielectric layer 140, embodiments are expressly contemplated herein in which the additional interconnect level dielectric layers 160 include a different number and/or different combinations of dielectric material layers. The memory die 1000 includes a three-dimensional array of memory elements. Electrical connection paths can be provided by each combination of a first bonding structure 178 and a set of metal interconnect structures {(194, 94, 108, 118, 128), (196, 96, 108, 118, 128), or (198, 98, 108, 118, 128)}.

The memory die 1000 and the logic die 700 are positioned such that the second bonding structures 788 of the logic die 700 face the first bonding structures 178 of the memory die 1000. In one embodiment, the memory die 1000 and the logic die 700 can be designed such that the pattern of the second bonding structures 788 of the logic die 700 is the mirror pattern of the pattern of the first bonding structures 178 of the memory die 1000. The memory die 1000 and the logic die 700 can be bonded to each other by metal-to-metal bonding. Alternatively, an array of solder material portions may be used to bond the memory die 1000 and the logic die 700 through the array of solder material portions (such as solder balls).

In the case of metal-to-metal bonding, facing pairs of a first bonding structure 178 of the memory die 1000 and a second bonding structure 788 of the logic die 700 can brought to direct contact with each other, and can be subjected to an elevated temperature to induce material diffusion across the interfaces between adjoined pairs of metallic pad structures (178, 788). The interdiffusion of the metallic material can induce bonding between each adjoined pairs of metallic pad structures (178, 788). In addition, the logic-side dielectric layers 760 and the interconnect level dielectric layers 160 can include a dielectric material (such as a silicate glass material) that can be bonded to each other. In this case, physically exposed surfaces of the logic-side dielectric layers 760 and the interconnect level dielectric layers 160 can be brought to direct contact with each other and can be subjected to thermal annealing to provide additional bonding.

In case an array of solder material portions is used to provide bonding between the memory die 1000 and the logic die 700, a solder material portion (such as a solder ball) can be applied to each of the first bonding structures 178 of the memory die 1000, and/or to each of the second bonding structures 788 of the logic die 700. The memory die 1000 and the logic die 700 can be bonded to each other through an array of solder material portions by reflowing the solder material portions while each solder material portion is contacted by a respective pair of a first bonding structure 178 of the memory die 1000 and a second bonding structure 788 of the logic die 700.

Generally, a logic die 700 can be bonded to a memory die 1000. The memory die 1000 comprises an array of memory stack structures 55, and the logic die 700 comprises a complementary metal oxide semiconductor (CMOS) circuit that includes a peripheral circuitry electrically coupled to nodes of the array of memory stack structures 55 through a subset of metal interconnect structures 168 included within the memory die 1000. The memory die 1000 includes the semiconductor material layer 10, and is attached to the carrier substrate 9.

Figure 17:
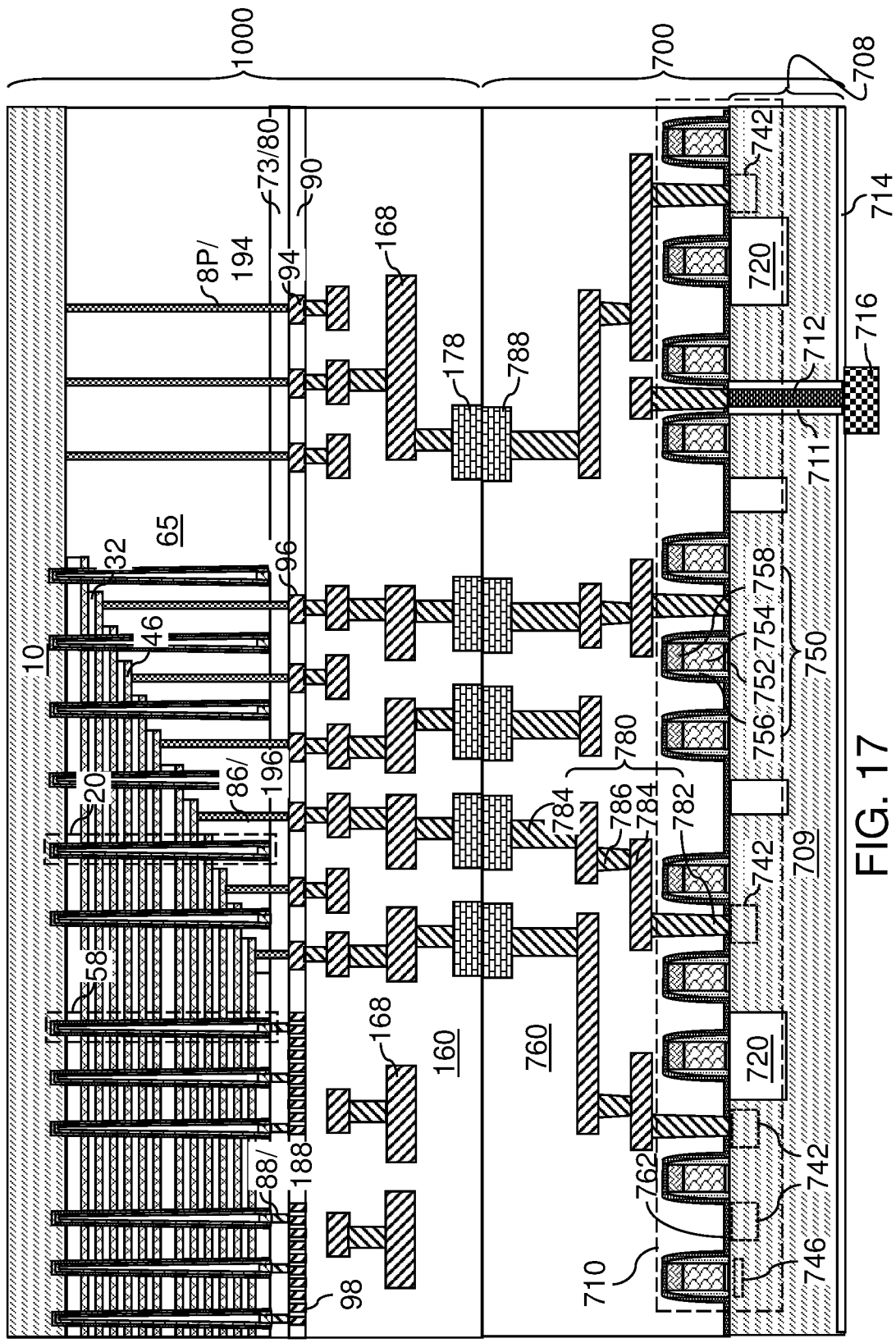
FIG. 17 is a schematic vertical cross-sectional view of the bonded assembly after removal of a distal portion of the carrier substrate according to an embodiment of the present disclosure.

Referring to FIG. 17, the carrier substrate 9 can be removed from above the semiconductor material layer 10. For example, a backside grinding process can be performed to remove the carrier substrate 9 in case the carrier substrate 9 includes a bulk portion of a semiconductor wafer. In case the carrier substrate 9 includes a different material than the semiconductor material layer 10, a suitable separation method may be used to detach the carrier substrate 9 from the semiconductor material layer 10. In one embodiment, the carrier substrate 9 may be attached to the semiconductor material layer 10 through a sacrificial separation material layer that is isotropically etched (for example, in a wet etch process) to induce separation of the carrier substrate 9 from the semiconductor material layer 10. In one embodiment, the sacrificial separation material layer can include silicon nitride, and removal of the sacrificial separation material layer can be performed by a wet etch process using hot phosphoric acid. A backside surface of the semiconductor material layer 10 can be physically exposed upon removal of the carrier substrate 9.

Figure 18:
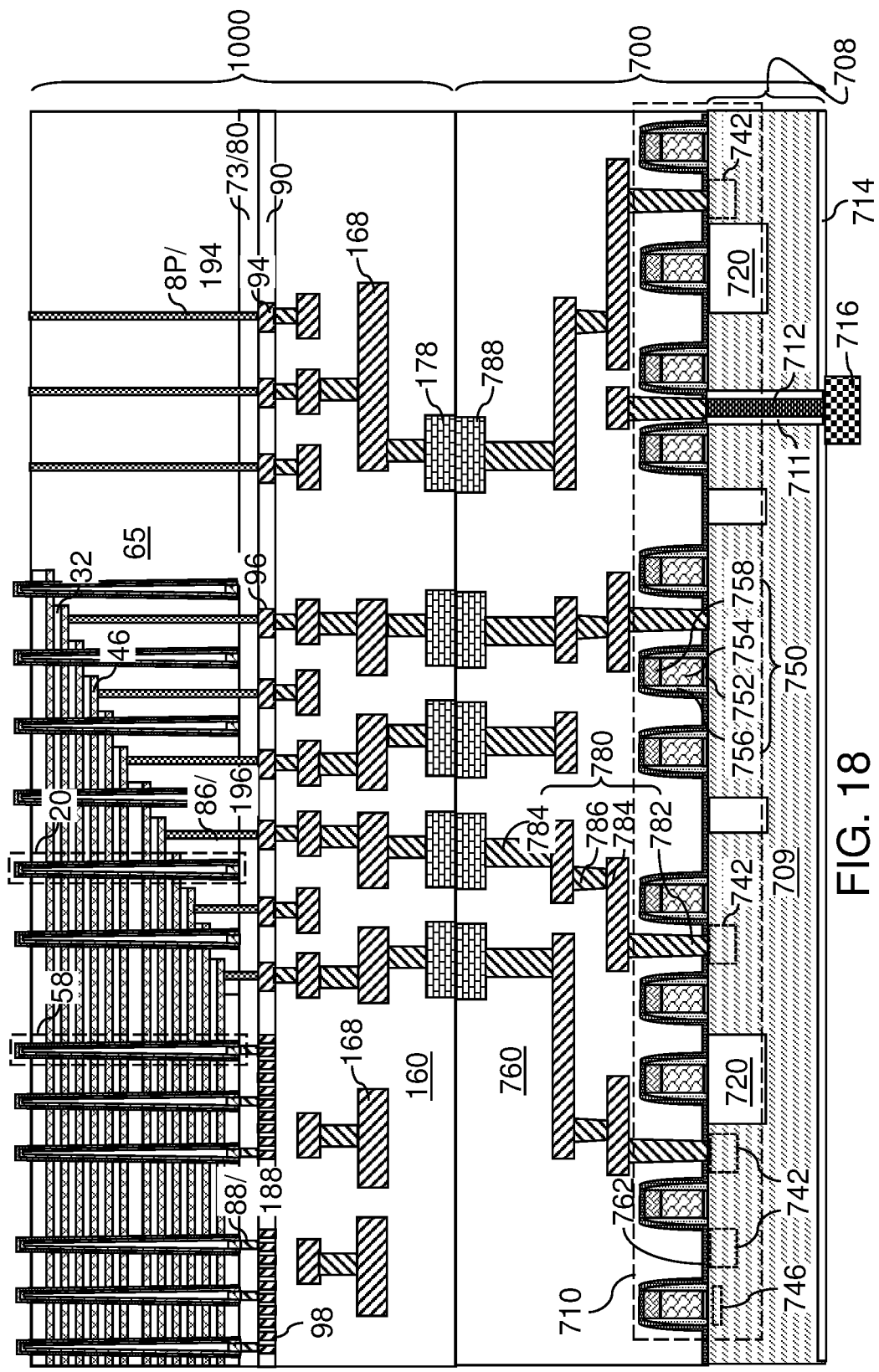
FIG. 18 is a schematic vertical cross-sectional view of the bonded assembly after removal of a proximal portion of the carrier substrate according to an embodiment of the present disclosure.
Figure 19A:
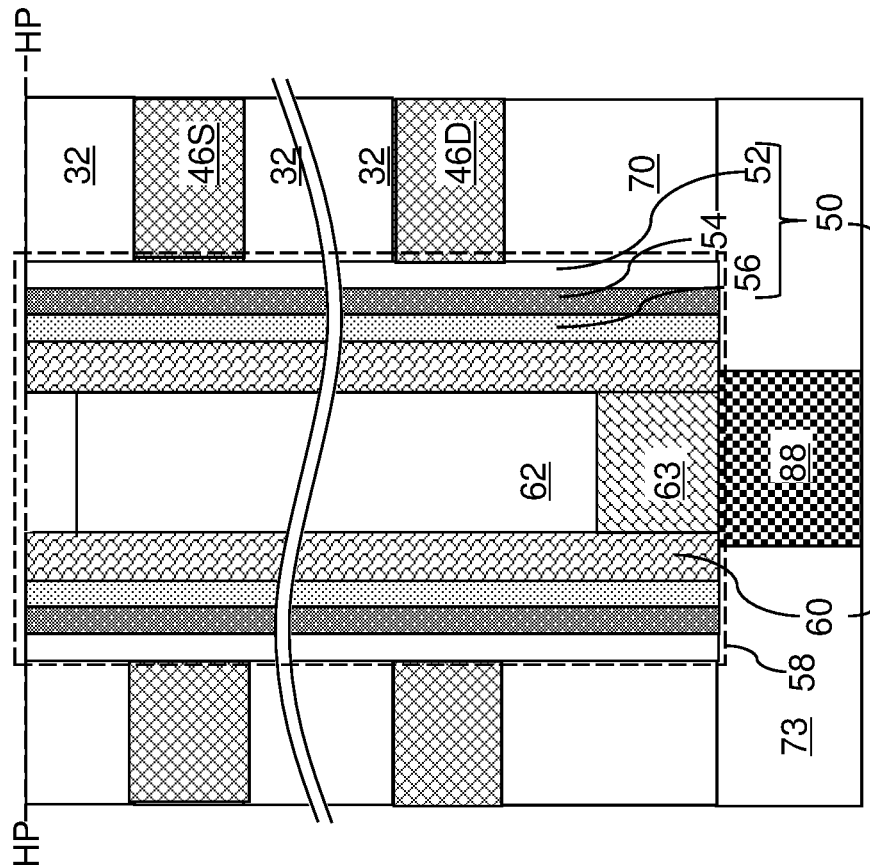
FIGS. 19A-19C are sequential vertical cross-sectional views of a first configuration for a memory opening fill structure during various processing steps up to deposition of a source layer according to an embodiment of the present disclosure.

Referring to FIGS. 18 and 19A, the semiconductor material layer 10 can be removed. In one embodiment, removal of the semiconductor material layer 10 may be performed by chemical mechanical planarization (CMP) using the most distal one of the insulating layers 32 and the stepped dielectric material portion 65 as stopping structures. A distal end of each of the vertical semiconductor channels 60 is physically exposed upon removal of the semiconductor material layer 10. A planar surface of a most distal one of the insulating layers 32 (i.e., the bottommost insulating layer 32 formed directly on the semiconductor material layer 10 at the processing steps of FIG. 2) within the alternating stack (32, 46) is physically exposed upon removal of the semiconductor material layer 10. A planar surface of the stepped dielectric material portion 65 is physically exposed upon removal of the semiconductor material layer 10. Portions of the memory stack structures 55 that protrude through a horizontal plane HP including the planar surface of the most distal one of the insulating layers 32 are removed during the CMP process.

Figure 19B:
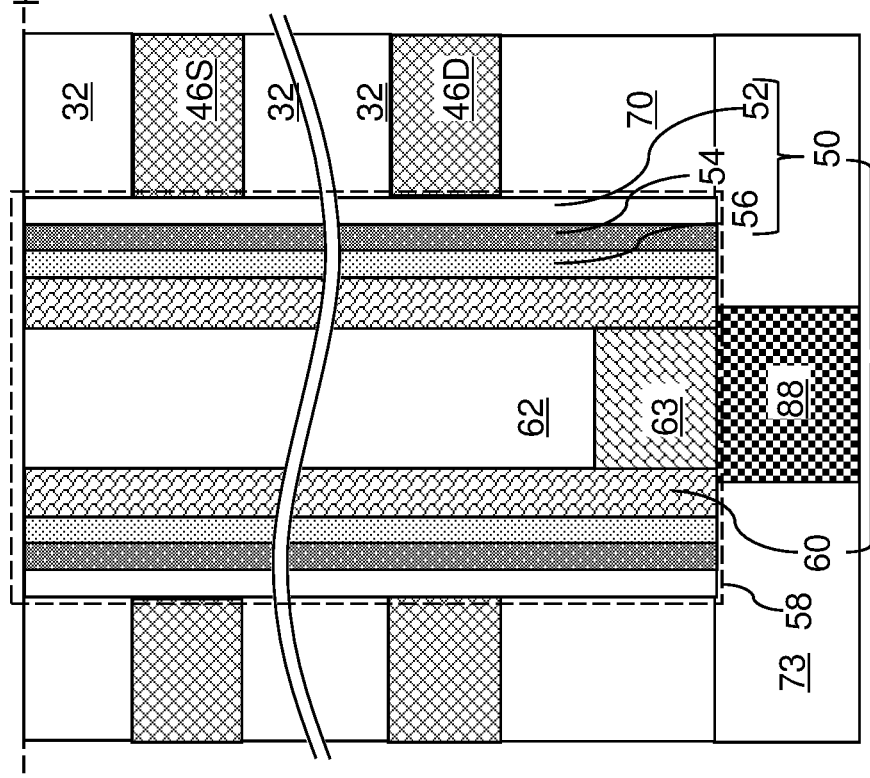

Referring to FIG. 19B, physically exposed surfaces of the dielectric cores 62 may optionally be vertically recessed selective to the semiconductor material of the vertical semiconductor channels 60. An isotropic etch process that etches the material of the dielectric cores 62 selective to the semiconductor material of the vertical semiconductor channels 60 can be performed to vertically recess the dielectric cores 62. For example, a wet etch using dilute hydrofluoric acid can be used to vertically recess the distal planar surfaces of the dielectric cores 62 selective to the annular distal surfaces of the vertical semiconductor channels 60 that are located within the horizontal plane HP that includes the annular distal surfaces of the vertical semiconductor channels 60. Vertical recessing of the dielectric cores 62 increases the area of the physically exposed surfaces of the vertical semiconductor channels 60, thereby lowering contact resistance between the vertical semiconductor channels 60 and a source layer to be subsequently formed thereupon. In one embodiment, the dielectric cores 62 can include a dielectric material having a greater etch rate than the dielectric material of the insulating layers 32. For example, the dielectric cores 62 can include borosilicate glass, borophosphosilicate glass, or organosilicate glass, and the insulating layers 32 can include densified undoped silicate glass. In one embodiment, the physically exposed surface of the insulating layer 32 (which is most distal from the interface between the memory die 1000 and the logic die 700, and is most proximal to a source layer to be subsequently formed) may be collaterally recessed during recessing of the physically exposed planar surfaces of the dielectric cores 62. Distal surfaces of the pass-through via structures 8P can be physically exposed.

Figure 19C:
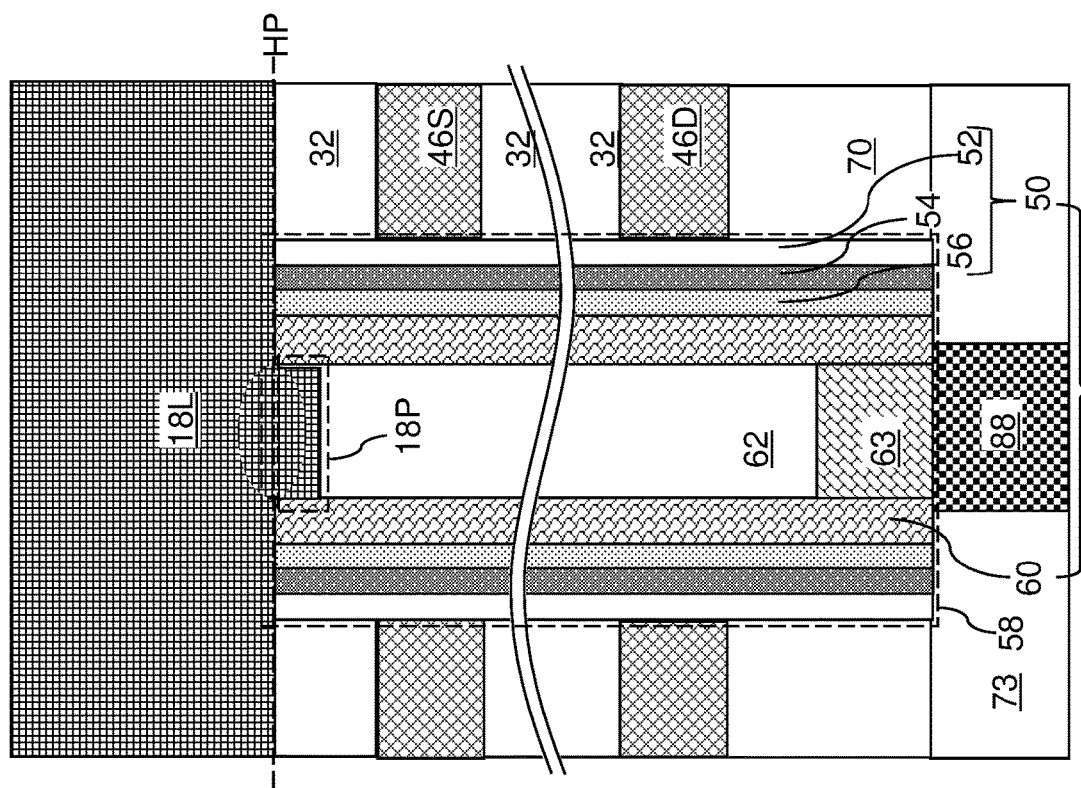
Figure 20:
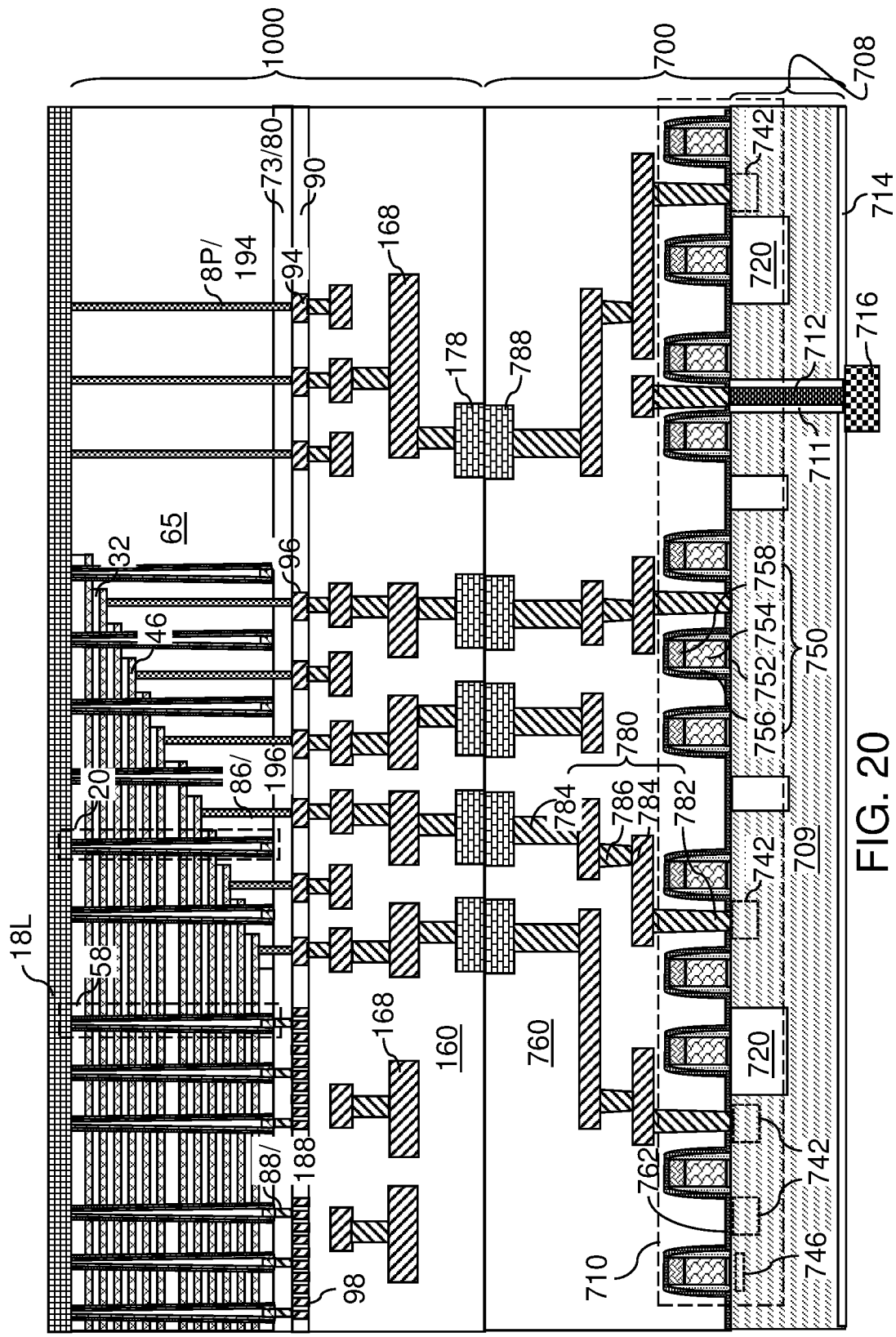
FIG. 20 is a vertical cross-sectional view of the bonded assembly after deposition of the source layer according to an embodiment of the present disclosure.

Referring to FIGS. 19C and 20, a source layer 18L can be deposited directly on the physically exposed surfaces of the vertical semiconductor channels 60, the planar surface of the physically exposed one of the insulating layers 32, and on the physically exposed planar surface of the stepped dielectric material portion 65. The source layer 18L can include a conductive semiconductor material (i.e., a heavily doped semiconductor material, such as heavily doped polysilicon) having a doping of the second conductivity type, i.e., the opposite of the first conductivity type. Thus, the source layer 18L can include a doped semiconductor material having a conductivity greater than $1.0 \times 10^5$ S/cm. Alternatively, the source layer 18L may comprise a metallic layer, such as a pure metal (e.g., Al, W, Ti, Mo, Ta, Cu), alloys thereof, conductive nitrides thereof (e.g., TiN, WN or TaN) or suicides thereof (e.g., titanium, tungsten or tantalum silicide). The thickness of the source layer 18L can be in a range from 100 nm to 1,000 nm, although lesser and greater thicknesses can also be used. Vertically protruding portions 18P of the source layer 18L vertically protrude across the horizontal plane including the annular top surfaces of the vertical semiconductor channels 60 toward a respective one of the dielectric cores 62, and contacts the respective one of the dielectric cores 62.

Figure 21:
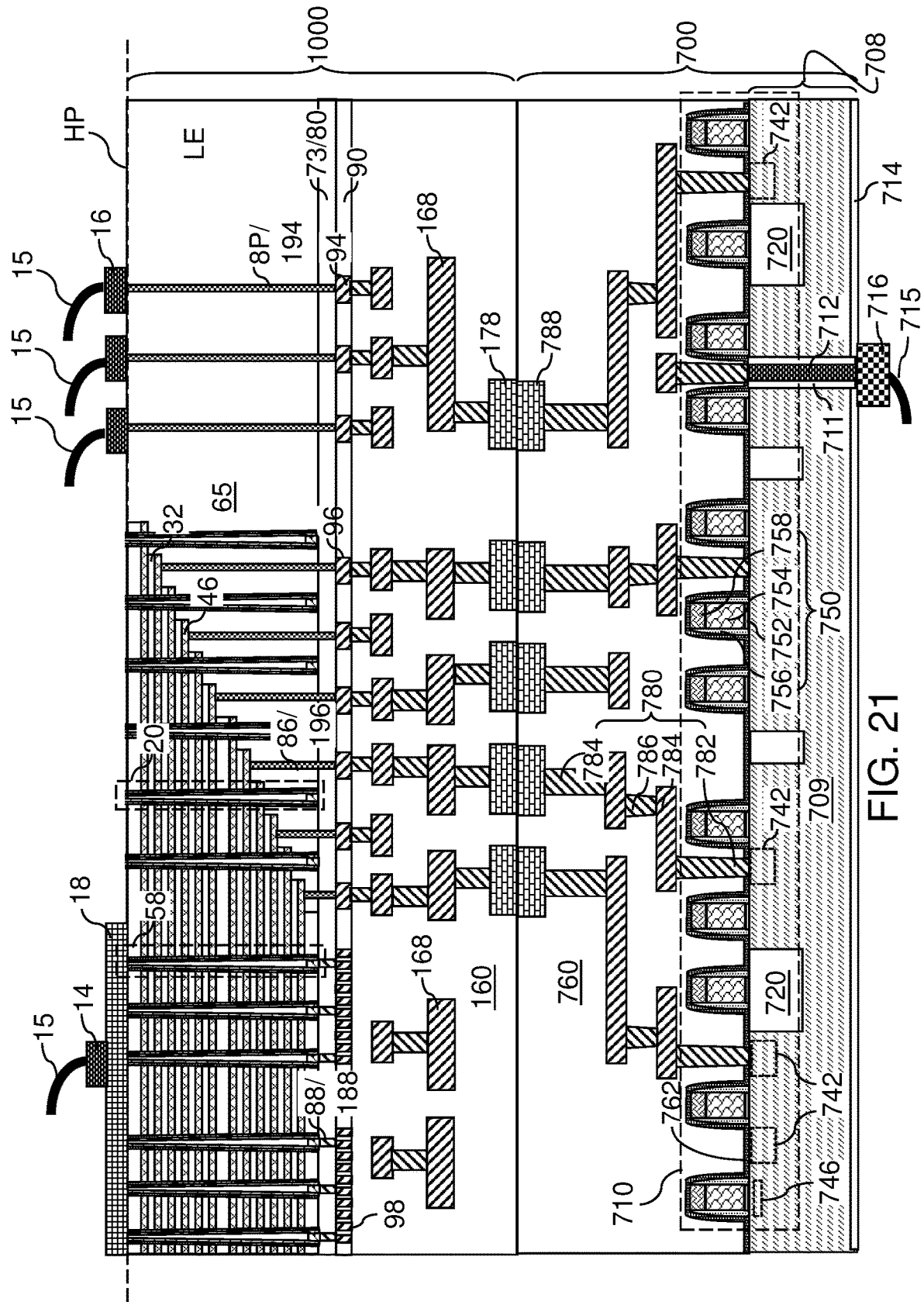
FIG. 21 is a vertical cross-sectional view of the bonded assembly after patterning the source layer and after formation of various bonding pads and attachment of bonding wires according to an embodiment of the present disclosure.

Referring to FIG. 21, the source layer 18L can be patterned into patterned source layer 18, for example, by a combination of lithographic methods and an etch process. A lithographically patterned photoresist layer can cover only the portion of the source layer 18L located within the memory array region. An etch process can be used to remove portions of the source layer 18L that are not covered by the patterned photoresist layer. The photoresist layer can be removed, for example, by ashing. The patterned source layer 18 is formed directly on the distal end of each of the vertical semiconductor channels 60 within the memory opening fill structures 58, and does not contact any of the vertical semiconductor channels 60 within the support pillar structures 20. The lateral extent of the source layer 18 can be confined within the areas of the memory regions 100. Optionally, a dielectric passivation layer (not shown) may be formed over the alternating stack (32, 46), the stepped dielectric material portion 65, and the source layer 18.

Various bonding pads (14, 16) can be formed on the source layer 18 and the pass-through via structures 8P (if present). The bonding pads (14, 16) can include at least one source bonding pad 14 formed directly on the back side of the source layer 18, and optional backside bonding pads 16 formed directly on distal surfaces of the pass-through via structures 8P (if present). Bonding wires 15 can be bonded to a respective one of the bonding pads (14, 16). A backside bonding wire 715 can be bonded to each backside bonding pad 716.

Referring to all drawings and according to various embodiments of the present disclosure, a semiconductor structure is provided. The semiconductor structure comprises: an alternating stack of insulating layers 32 and composite layers (41, 43, 46), wherein each of the composite layers (41, 43, 46) comprises a plurality of electrically conductive word line strips 46 laterally extending along a first horizontal direction hd1 and a plurality of dielectric isolation strips 41 laterally extending along the first horizontal direction hd1, wherein the plurality of electrically conductive word line strips 46 and the plurality of dielectric isolation strips 41 are interlaced with each other along a second horizontal direction hd2 that is perpendicular to the first horizontal direction hd1, and each of the insulating layers 32 continuously extends along the second horizontal direction hd2 and has an areal overlap with each electrically conductive strip 46 and each dielectric isolation strip 41 within the composite layers (41, 43, 46) within a memory array region in a plan view along a vertical direction; rows of memory openings 49 arranged along the first horizontal direction hd1, wherein each row of memory openings 49 of the rows of memory openings 49 vertically extends through each insulating layer 32 within the alternating stack {32, (41, 43, 46)} and one electrically conductive strip 46 for each of the composite layers (41, 43, 46); and rows of memory opening fill structures 58 located within the rows of memory openings 49, wherein each of the memory opening fill structures 58 comprises a vertical stack of memory elements (e.g., comprising as portions of a memory material layer 54 located adjacent to electrically conductive word line strips 46) and a vertical semiconductor channel 60.

In one embodiment, the semiconductor structure comprises a staircase region 300 in which the alternating stack {32, (41, 43, 46)} comprises stepped surfaces, and lateral extents of the composite layers (41, 43, 46) along the first horizontal direction hd1 decrease with a vertical distance from the substrate (9, 10).

In one embodiment, a set of all electrically conductive word line strips 46 located within each composite layer (41, 43, 46) has a same lateral extent along the first horizontal direction hd1 as and contacts a top surface of a respective underlying insulating layer 32 within the alternating stack {32, (41, 43, 46)}. In one embodiment, a set of all dielectric isolation strips 41 located within each composite layer (41, 43, 46) has a same lateral extent along the first horizontal direction hd1 as, and contacts a top surface of, a respective underlying insulating layer 32 within the alternating stack {32, (41, 43, 46)}.

In one embodiment, the semiconductor structure comprises a stepped dielectric material portion 65 contacting, and overlying, the stepped surfaces of the alternating stack {32, (41, 43, 46)}. In one embodiment, the semiconductor structure comprises contact via structures 86 vertically extending through the stepped dielectric material portion 65 and contacting a top surface of a respective one of the electrically conductive word line strips 46 within the alternating stack {32, (41, 43, 46)}. In one embodiment, the stepped dielectric material portion 65 contacts each of the electrically conductive word line strips 46 and each of the dielectric isolation strips 41 within the alternating stack {32, (41, 43, 46)}.

In one embodiment, the alternating stack {32, (41, 43, 46)} and the memory opening fill structures 58 are located in a memory die 1000. A logic die 700 is bonded to the memory die 1000. A source layer 18 contacts end portions of the vertical semiconductor channels 60, wherein the alternating stack {32, (41, 43, 46)} is located between the source layer 19 and the logic die 700.

In one embodiment, for each of the composite layers (41, 43, 46), each of the respective plurality of electrically conductive word line strips 46 and each of the plurality of dielectric isolation strips 41 in each of the of composite layers comprise a respective sidewall segment that is located within a same vertical plane that is perpendicular to the first horizontal direction hd1.

In one embodiment, each of the dielectric isolation strips 41 comprises a respective pair of contoured lengthwise sidewalls that generally extend along the first horizontal direction hd1 and have a lateral undulation along the second horizontal direction hd2. In one embodiment, each contoured lengthwise sidewall of the dielectric isolation strips 41 comprises a set of concave sidewall segments that are arranged along the first horizontal direction hd1, adjoined to each other, have a concave profile in a horizontal cross-sectional view, and extend vertically along the vertical direction. In one embodiment, each concave sidewall segment of the dielectric isolation strips 41 is equidistant from a vertical plane including a sidewall of a most proximate memory opening 49 of the rows of memory openings 49. In one embodiment, for each set of dielectric isolation strips 41 located in different composite layers (41, 43, 46) and having an areal overlap with each other, portions of the contoured lengthwise sidewalls of the dielectric isolation strips 41 that are located within the memory array region 100 are vertically coincident with each other.

In one embodiment, the insulating layers 32 comprise silicon oxide; and each of the dielectric isolation strips 41 comprises silicon nitride strip which is located between two silicon oxide strips 43. In one embodiment, the silicon oxide strips 43 include nitrogen atoms as a dopant; and an atomic concentration of the nitrogen atoms decreases with a distance from an interface with a respective silicon nitride strip 41.

In one embodiment, each of the memory opening fill structures 58 comprises a memory film 50 including a tunneling dielectric layer 56 that contacts the vertical semiconductor channel 60, a charge storage layer 54 comprising the vertical stack of memory elements located at levels of the electrically conductive word line strips 46, and a blocking dielectric layer 52 that surrounds the charge storage layer 54.

The various embodiments of the present disclosure can be employed to provide self-aligned isolation structures that provide electrical isolation between laterally adjacent electrically conductive word line strips 46 that function as word lines in a three-dimensional memory array. The word line strips 46 may be formed through the memory openings 49. Therefore, a wide backside trench used in the prior are to provide access for word line metal reactants to the recesses between the insulating layers 32 is not required. This reduces the device dimensions and thus reduces the cost of the device per unit substrate area as well as reduced the process cost. This also reduces the chance that the memory openings 49 will overlap with the backside trench, since the dielectric isolation strips 41 are self-aligned to the memory openings 49. Furthermore, dedicated select gate electrode isolation structures which laterally isolate neighboring select gate electrodes may also be omitted, which simplifies and reduces the cost of the fabrication process. Finally, if tungsten word line strips 46 are formed using a fluorine containing reactant (e.g., tungsten hexafluoride), then fluorine may be outgassed through the memory openings without damaging the memory opening fill structures 58. Finally lateral variations in blocking dielectric layer 52 may be avoided or reduced.

Figure 22B:
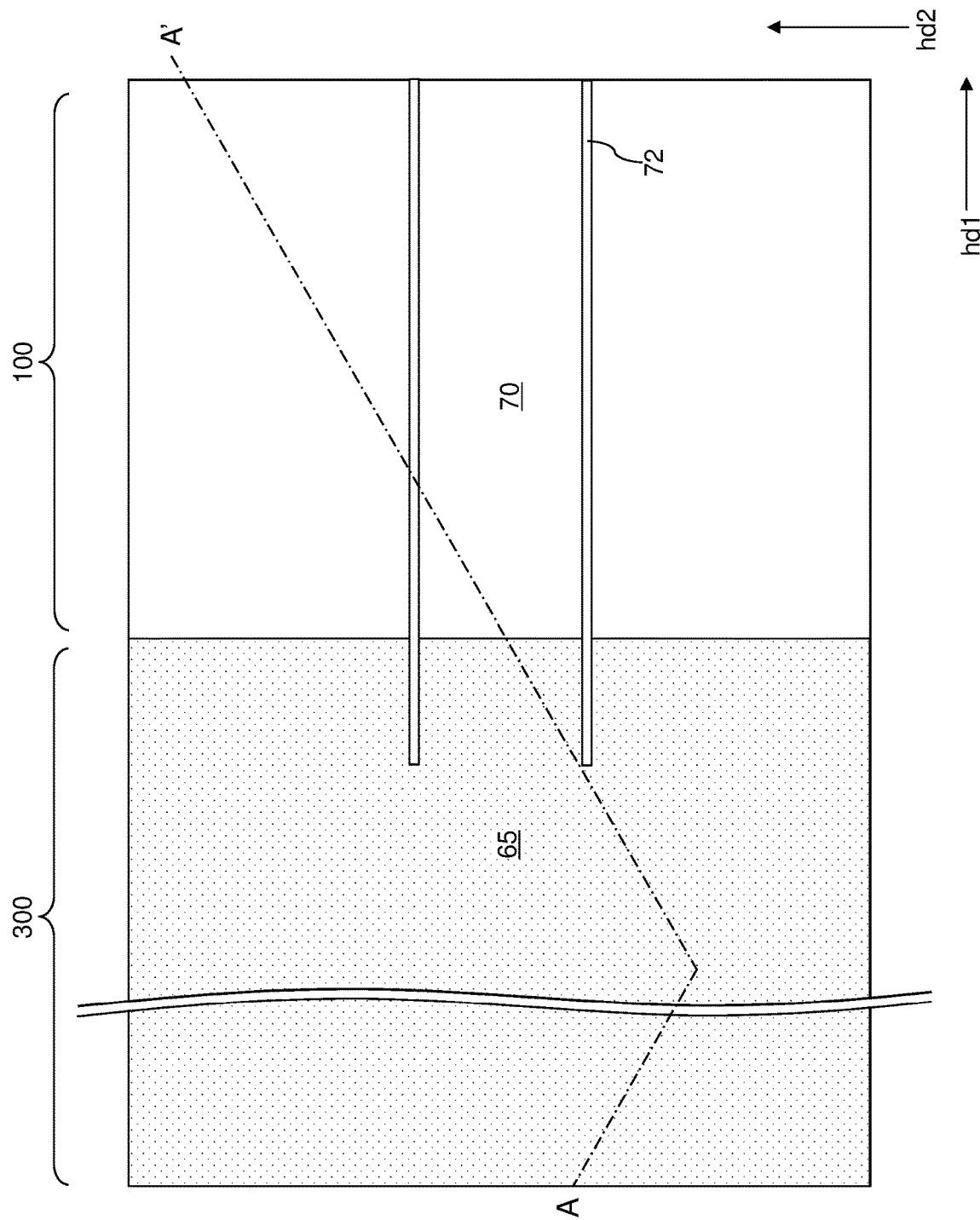
FIG. 22B is a top-down view of the second exemplary structure of FIG. 22A. The vertical plane A-A' is the plane of the cross-section for FIG. 22A.

Referring to FIGS. 22A and 22B, a second exemplary structure according to an embodiment of the present disclosure is illustrated. The second exemplary structure may be derived from the first exemplary structure illustrated in FIG. 3 by replacing the sacrificial material layers 42 with spacer material layers 142. The spacer material layers 142 may comprise any material that can be removed selective to the materials of the insulating layers 32 and the stepped dielectric material portion 65. The spacer material layers 142 may have the same thickness range as the sacrificial material layers 42. In one embodiment, the spacer material layers 142 may comprise and/or may consist essentially of silicon nitride, silicon oxynitride, silicon (e.g., polysilicon or amorphous silicon) or silicon-germanium. In one embodiment, the spacer material layers 142 may consist essentially of silicon nitride.

Generally, an alternating stack (32, 142) of insulating layers 32 and spacer material layers 142 can be formed over a substrate (9, 10). Stepped surfaces can be formed on the alternating stack (32, 142) by patterning the alternating stack (32, 142). Lateral extents of the spacer material layers 142 along a first horizontal direction hd1 decrease with an upward vertical distance from a horizontal plane including a bottommost surface of the alternating stack (32, 142). A stepped dielectric material portion 65 can be formed over the stepped surfaces of the alternating stack (32, 142). The stepped dielectric material portion 65 overlies and is in contact with the stepped surfaces of the alternating stack (32, 142). Drain select level isolation structures 72 can be formed through at least a topmost spacer material layer 142 within the alternating stack (32, 142).

Figure 23A:
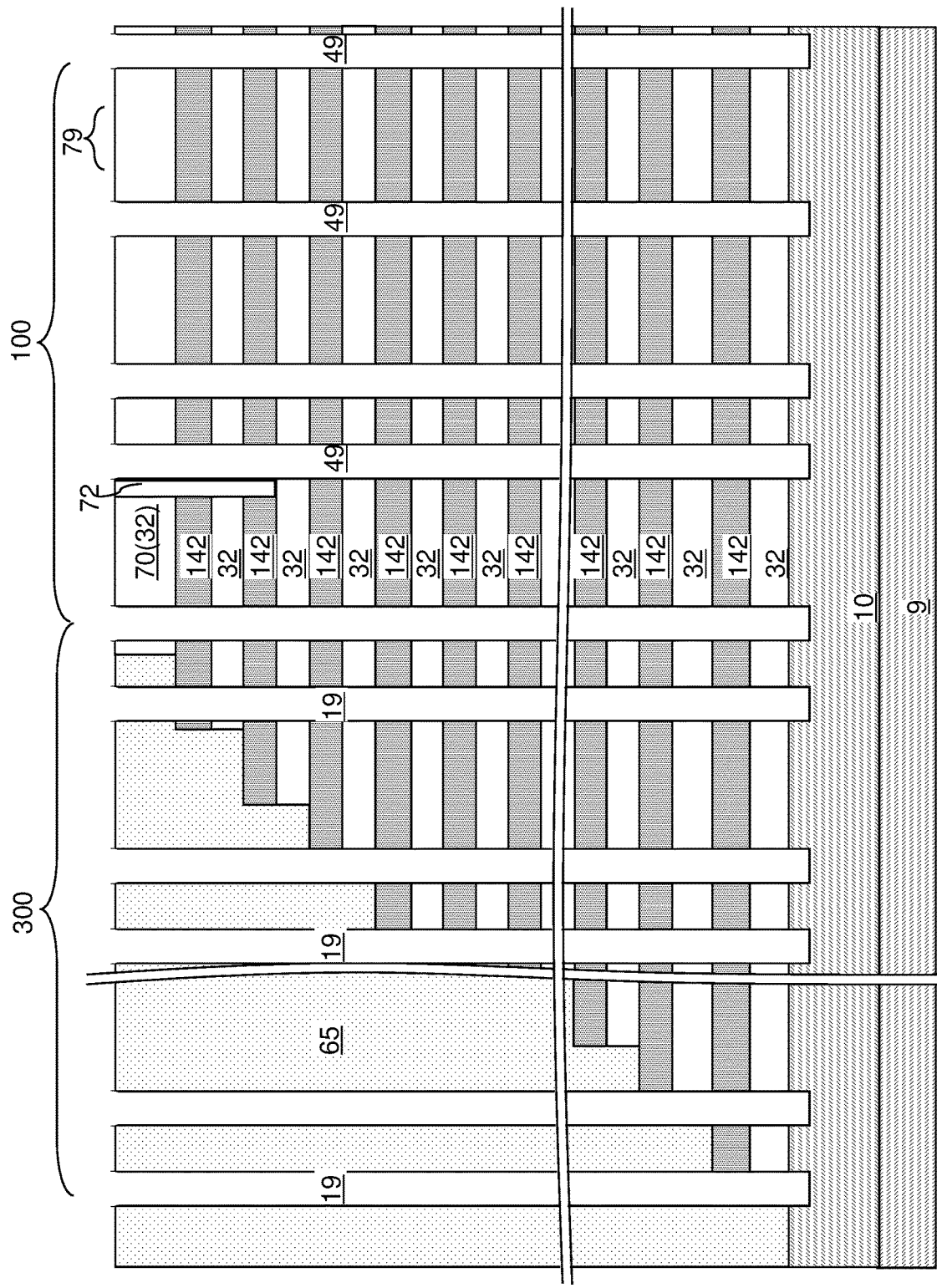
FIG. 23A is a vertical cross-sectional view of the second exemplary structure after formation of memory openings, support openings, and isolation trenches according to an embodiment of the present disclosure.
Figure 23B:
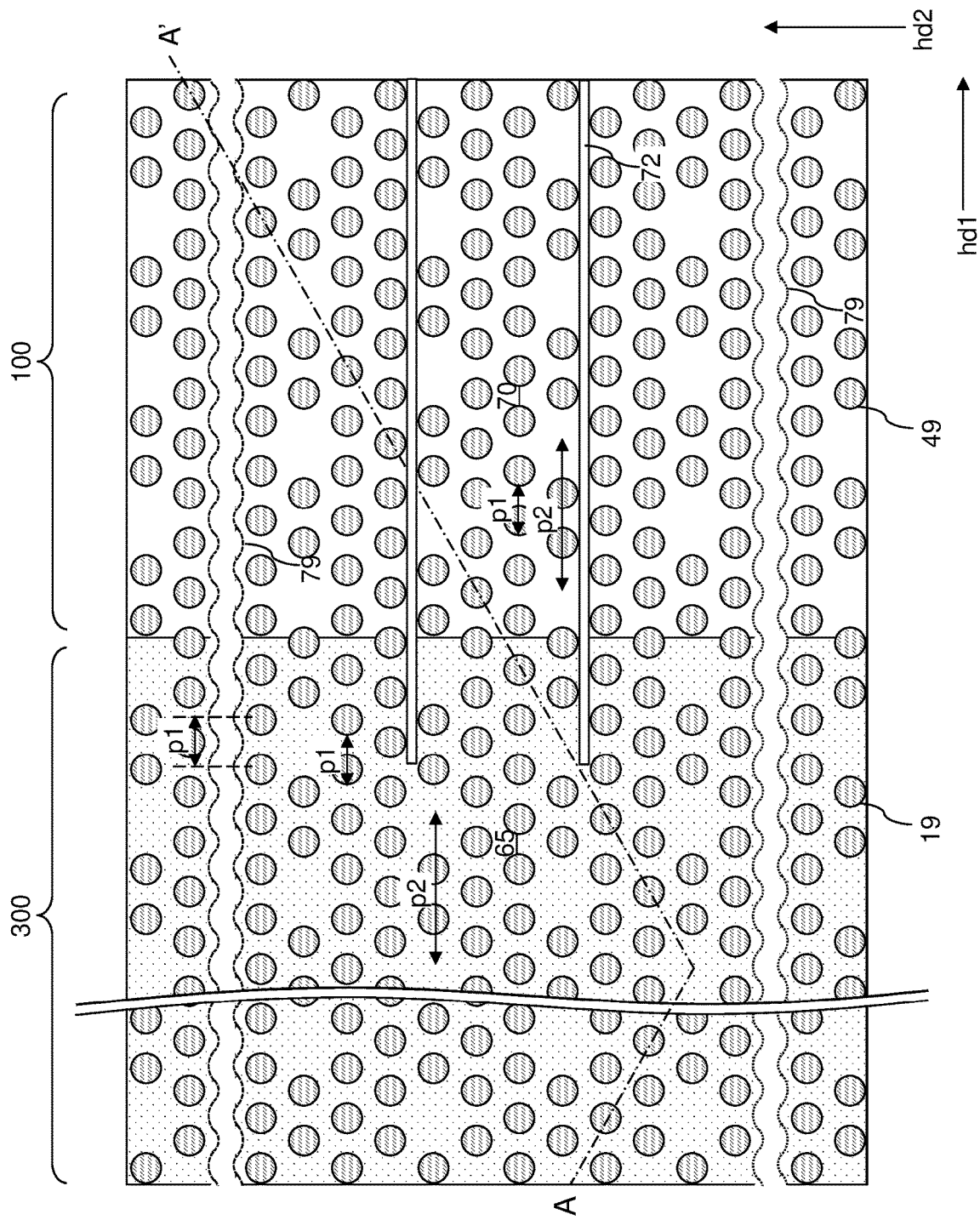
FIG. 23B is a top-down view of the second exemplary structure of FIG. 23A. The vertical plane A-A' is the plane of the cross-section for FIG. 23A.
Figure 24A:
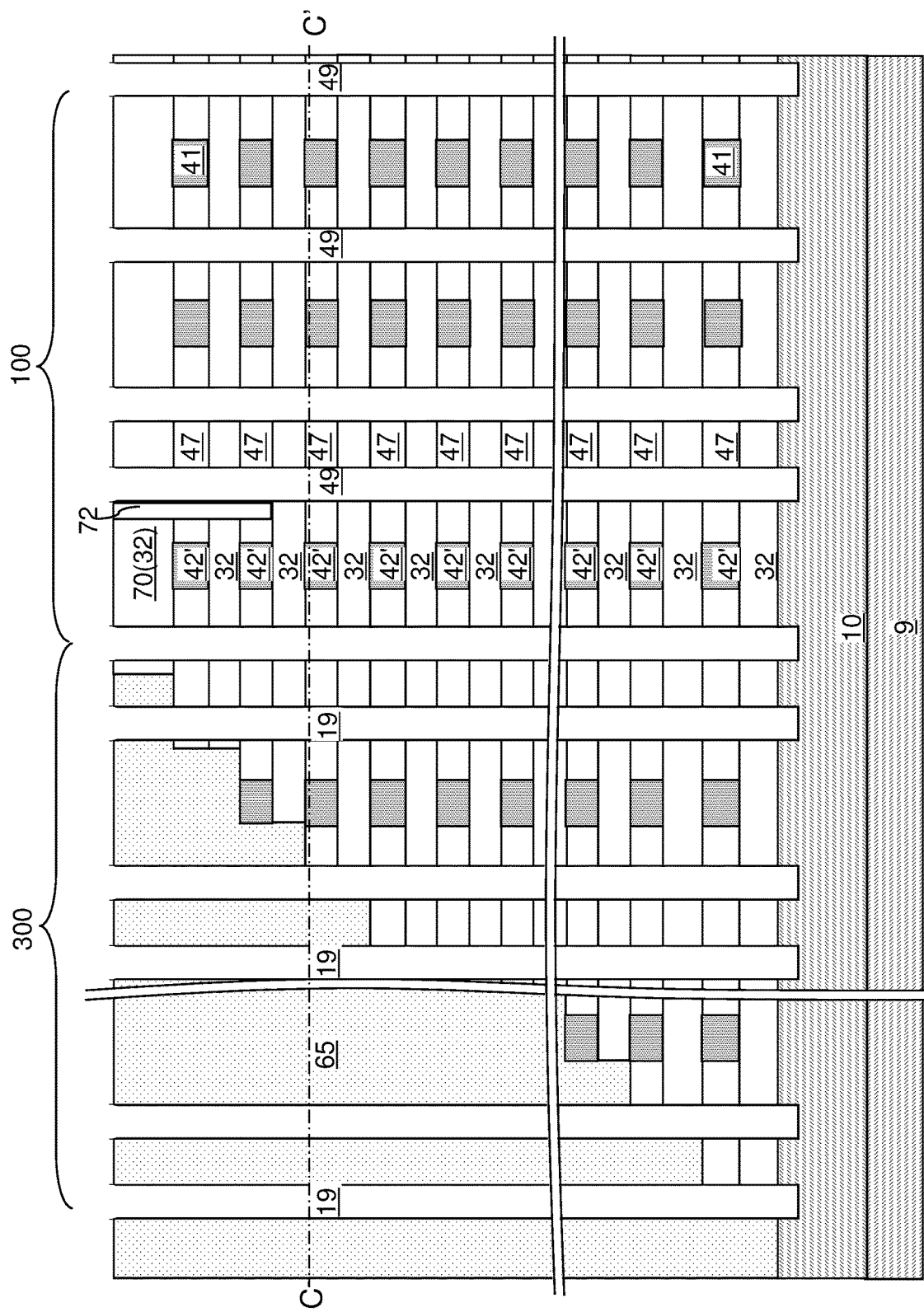
FIG. 24A is a vertical cross-sectional view of the second exemplary structure after formation of laterally-extending cavities and spacer plate cores according to an embodiment of the present disclosure.
Figure 24B:
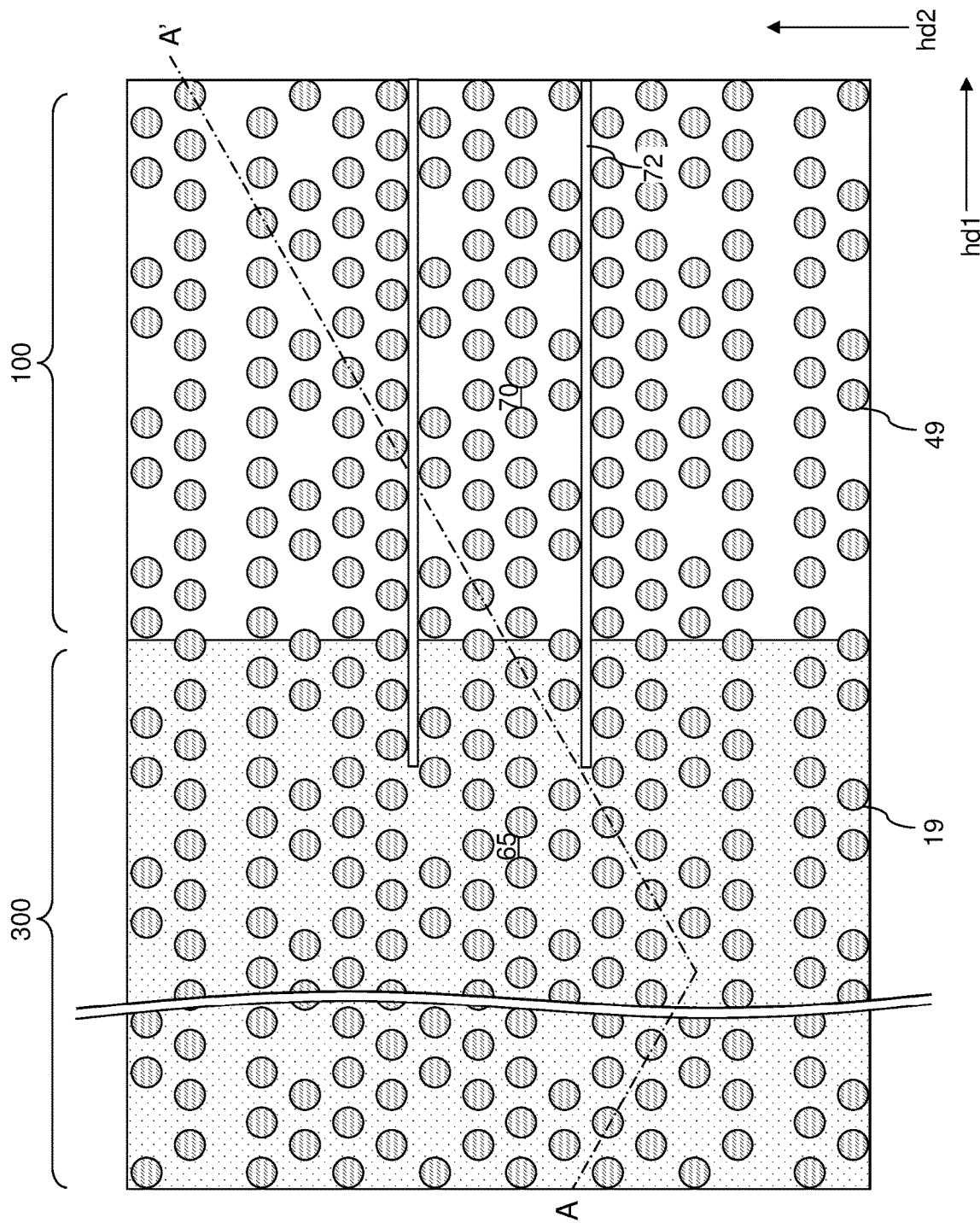
FIG. 24B is a top-down view of the second exemplary structure of FIG. 24A. The vertical plane A-A' is the plane of the cross-section for FIG. 24A.
Figure 24C:
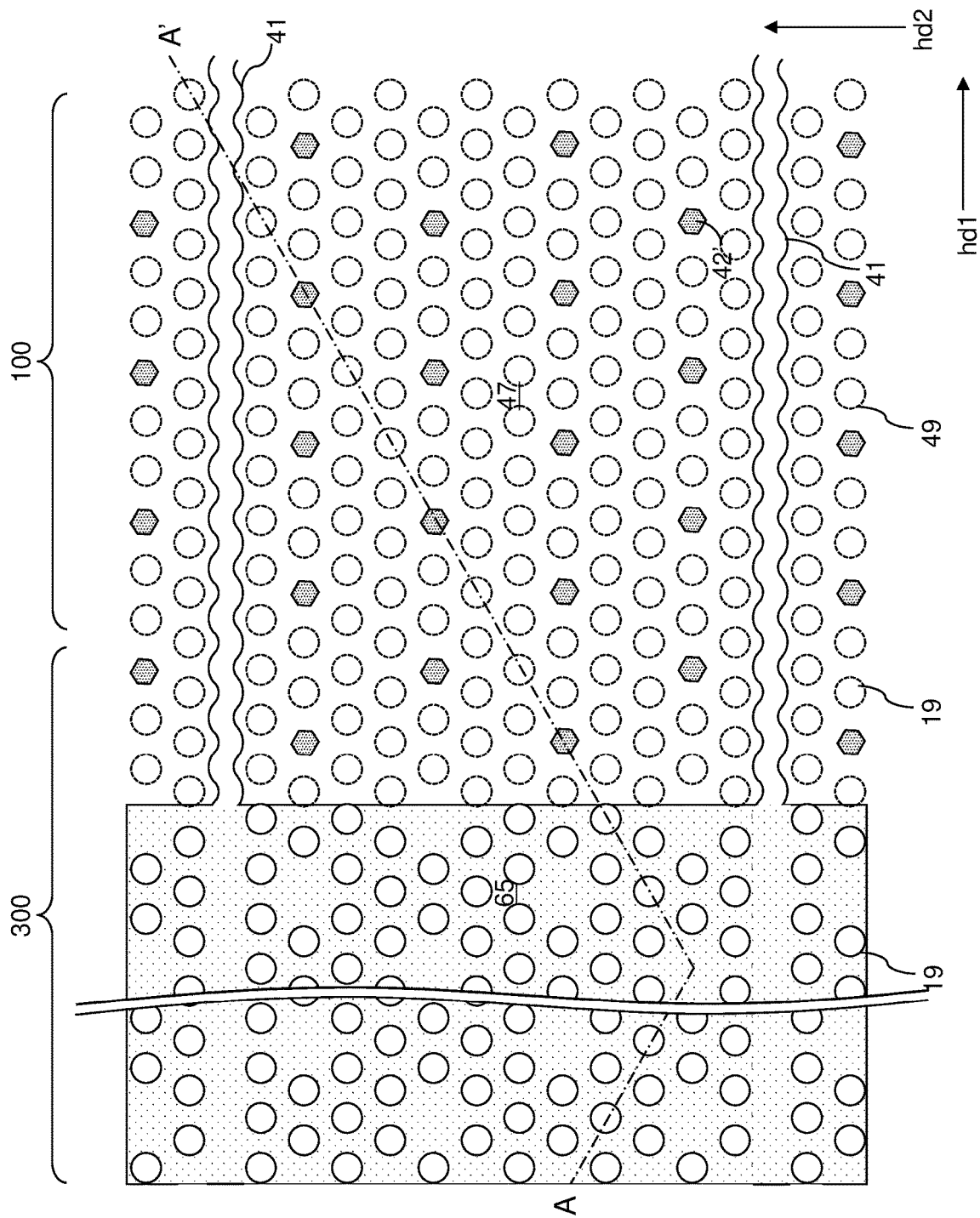
FIG. 24C is a horizontal cross-sectional view of the second exemplary structure along the horizontal plane C-C' of FIG. 24A.
Figure 24D:
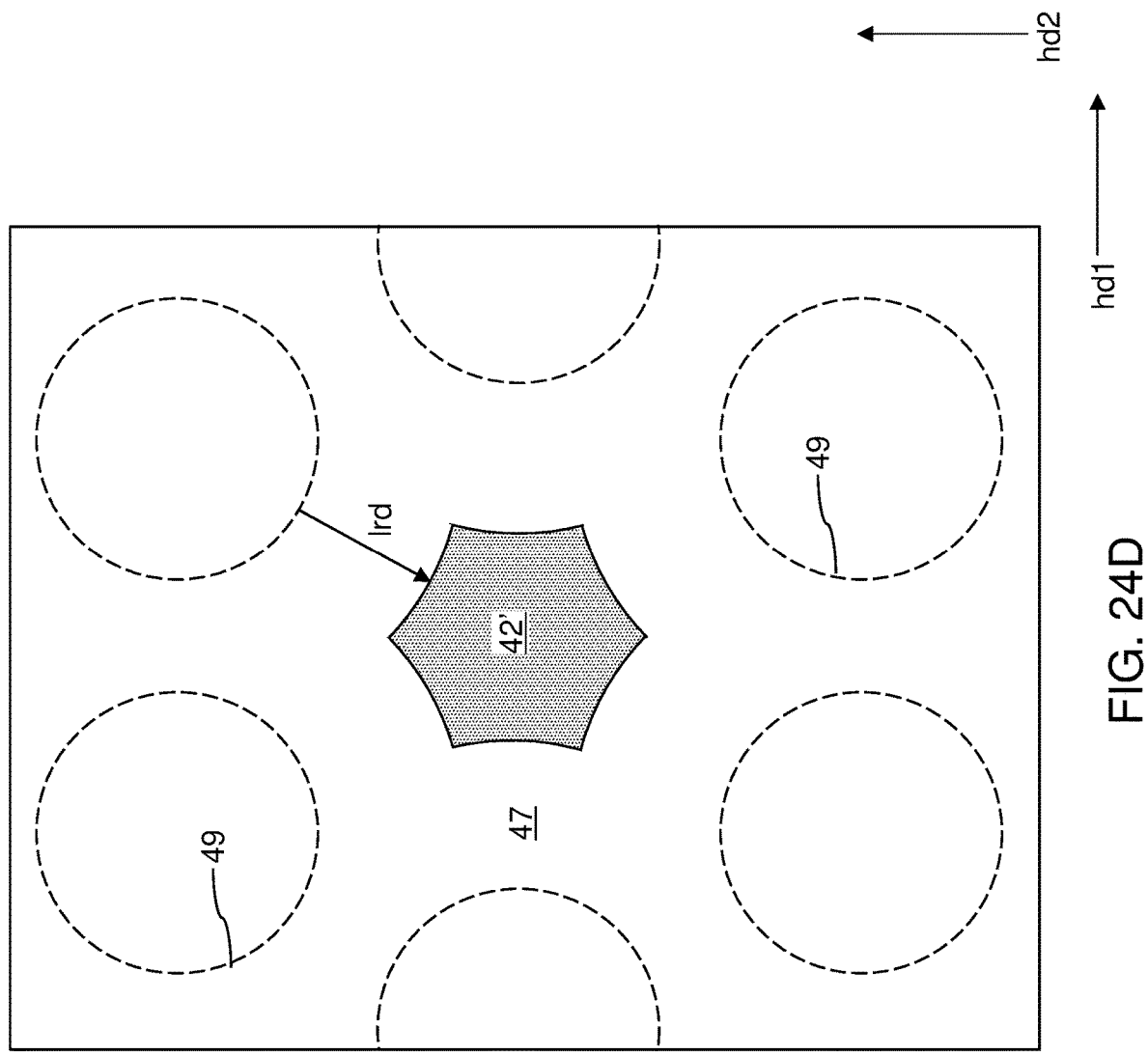
FIG. 24D is a magnified view of a region in FIG. 24C.
Figure 25A:
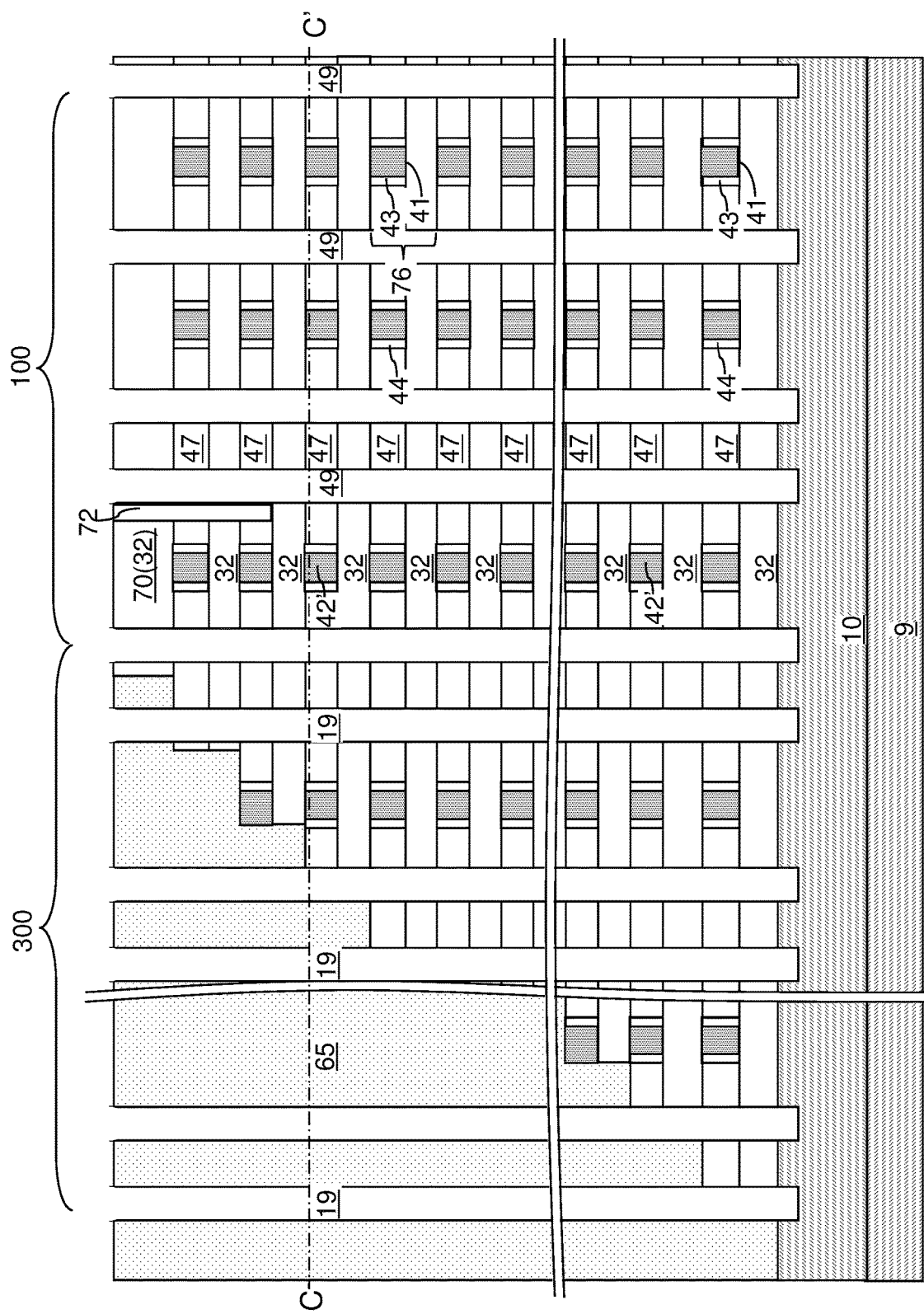
FIG. 25A is a vertical cross-sectional view of the second exemplary structure after formation of silicon oxide liners according to an embodiment of the present disclosure.
Figure 25B:
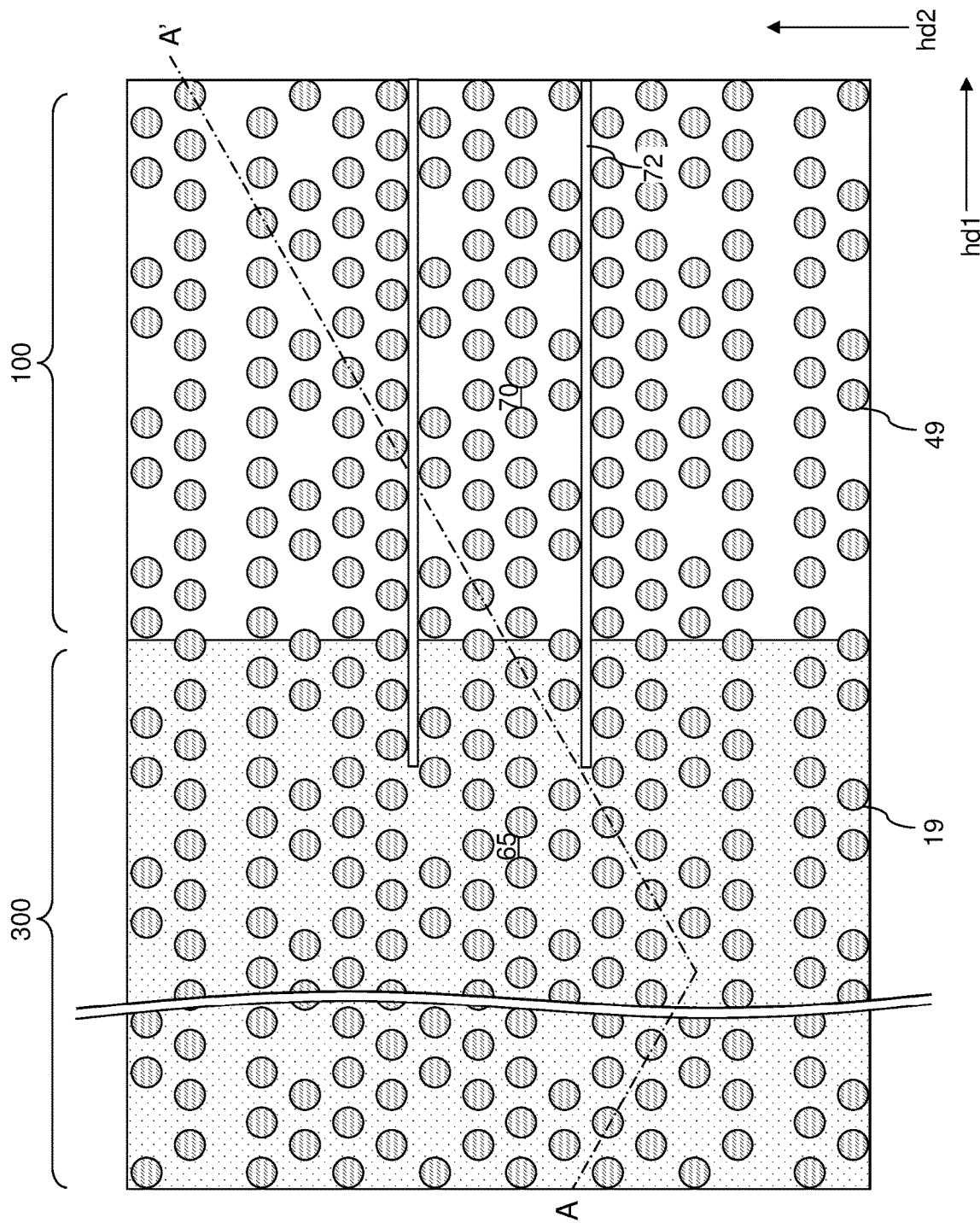
FIG. 25B is a top-down view of the second exemplary structure of FIG. 25A. The vertical plane A-A' is the plane of the cross-section for FIG. 25A.
Figure 25C:
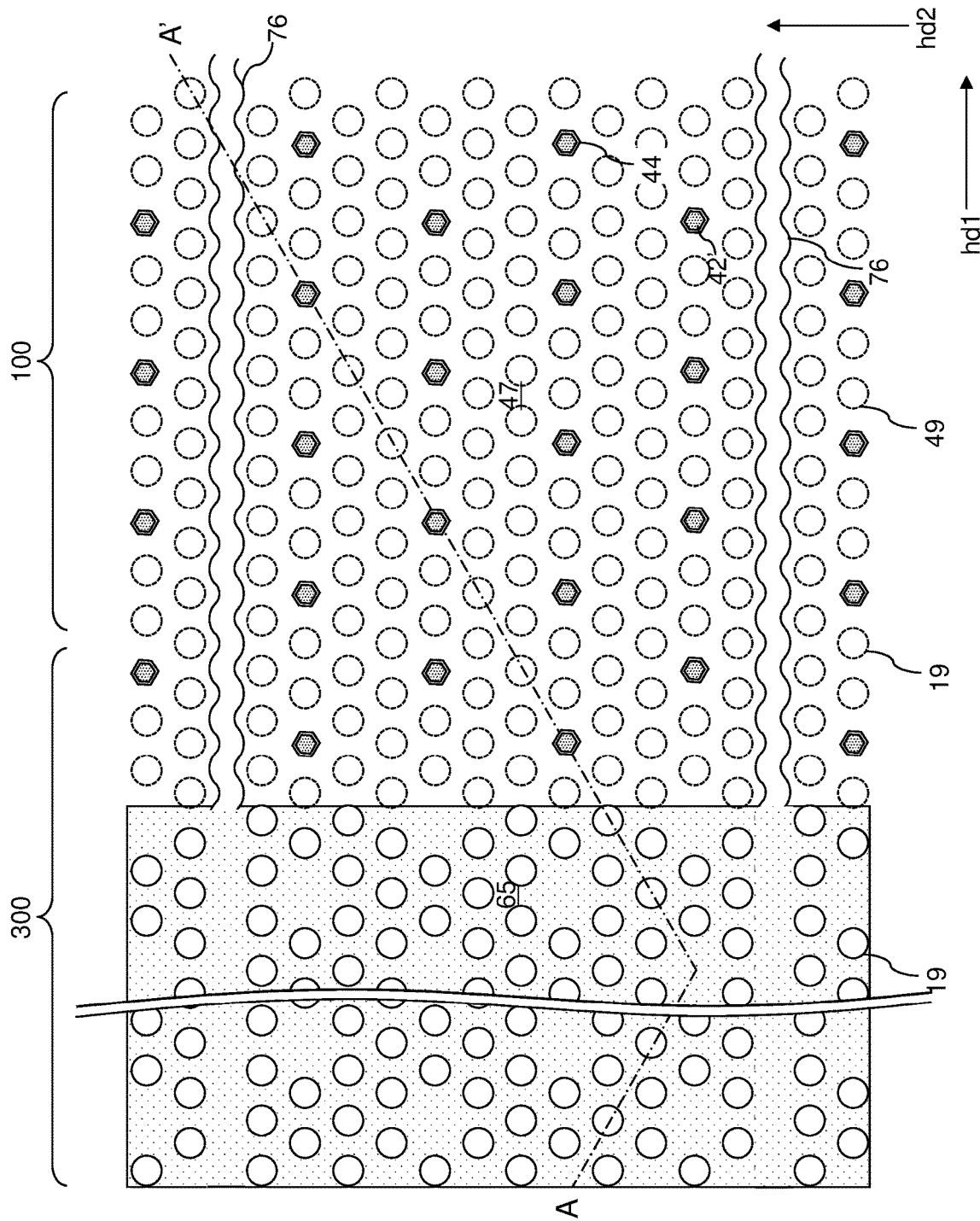
FIG. 25C is a horizontal cross-sectional view of the second exemplary structure along the horizontal plane C-C' of FIG. 25A.
Figure 25D:
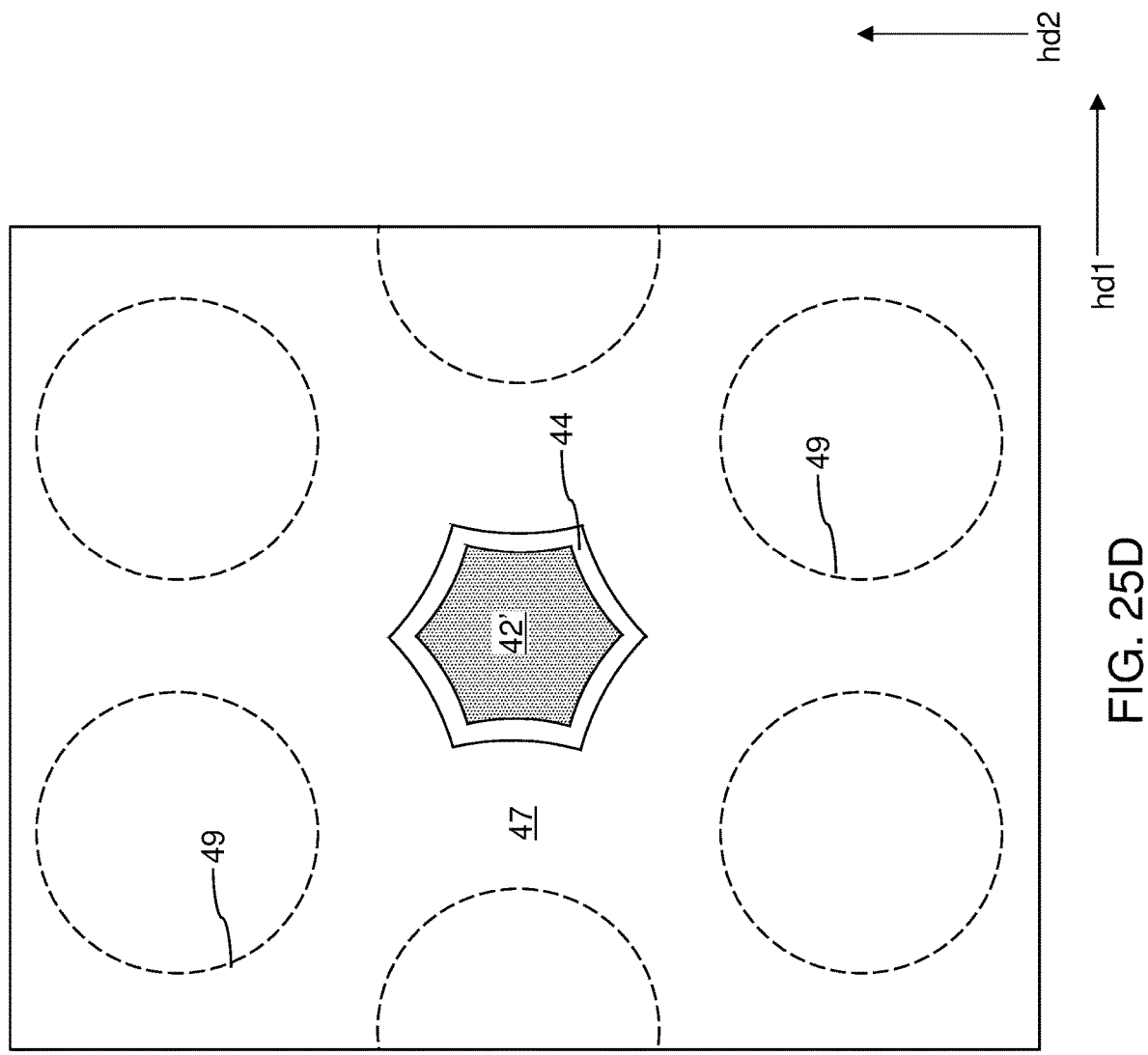
FIG. 25D is a magnified view of a region in FIG. 25C.
Figure 26A:
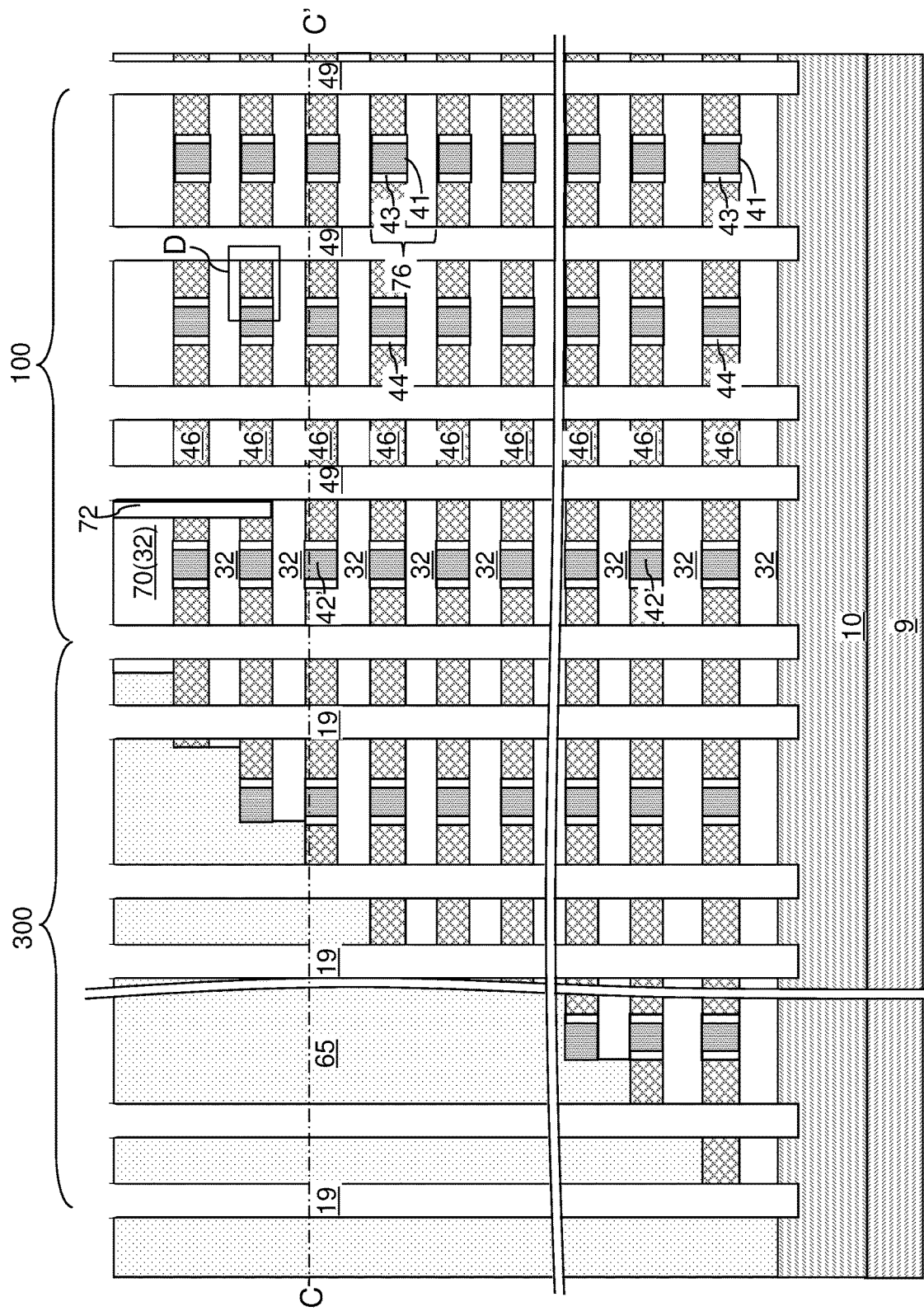
FIG. 26A is a vertical cross-sectional view of the second exemplary structure after formation of electrically conductive layers according to an embodiment of the present disclosure.
Figure 26B:
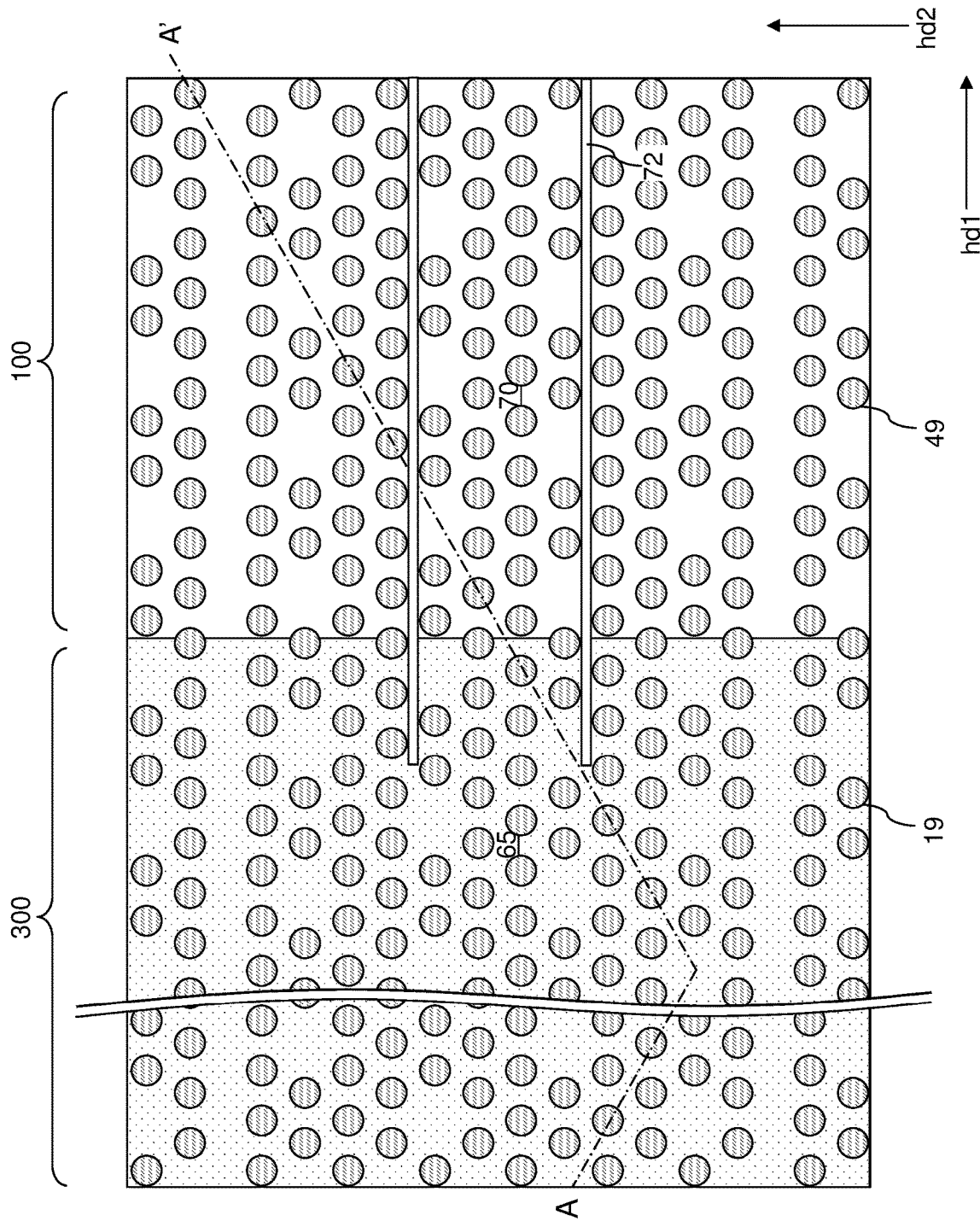
FIG. 26B is a top-down view of the second exemplary structure of FIG. 26A. The vertical plane A-A' is the plane of the cross-section for FIG. 26A.
Figure 26C:
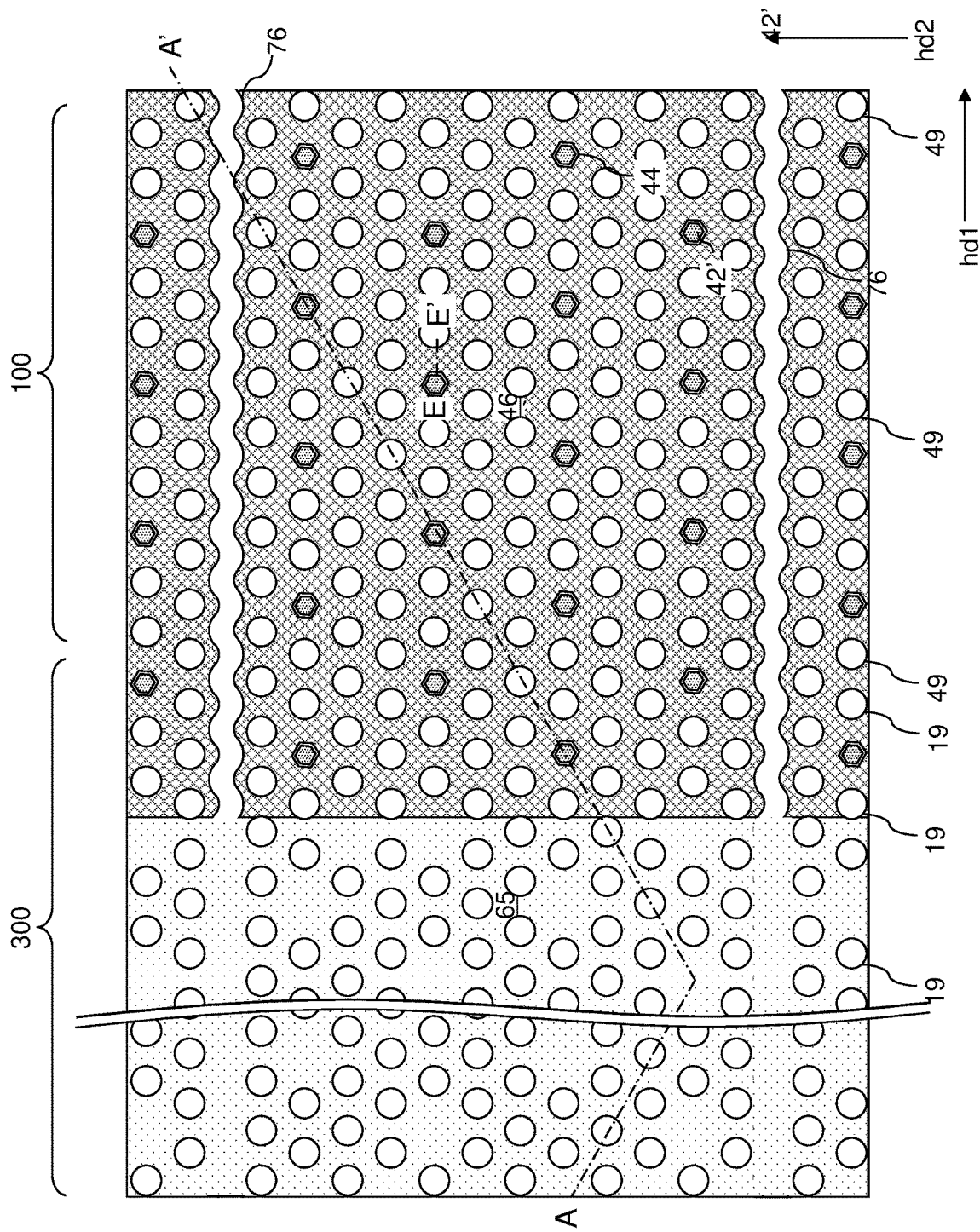
FIG. 26C is a horizontal cross-sectional view of the second exemplary structure along the horizontal plane C-C' of FIG. 26A.
Figure 26D:
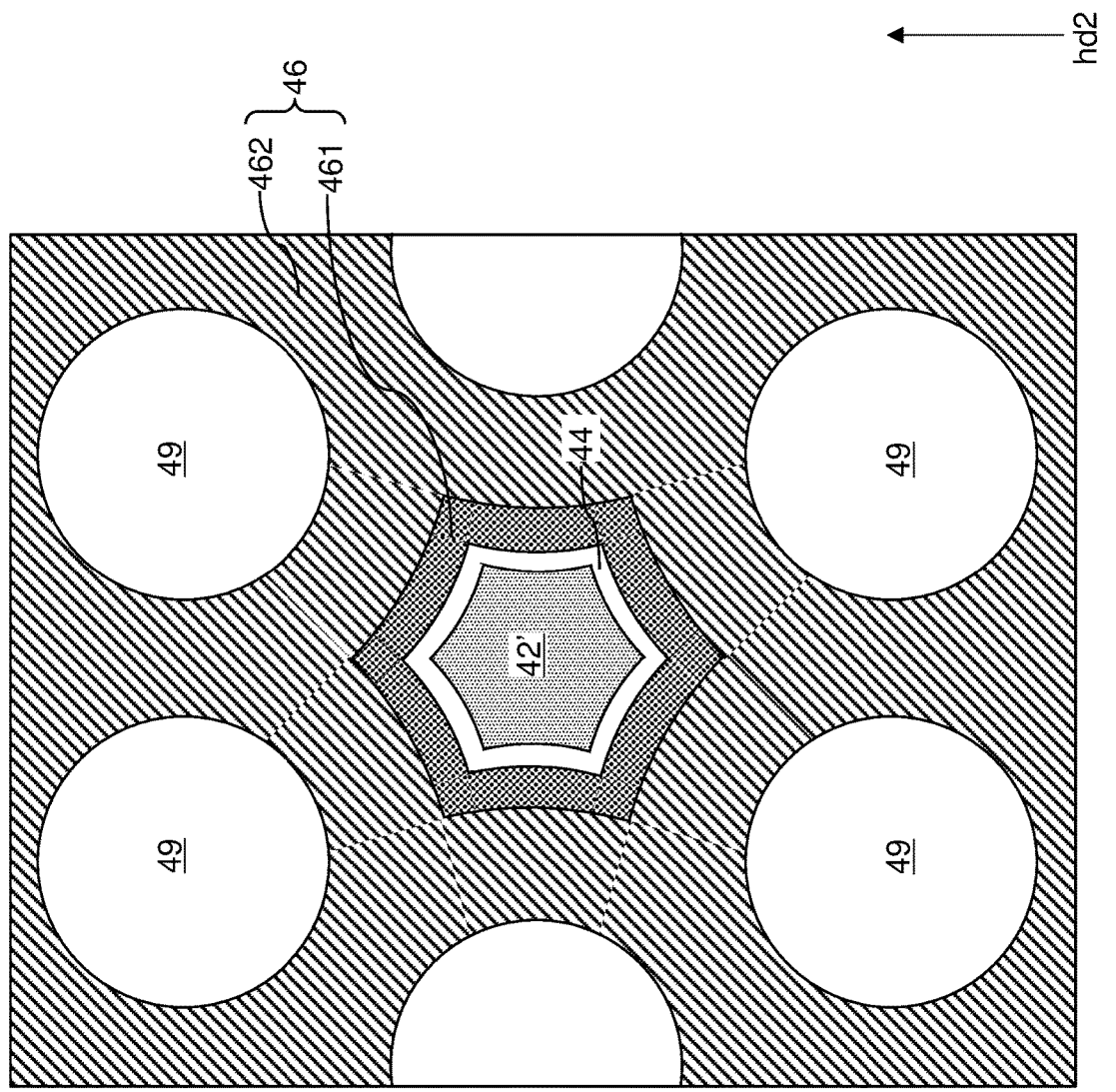
FIG. 26D is a magnified view of a region in FIG. 26C.
Figure 26E:
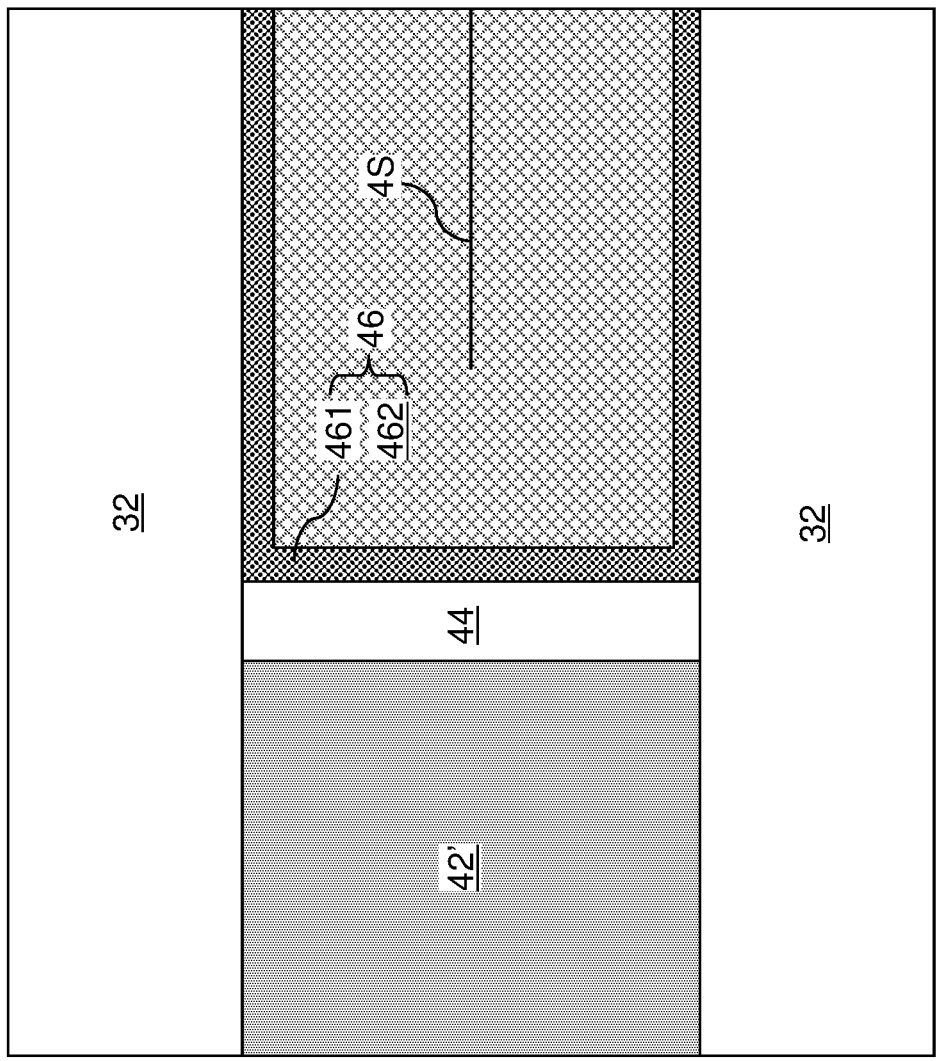
FIG. 26E is a magnified vertical cross-sectional view along the vertical plane E-E' of FIG. 26B.

Referring to FIGS. 23A and 23B, a lithographic material stack (not shown) including at least a photoresist layer can be formed over the insulating cap layer 70 and the stepped dielectric material portion 65, and can be lithographically patterned to form openings therein. The openings include a first set of discrete openings formed over the memory array region 100, and a second set of discrete openings formed over the staircase region 300, and a set of elongated openings that generally extend along a first horizontal direction hd1 and having lateral undulations along a second horizontal direction hd1. The first horizontal direction hd1 can be perpendicular to a boundary between the memory array region 100 and the staircase (e.g., contact) region 300.

The pattern in the lithographic material stack can be transferred through the insulating cap layer 70 or the stepped dielectric material portion 65, and through the alternating stack (32, 142) by at least one anisotropic etch that uses the patterned lithographic material stack as an etch mask. Portions of the alternating stack (32, 142) underlying the openings in the patterned lithographic material stack are etched to form memory openings 49 and support openings 19. The memory openings 49 are formed through the insulating cap layer 70 and the entirety of the alternating stack (32, 142) in the memory array region 100. The support openings 19 are formed through the stepped dielectric material portion 65 and the portion of the alternating stack (32, 142) that underlie the stepped surfaces in the staircase region 300.

The chemistry of the anisotropic etch process used to etch through the materials of the alternating stack (32, 142) can alternate to optimize etching of the first and second materials in the alternating stack (32, 142). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

According to an aspect of the present disclosure, a two-dimensional array of memory openings 49 can be formed through the alternating stack (32, 142) between isolation strip areas 79 in the memory array region 100. The isolation strip areas 79 will subsequently be filled with isolation strips each comprising a combination of the dielectric isolation strip 41 and the silicon oxide isolation strip 43 that are described above with respect to the first embodiment. While two drain select level isolation structures 72 are located between the adjacent isolation strip areas 79, it should be noted that one, three, four or more than four drain select level isolation structures 72 may be located between the adjacent isolation strip areas 79.

The memory openings 49 within each two-dimensional array of memory openings 49 may be formed at a first subset of sites of a respective two-dimensional periodic array in a plan view, such as the top-down view shown in FIG. 23A. As used herein, a "plan view" refers to a view along a vertical direction. The first subset can be less than an entirety of the sites of the respective two-dimensional periodic array, and the memory openings 49 are not present at a second subset of the sites of the respective two-dimensional periodic array that is a complement of the first subset. In one embodiment, the two-dimensional periodic array may be a first hexagonal close packed periodic array having a first pitch p1 along a first horizontal direction hd1. The array sites are located at the vertices of a hexagon and at the center of the hexagon in the hexagonal close packed periodic array. The second subset of the sites of the two-dimensional periodic array constitutes a periodic array having a second pitch p2 along the first horizontal direction hd1. The ratio of the second pitch p2 to the first pitch p1 may be an integer greater than 1, such as 2, 3, 4, 5, etc.

The memory openings 49 may be arranged as rows that laterally extend along the first horizontal direction hd1. The second subset of the sites of the respective two-dimensional periodic array may be located only within a subset of the rows of memory openings 49 that are laterally spaced apart along the second horizontal direction hd2. In one embodiment, only every N-th row of memory openings 49 may contain the second subset of the sites of the respective two-dimensional periodic array at which memory openings 49 are not formed. N can be an integer in a range from 2 to 4. In this case, every N-th row of memory openings 49 may include sites from which memory openings 49 are omitted, while all other rows of memory openings 49 may include a respective one-dimensional periodic array of memory openings 49 arranged along the first horizontal direction hd1 with the first pitch p1. In one embodiment, a ratio of a total number of first hexagonal sites of a two-dimensional hexagonal array occupied by memory openings 49 to a total number of second hexagonal sites of the two-dimensional hexagonal array from which the memory openings 49 are missing may be the product of N and the ratio of the second pitch p2 to the first pitch p1, and may be in a range from 4 to 16. Each N-th row of memory openings 49 may include every M-th site from which a memory opening 49 is omitted. In the example shown in FIG. 23B, M=3. However, M may be any integer greater than 1, such as 2, 4, 5, etc.

The support openings 19 are formed through the stepped dielectric material portion 65 and portions of the alternating stack (32, 142) that underlie the stepped dielectric material portion 65 in the staircase region 300. In one embodiment, a two-dimensional array of support openings 19 can be formed through the alternating stack (32, 142) in the staircase region 300. The support openings 19 within each two-dimensional array of support openings 19 may be formed at a first subset of sites of a respective two-dimensional periodic array in a plan view, such as the top-down view shown in FIG. 23B. The first subset can be less than an entirety of the sites of the respective two-dimensional periodic array, and the support openings 19 are not present at a second subset of the sites of the respective two-dimensional periodic array that is a complement of the first subset. In one embodiment, the two-dimensional periodic array may be a first hexagonal periodic array having a first pitch p1 along a first horizontal direction hd1. The second subset of the sites of the two-dimensional periodic array constitutes a periodic array having a second pitch p2 along the first horizontal direction hd1. The ratio of the second pitch p2 to the first pitch p1 may be an integer greater than 1, such as 2, 3, 4, 5, etc.

The support openings 19 may be arranged as rows that laterally extend along the first horizontal direction hd1. The second subset of the sites of the respective two-dimensional periodic array may be located only within a subset of the rows of support openings 19 that are laterally spaced apart among one another along the second horizontal direction hd2. In one embodiment, only every N-th row of support openings 19 may contain the second subset of the sites of the respective two-dimensional periodic array at which support openings 19 are not formed. N can be an integer in a range from 2 to 4. In this case, every N-th row of support openings 19 may include sites from which support openings 19 are omitted, while all other rows of support openings 19 may include a respective one-dimensional periodic array of support openings 19 arranged along the first horizontal direction hd1 with the first pitch p1. In one embodiment, a ratio of a total number of first hexagonal sites of a two-dimensional hexagonal array occupied by support openings 19 to a total number of second hexagonal sites of the two-dimensional hexagonal array from which the support openings 19 are missing may be the product of N and the ratio of the second pitch p2 to the first pitch p1, and may be in a range from 4 to 16. Each N-th row of the support openings 19 may include every M-th site from which a support opening 49 is omitted. In the example shown in FIG. 23B, M=3. However, M may be any integer greater than 1, such as 2, 4, 5, etc.

Referring to FIGS. 24A-24D, an isotropic etch process can be performed by introducing an isotropic etchant that etches the material of the spacer material layers 142 selective to the material of the insulating layers 32 and the semiconductor material layer 10 into the memory openings 49 and the support openings 19. In other words, the isotropic etch process etches the material of the spacer material layers 142 at an etch rate that is at least twice the etch rate of the material of the insulating layers 32, and is at least twice the etch rate of the semiconductor material layer 10. In one embodiment, the ratio of the etch rate of the material of the spacer material layers 142 to the etch rate of the material of the insulating layers 32 during the isotropic etch process may be at least two, and/or at least 10, and/or at least 100, and/or at least 1,000. In one embodiment, the ratio of the etch rate of the material of the spacer material layers 142 to the etch rate of the material of the semiconductor material layer 10 during the isotropic etch process may be at least two, and/or at least 10, and/or at least 100, and/or at least 1,000.

In an illustrative example, the semiconductor material layer 10 may comprise silicon, the insulating layers 32 may comprise and/or consist essentially of silicon oxide, and the spacer material layers 142 may comprise and/or consist essentially of silicon nitride. In this case, the isotropic etch process may comprise a wet etch process that etches silicon nitride selective to silicon oxide and silicon. In one embodiment, wet etch process may employ hot phosphoric acid as an isotropic etchant.

Laterally-extending cavities 47 can be formed in the volumes from which portions of the spacer material layers 142 are removed by the isotropic etch process. According to an aspect of the present disclosure, the duration of the isotropic etch process is selected such that portions of the spacer material layers 142 remain after the isotropic etch process at locations that are laterally spaced from the memory openings 49 and the support openings 19 by a lateral spacing that is greater than a lateral recess distance lrd (shown in FIG. 24D) of the isotropic etch process. Remaining portions of each of the spacer material layers 142 comprise a respective two-dimensional array of spacer plate cores 42' located between the neighboring isolation strip areas 79 and respective dielectric isolation strips 41 located in the isolation strip areas 79. The isolation strip areas 79 are areas that lack memory openings 49 and are located by a lateral distance greater than lrd from the nearest memory openings 49.

In one embodiment, a first two-dimensional array of memory openings 49 and a second two-dimensional array of support openings 19 can be formed through the alternating stack (32, 142) between each neighboring pair of dielectric isolation strips 41 located in the respective isolation strip areas 79 in the memory array region 100. The memory openings 49 within each two-dimensional array of memory openings 49 may be formed at a first subset of sites of a respective first two-dimensional periodic array in a plan view, and the support openings 19 within each two-dimensional array of support openings 19 may be formed at a first subset of sites of a respective second two-dimensional periodic array in the plan view as discussed above. The memory openings 49 are absent at a second subset of the sites of the respective first two-dimensional periodic array, and the support openings 19 are absent at a second subset of the sites of the respective second two-dimensional periodic array. The spacer plate cores 42' can be formed at the second subset of the sites of the respective first two-dimensional periodic array.

Each of the spacer plate cores 42' comprises a portion of a remaining material of a spacer material layer 142. As such, the spacer plate cores 42' are not embedded within the stepped dielectric material portion 65. The spacer plate cores 42', the dielectric isolation strips 41 and the stepped dielectric material portion 65 provide structural support to the insulating layers 32 upon formation of the laterally-extending cavities 47. The dielectric isolation strips 41 laterally separate adjacent memory block areas along the second horizontal direction hd2.

In one embodiment, set of all of the spacer plate cores 42' located between a neighboring pair of dielectric isolation strips 41 may comprise a two-dimensional array of spacer plate core 42' stacks. Each of the spacer plate core stacks comprises a vertical stack of a subset of the spacer plate cores 42' located at a respective one of the sites within a second subset of the sites of a two-dimensional periodic array of the memory openings 49 in the plan view. The spacer plate cores 42' located between a neighboring pair of isolation strips 41 may be arranged as a three-dimensional array of spacer plate cores 42'. In one embodiment, the spacer plate cores 42' may comprise and/or may consist essentially of silicon nitride.

In one embodiment, each of the spacer plate cores 42' may comprise a respective plurality of sidewalls that are equidistant from sidewalls of a respective neighboring plurality of memory openings 49. In one embodiment, the respective plurality of sidewalls of each of the spacer plate cores 42' comprises a respective set of horizontally concave and vertically straight sidewalls, i.e., sidewalls that having a respective concave profile in a horizontal cross-sectional view and having a respective straight profile in a vertical cross-sectional view. In one embodiment, the memory openings 49 have a respective circular horizontal cross-sectional shape, and at least one of the spacer plate cores 42' may be laterally surrounded by six neighboring memory openings 49. In this case, at least one of the spacer plate cores 42' may have a respective set of six horizontally concave and vertically straight sidewalls. The radius of curvature of each of the six horizontally-concave and vertically straight sidewalls in a horizontal cross-sectional view may be the same as the sum of the lateral recess distance lrd and the radius of each memory opening 49.

Referring to FIGS. 25A-25D, an oxidation process may be optionally performed. In case the oxidation process is performed, physically exposed surface portions of each spacer plate core 42' can be oxidized and can be converted into silicon oxide liners 44. Physically exposed surface portions of each dielectric isolation strip 41 can be oxidized and can be converted into silicon oxide isolation strips 43. In one embodiment, the spacer plate cores 42' comprise silicon nitride, and the silicon oxide liners 44 include nitrogen atoms at a variable atomic concentration that decreases with a lateral distance from an interface with a respective spacer plate core 42'. The lateral thickness of each silicon oxide liner 44 may be in a range from 3 nm to 8 nm, such as from 4 nm to 6 nm, although lesser and greater thicknesses may also be employed.

Each contiguous combination of a dielectric isolation strip 41 and a silicon oxide isolation strip 43 is herein referred to as an isolation strip 76. Each contiguous combination of a spacer plate core 42' and a silicon oxide liner 44 in case silicon oxide liners 44 are formed, or each spacer plate core 42' in case silicon oxide liners are not formed, is herein referred to as a spacer plate structure (42', 44). A three-dimensional array of spacer plate structures (42', 44) can be formed between a neighboring pair of isolation strips 76. In one embodiments, the spacer plate cores 42' comprise silicon nitride. In case each spacer plate structure (42', 44) comprises a silicon oxide liner 44, the silicon oxide liner 44 laterally surrounds a respective spacer plate core 42'.

In one embodiment, each of the spacer plate structures (42', 44) comprises a respective plurality of sidewalls that are equidistant from sidewalls of a respective neighboring plurality of memory openings 49. In one embodiment, the respective plurality of sidewalls of each of the spacer plate structures (42', 44) comprises a respective set of horizontally concave and vertically straight sidewalls. Generally, each of the spacer plate structures (42', 44) comprises a respective plurality of dielectric sidewalls, which may be dielectric sidewalls of a respective spacer plate core 42', or may be dielectric sidewalls of a silicon oxide liner 44.

Generally, a three-dimensional array of spacer plate structures (42', 44) can be provided in a memory block located between a neighboring pair of isolation strips 76. The three-dimensional array of spacer plate structures (42', 44) comprises a two-dimensional array of spacer plate structure stacks each containing a vertical stack of a respective subset of the spacer plate structures (42', 44). The spacer plate structures (42', 44) are located at the levels of the laterally-extending cavities 47.

Referring to FIGS. 26A-26E, at least one conductive material can be deposited in the laterally-extending cavities 47 by providing at least one reactant gas into the laterally-extending cavities 47 through the memory openings 49 and the support openings 19. An optional metallic barrier layer 461 can be deposited in the laterally-extending cavities 47 and in peripheral volumes of the memory openings 49, and the support openings 19. The metallic barrier layer 461 includes an electrically conductive metallic material that can function as a diffusion barrier layer and/or adhesion promotion layer for a metallic fill material to be subsequently deposited. The metallic barrier layer 461 can include a conductive metallic nitride material such as TiN, TaN, WN, MoN, or a stack thereof, and/or can include a conductive metallic carbide material such as TiC, TaC, WC, or a stack thereof. In one embodiment, the metallic barrier layer 461 can be deposited by a conformal deposition process such as chemical vapor deposition (CVD) or atomic layer deposition (ALD). The thickness of the metallic barrier layer 461 can be in a range from 2 nm to 8 nm, such as from 3 nm to 6 nm, although lesser and greater thicknesses can also be employed. In one embodiment, the metallic barrier layer 461 can consist essentially of a conductive metal nitride such as TiN.

A metal fill material is subsequently deposited in remaining volumes of the plurality of laterally-extending cavities 47, in additional peripheral volumes of the memory openings 49 and the support openings 19, and over the top surface of the insulating cap layer 70 to form a metallic fill material portion 462. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion 462 can consist essentially of at least one elemental metal. The at least one elemental metal of the metallic fill material portion 462 can be selected, for example, from tungsten, cobalt, ruthenium, molybdenum, titanium, or tantalum. In one embodiment, the metallic fill material portion 462 can consist essentially of a single elemental metal. In one embodiment, the metallic fill material portion 462 may comprise tungsten deposited employing a fluorine-containing precursor gas such as $WF_6$. In one embodiment, the metallic fill material portion 462 can be a tungsten layer including a residual level of fluorine atoms as impurities. The metallic fill material portion 462 is spaced from the insulating layers 32 and the memory stack structures 55 by the metallic barrier layer 461, which is a metallic barrier layer that blocks diffusion of fluorine atoms therethrough.

The plurality of laterally-extending cavities 47 can be filled with the metallic barrier layer 461 and the metallic fill material portion 462, and a continuous metallic material layer (not shown) can be formed in peripheral volumes of each memory opening 49 and each support opening 19 and over the insulating cap layer 70. An unfilled cavity may be present within each of the memory openings 49 and the support openings 19 after deposition of the metal fill material. An etch back process can be performed to remove the continuous metallic material layer from the peripheral volumes of the memory openings 49 and the support openings 19, and from above the insulating cap layer 70. The etch back process may comprise an isotropic etch process and/or an anisotropic etch process.

Each contiguous remaining portion of the metallic barrier layer 461 and the metallic fill material portion 462 that fills a respective laterally-extending cavity 47 constitutes an electrically conductive layer 46. Each electrically conductive layer 46 includes a portion of the metallic barrier layer 461 and a portion of the metallic fill material portion 462 that are located between a vertically neighboring pair of insulating layers 32. In one embodiment, each of the electrically conductive layers 46 may comprise first sidewalls that are vertically coincident with sidewalls of the insulating layers 32 around a respective one of the memory openings 49, second sidewalls that are vertically coincident with sidewalls of the insulating layers 32 around a respective one of the support openings 19, and third sidewalls that are vertically coincident with sidewalls of the insulating layers 32 around a respective one of the isolation strips 76. Vertically coincident sidewalls are located within a same vertical plane.

Generally, the electrically conductive layers 46 can be formed within the laterally-extending cavities 47 by supplying at least one reactant through the memory openings 49. Each of the electrically conductive layers 46 laterally surrounds a two-dimensional array of memory openings 49 located between a neighboring pair of isolation strips 76. An alternating stack of insulating layers 32 and electrically conductive layers 46 can be formed. The alternating stack (32, 46) comprises stepped surfaces such that lateral extents of the electrically conductive layers 46 along a first horizontal direction hd1 decrease with an upward vertical distance from a horizontal plane including a bottommost surface of the alternating stack (32, 46). A stepped dielectric material portion 65 overlies and is in contact with the stepped surfaces of the alternating stack (32, 46). The stepped dielectric material portion 65 does not encapsulate any of the spacer plate structures (42', 44).

At least one of the isolation strips 76 can have a laterally-undulating dielectric sidewall that generally extends along a first horizontal direction hd1, and can have a periodic lateral undulation along a second horizontal direction hd2 that is perpendicular to the first horizontal direction hd1. Each of the insulating layers 32 and the electrically conductive layers 46 in the alternating stack (32, 46) comprises a respective laterally-undulating sidewall that is in direct contact with the laterally-undulating dielectric sidewall of a respective isolation strip 76.

In one embodiment, each of the spacer plate structures (42', 44) can be in direct contact with and can have a same vertical thickness as a respective one of the electrically conductive layers 46. In one embodiment, each of the spacer plate structures (42', 44) comprises a respective plurality of dielectric sidewalls that are in direct contact with a respective electrically conductive layer 46. In one embodiment, each metallic fill material portion 462 of the electrically conductive layers 46 is not in direct contact with any of the spacer plate structures (42', 44) in a three-dimensional array of spacer plate structures (42', 44).

In one embodiment, the material portions located vertically between adjacent insulating layers may comprise composite layers (76, (42', 44), 46). Each of the composite layers comprises a respective plurality of electrically conductive word line strips 46 laterally extending along a first horizontal direction hd1, a plurality of isolation strips 76 laterally extending along the first horizontal direction 76 and spacer plate structures (42', 44) embedded in the electrically conductive word line strips 46. The combination of isolation strips 76 and the spacer plate structures (42', 44) comprise dielectric isolation structures (76, (42', 44)).

Figure 27A:
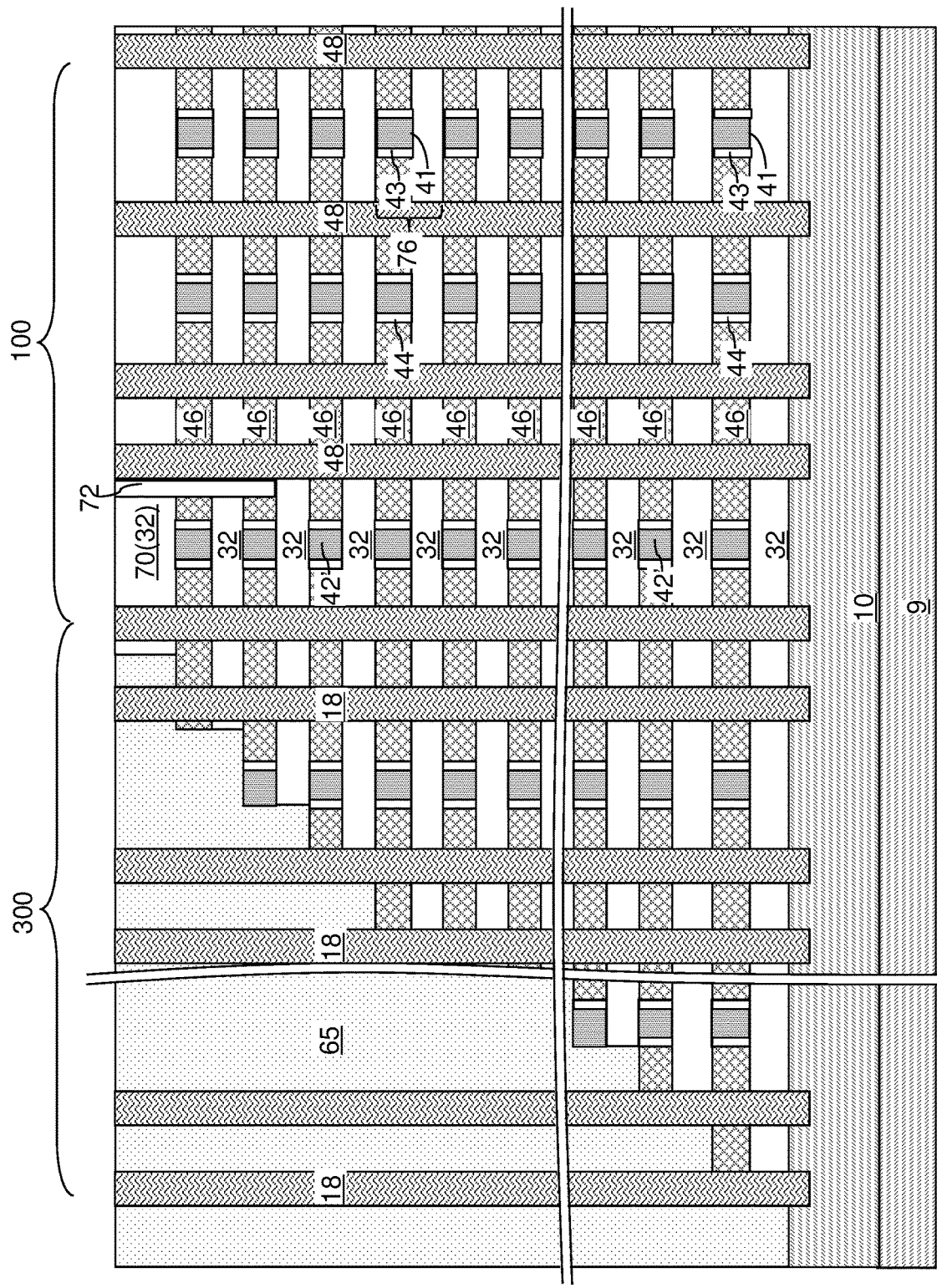
FIG. 27A is a vertical cross-sectional view of the second exemplary structure after formation of sacrificial opening fill structures and sacrificial isolation trench fill structures according to an embodiment of the present disclosure.
Figure 27B:
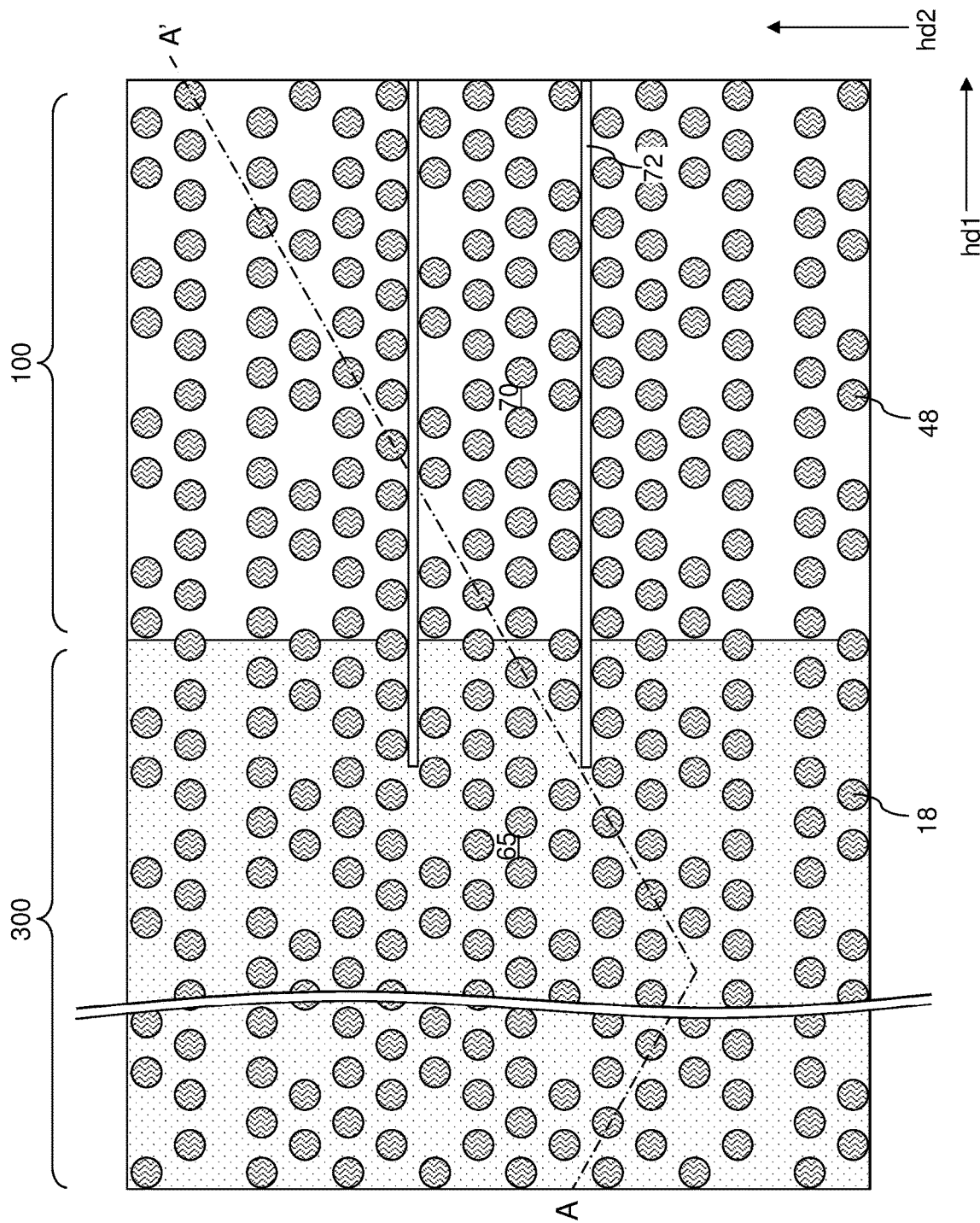
FIG. 27B is a top-down view of the second exemplary structure of FIG. 27A. The vertical plane A-A' is the plane of the cross-section for FIG. 27A.

Referring to FIGS. 27A and 27B, an optional sacrificial fill material can be deposited in the memory openings 49 and the support openings 19. The sacrificial fill material comprises a material that can be subsequently removed selective to the materials of the insulating layers 32, the electrically conductive layers 46, and the semiconductor material layer 10. The sacrificial fill material may comprise a carbon-based material (such as amorphous carbon or diamond-like carbon), amorphous silicon, organosilicate glass, or a polymer material. Excess portions of the sacrificial fill material can be removed from above the horizontal plane including the top surface of the insulating cap layer 70. Each remaining portion of the sacrificial fill material filling a memory opening 49 constitutes a sacrificial memory opening fill structure 48, and each remaining portion of the sacrificial fill material filling a support opening 19 constitutes a sacrificial support opening fill structure 18.

Figure 28A:
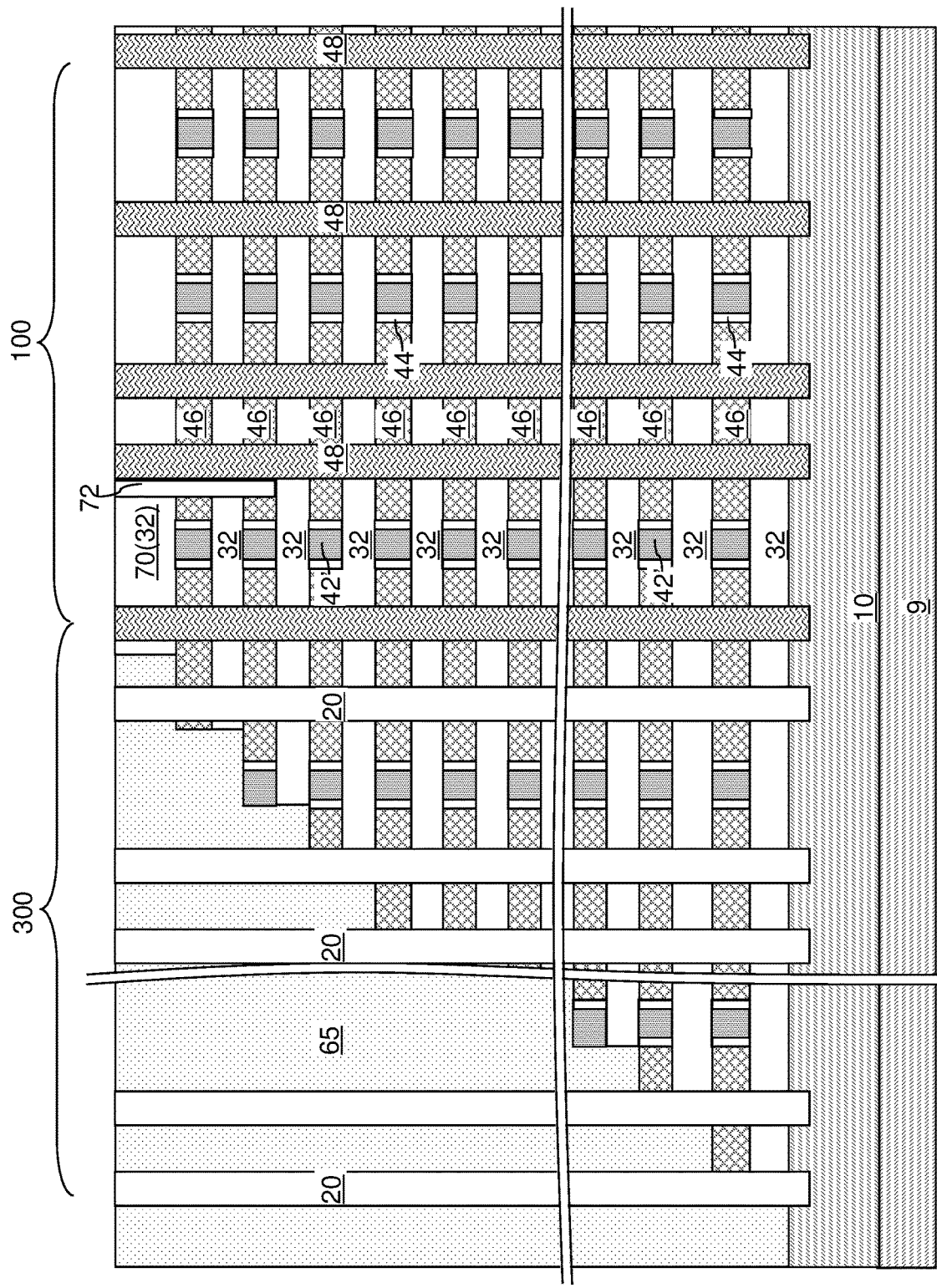
FIG. 28A is a vertical cross-sectional view of the second exemplary structure after formation of dielectric support pillar structures and isolation trench fill structures according to an embodiment of the present disclosure.
Figure 28B:
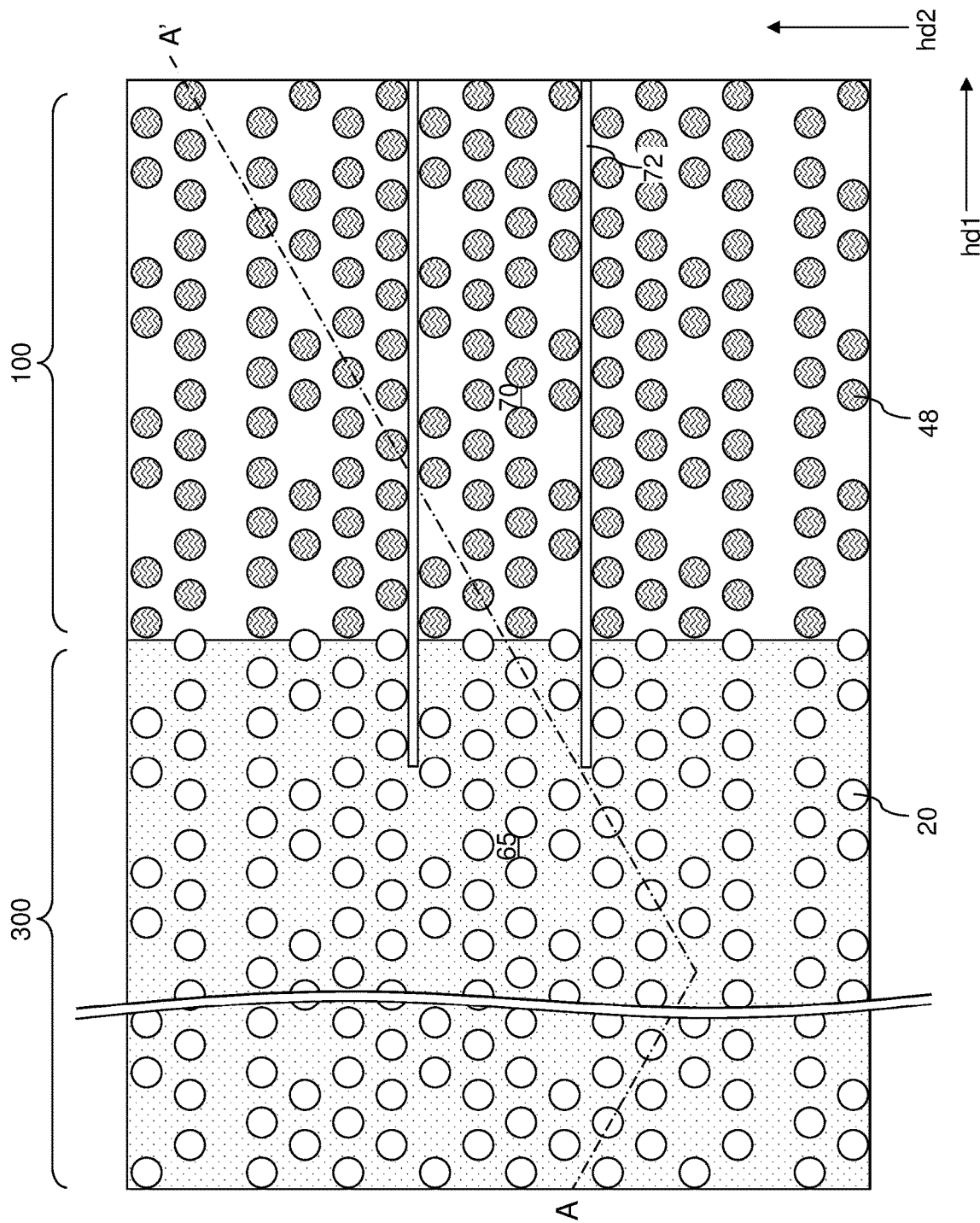
FIG. 28B is a top-down view of the second exemplary structure of FIG. 28A. The vertical plane A-A' is the plane of the cross-section for FIG. 28A.

Referring to FIGS. 28A and 28B, a photoresist layer (not shown) can be applied over the insulating cap layer 70, and can be lithographically patterned to form openings in areas overlying the sacrificial support opening fill structures 18. The patterned photoresist layer can cover each of the sacrificial memory opening fill structures 48 in the memory array region 100.

A selective etch process can be performed to remove the sacrificial fill material of the sacrificial support opening fill structures 18 without removing the materials of the alternating stacks (32, 46) and the semiconductor material layer 10. Voids are formed in the volumes of the support openings 19. The photoresist layer can be subsequently removed, for example, by ashing.

A dielectric fill material can be conformally deposited in the voids in the support openings 19. The dielectric fill material may comprise undoped silicate glass or a doped silicate glass. Excess portion of the dielectric fill material overlying the horizontal plane including the top surface of the insulating cap layer 70 can be removed by a planarization process, which may comprise a recess etch process and/or a chemical mechanical polishing (CMP) process. Each remaining portion of the dielectric fill material that fills a support opening 19 constitutes a support pillar structure, which is herein referred to as a dielectric support pillar structure 20.

Figure 29A:
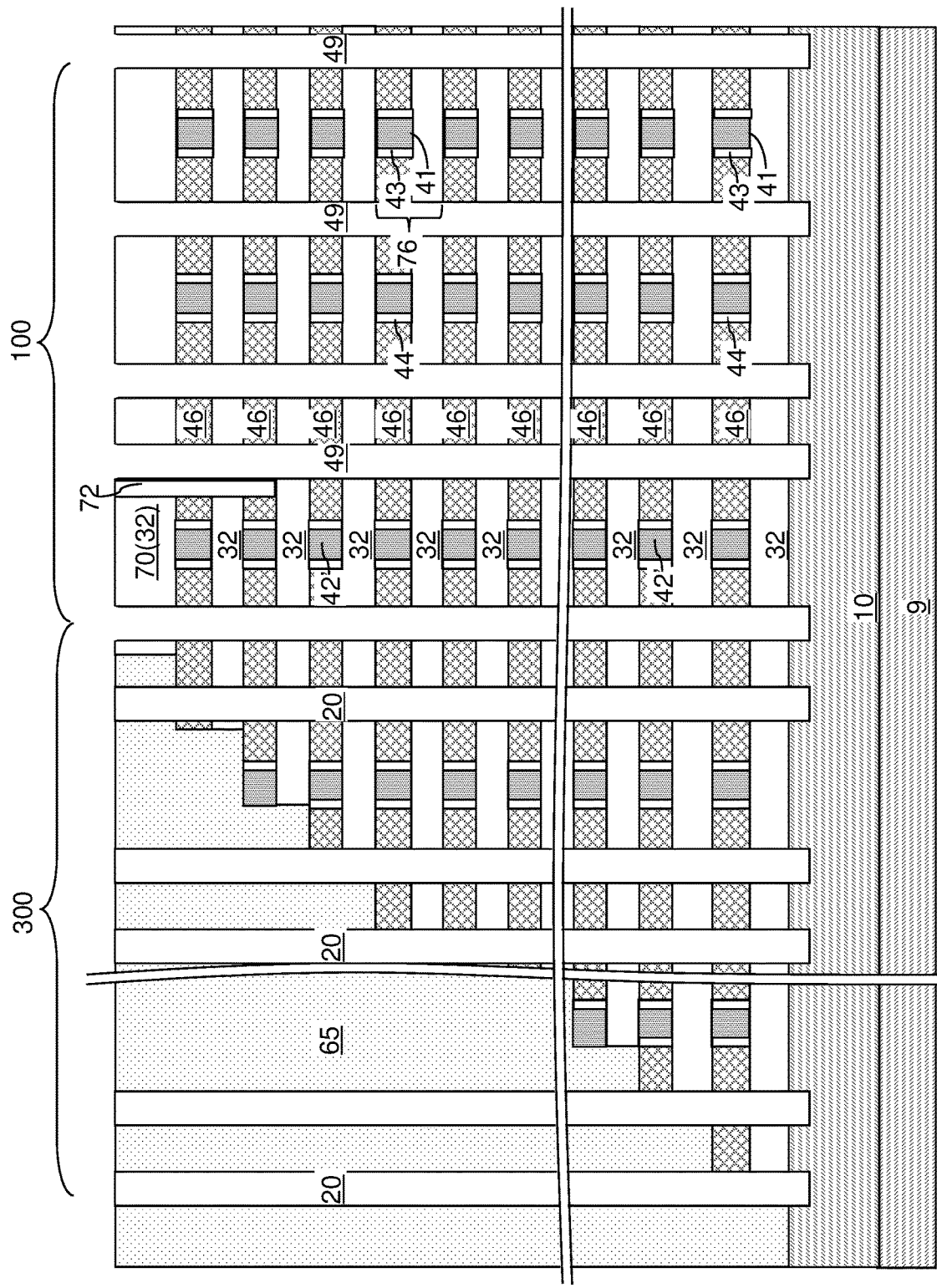
FIG. 29A is a vertical cross-sectional view of the second exemplary structure after removal of sacrificial memory opening fill structures according to an embodiment of the present disclosure.
Figure 29B:
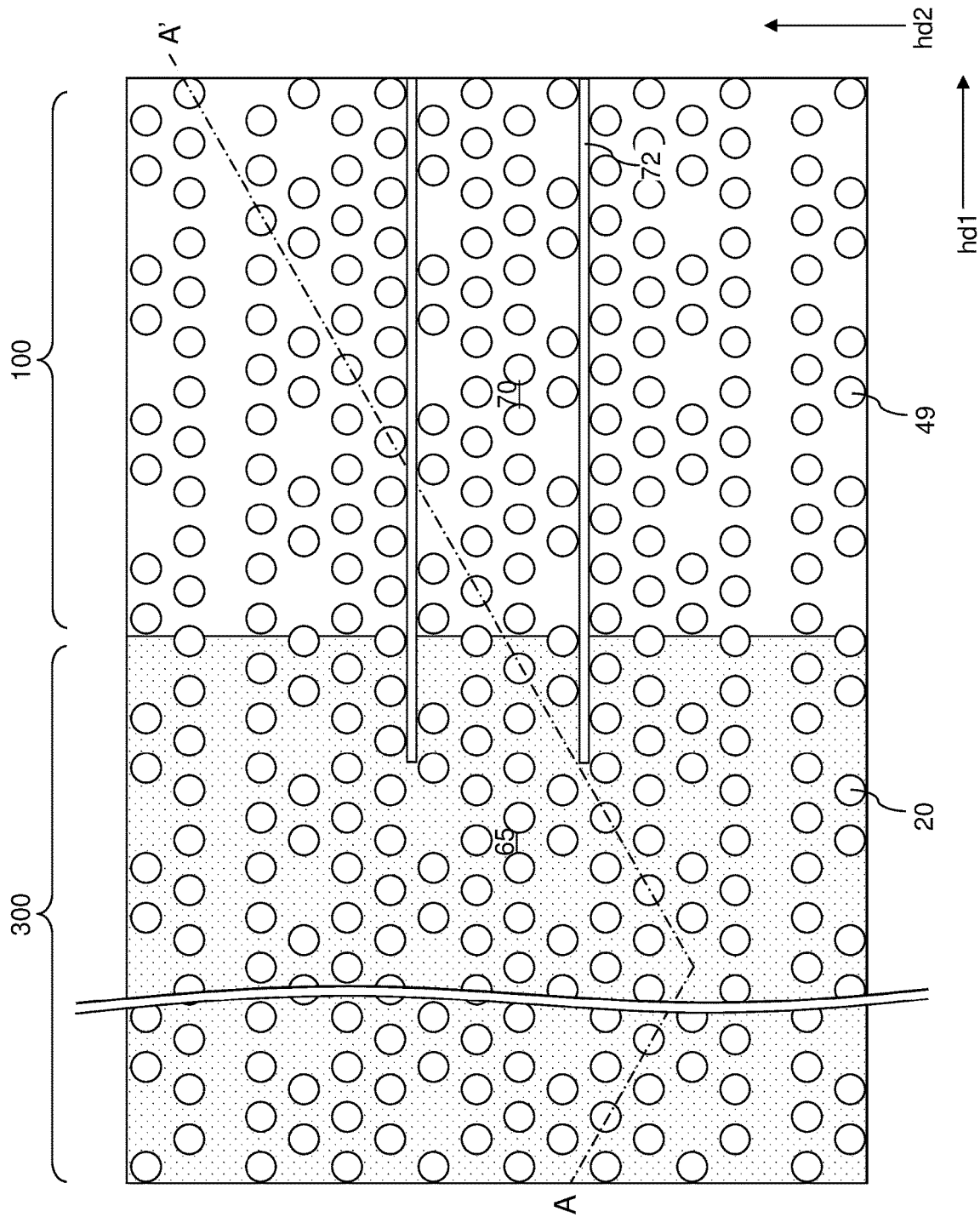
FIG. 29B is a top-down view of the second exemplary structure of FIG. 29A. The vertical plane A-A' is the plane of the cross-section for FIG. 29A.

Referring to FIGS. 29A and 29B, a selective etch process can be performed to remove the sacrificial fill material of the sacrificial memory opening fill structures 48 without removing the materials of the alternating stacks (32, 46) and the semiconductor material layer 10. Voids are formed in the volumes of the memory openings 49.

FIGS. 30A-30G are sequential vertical cross-sectional views of a region around a memory opening 49 during formation of a memory opening fill structure 58 according to an embodiment of the present disclosure.

Referring to FIG. 30A, a memory opening 49 is illustrated after the processing steps of FIGS. 29A and 29B.

Referring to FIG. 30B, a memory film 50 is formed in each memory opening 49, as described above with respect to FIG. 10B.

Referring to FIG. 30C, the memory film 50 is anisotropically etched, as described above with respect to FIG. 10C.

Referring to FIG. 30D, the semiconductor channel layer 60L is deposited directly on the semiconductor surface of the semiconductor material layer 10 and directly on the memory film 50, as described above with respect to FIG. 10D.

Figures 30E, 30F:
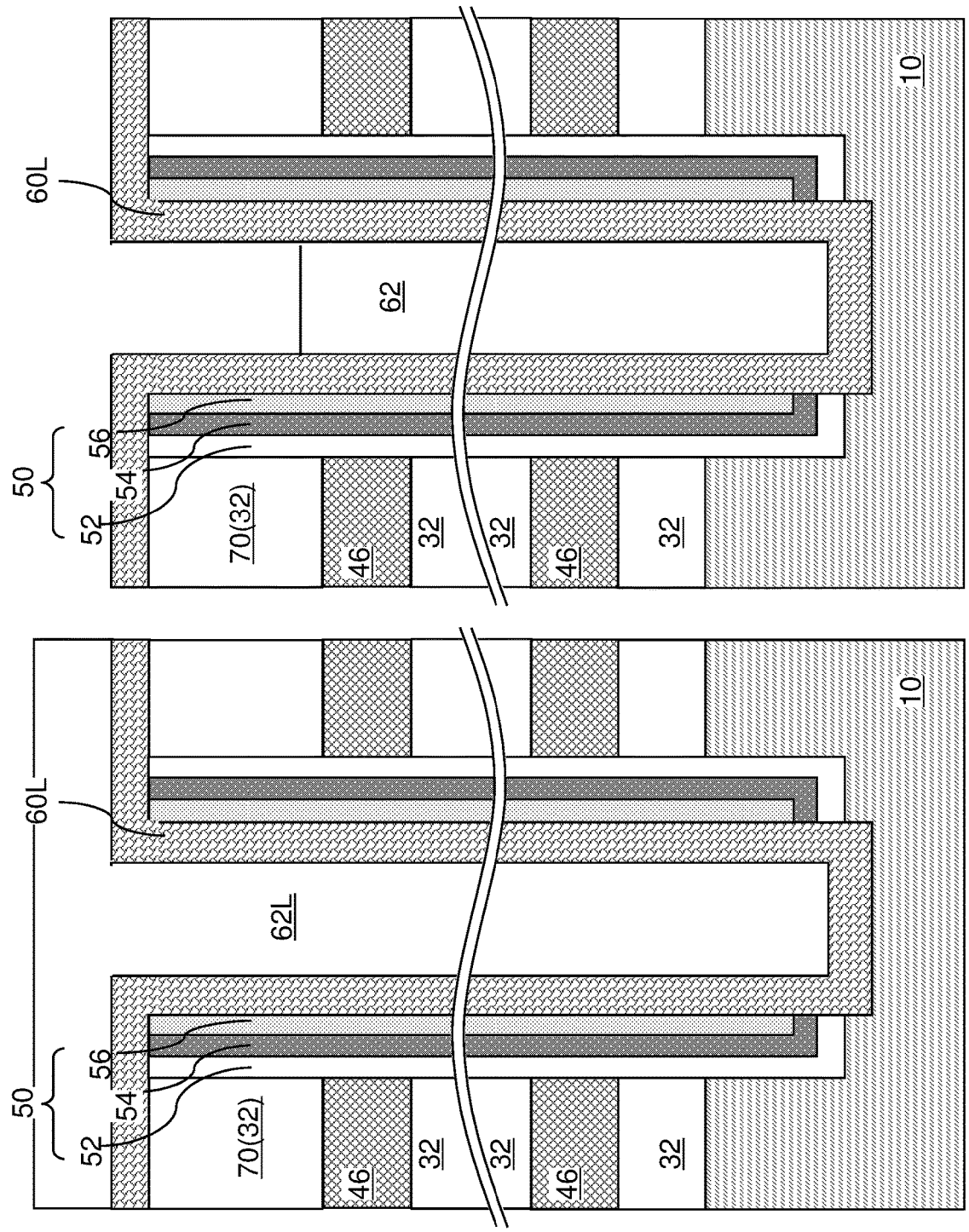

Referring to FIG. 30E, the dielectric core layer 62L can be deposited to fill any remaining portion of the memory cavity 49' within each memory opening 49, as described above with respect to FIG. 10E.

Referring to FIG. 30F, the horizontal portion of the dielectric core layer 62L can be removed to form the dielectric core 62, as described above with respect to FIG. 10F.

Figure 30G:
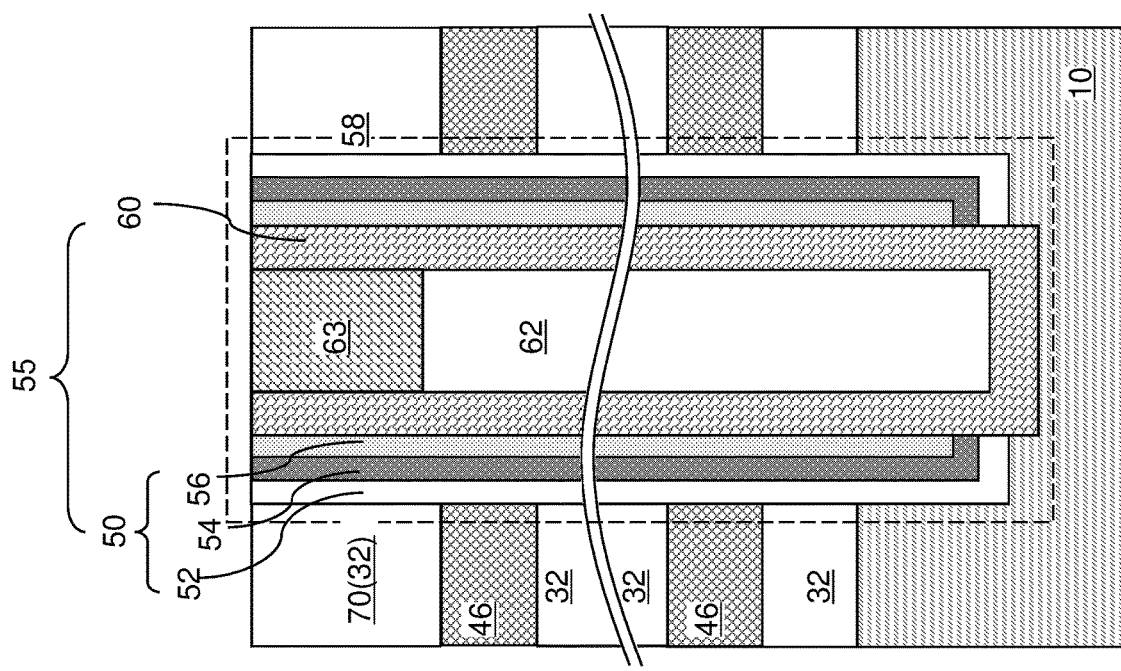
Figure 31A:
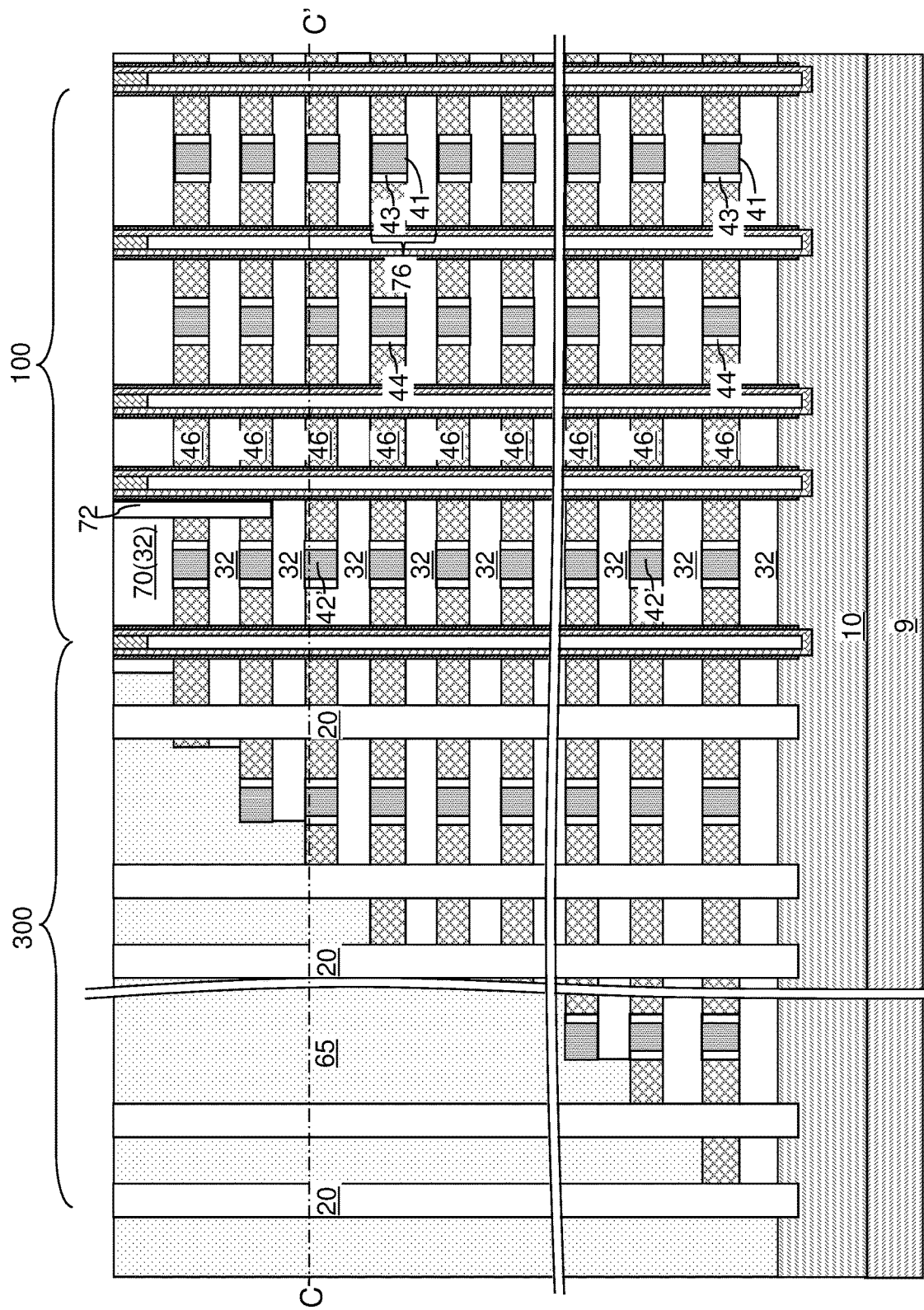
FIG. 31A is a vertical cross-sectional view of the second exemplary structure after formation of memory opening fill structures according to an embodiment of the present disclosure.
Figure 31B:
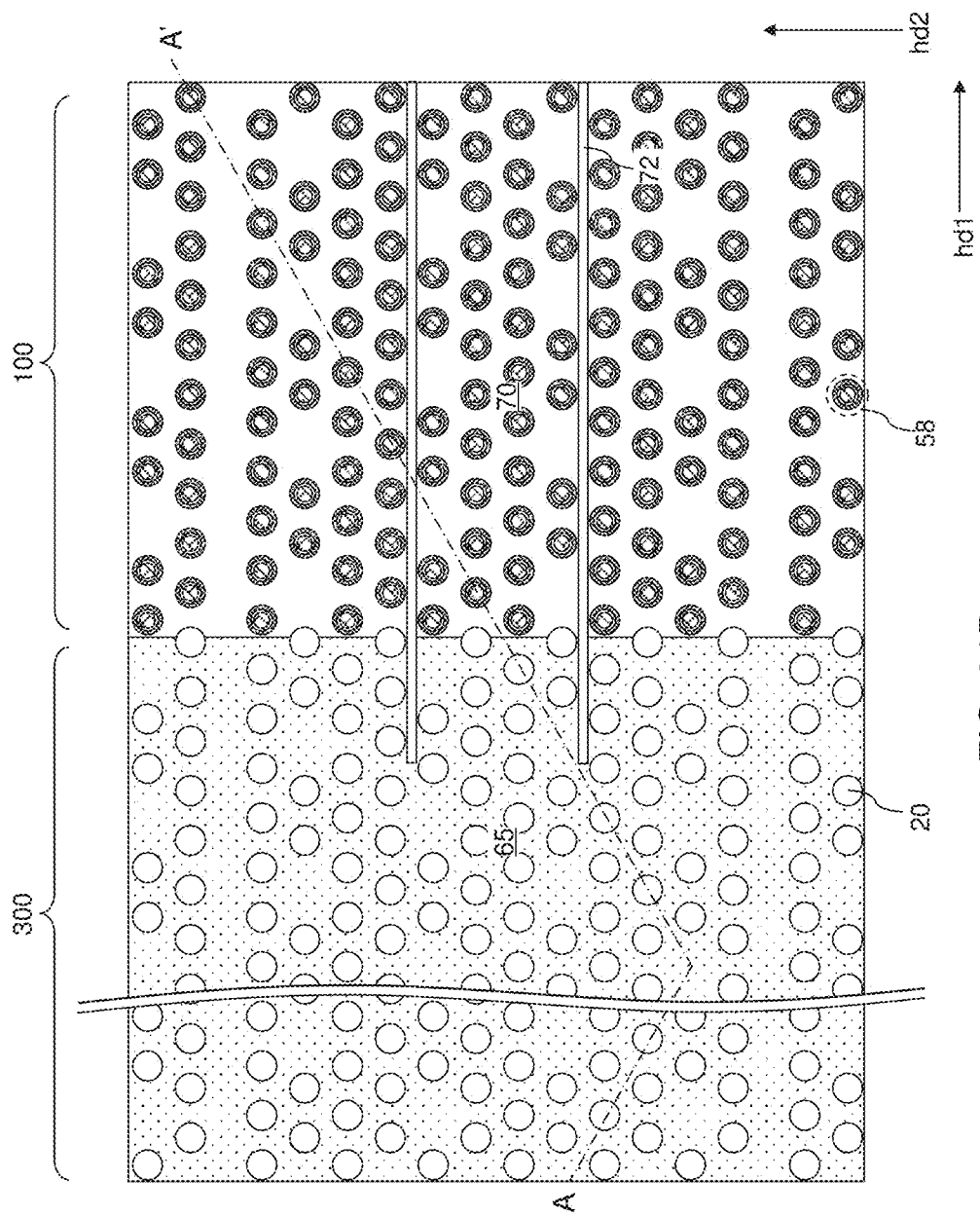
FIG. 31B is a top-down view of the second exemplary structure of FIG. 31A. The vertical plane A-A' is the plane of the cross-section for FIG. 31A.
Figure 31C:
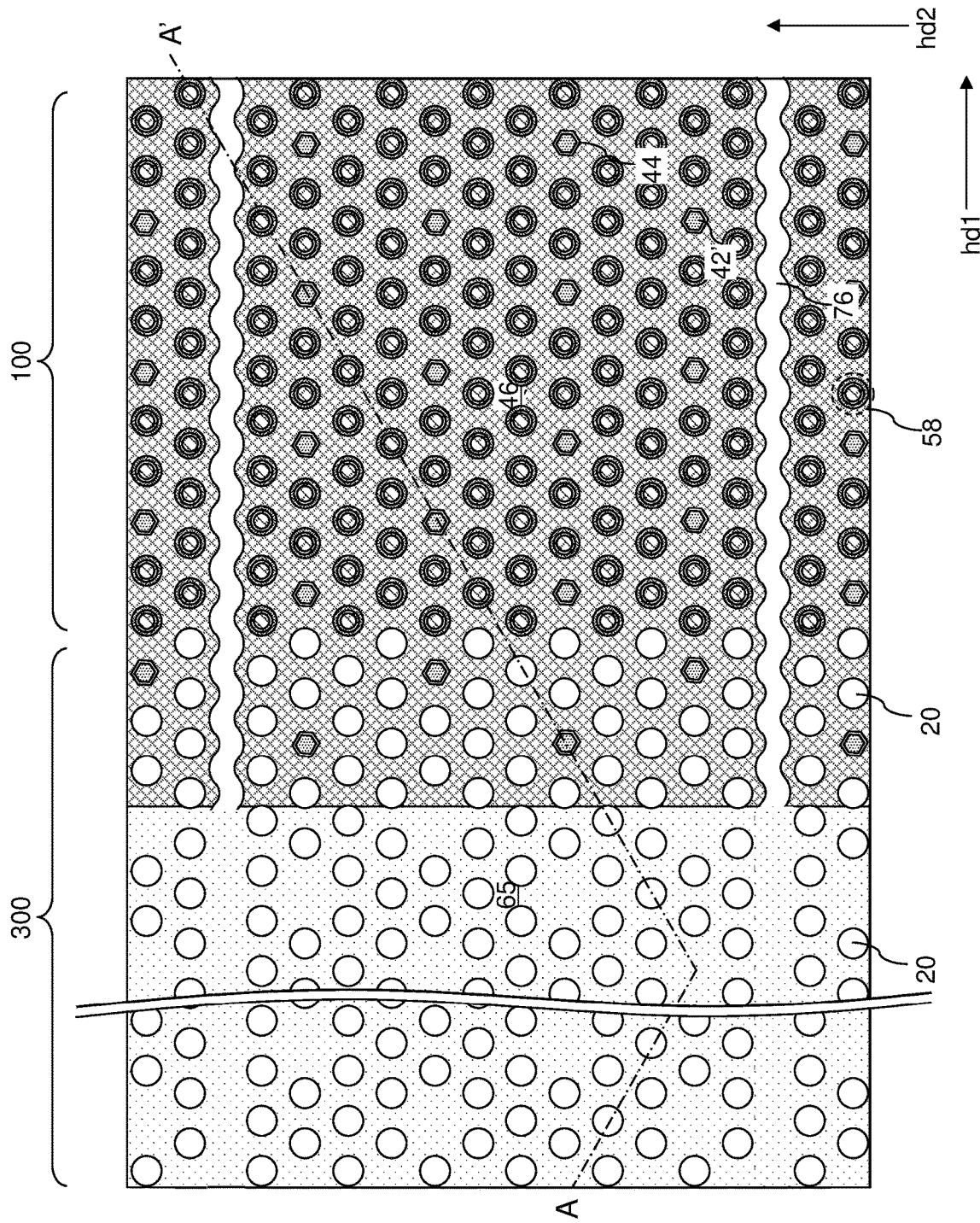
FIG. 31C is a horizontal cross-sectional view of the second exemplary structure along the horizontal plane C-C' of FIG. 31A.
Figure 31D:
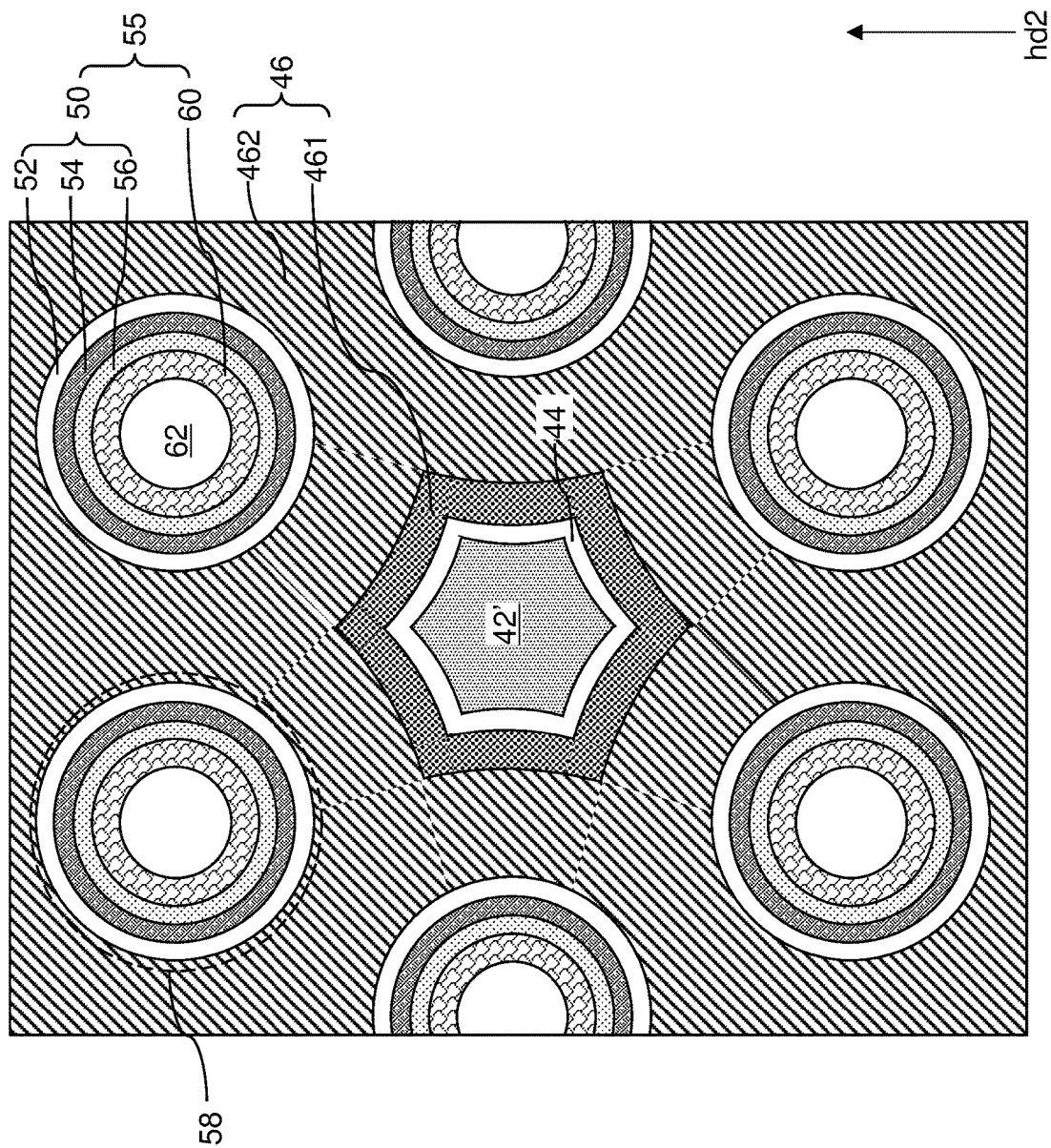
FIG. 31D is a magnified view of a region in FIG. 31C.

Referring to FIG. 30G, the drain region 63 and the vertical semiconductor channel 60 are formed, as described above with respect to FIG. 10G. Each combination of a memory film 50 and a vertical semiconductor channel 60 within a memory opening 49 constitutes a memory stack structure 55. Each combination of a memory stack structure 55, a dielectric core 62, and a drain region 63 within a memory opening 49 is herein referred to as a memory opening fill structure 58. A two-dimensional array of memory opening fill structures 58 can be formed in a two-dimensional array of memory openings 49 through an alternating stack of insulating layers 32 and electrically conductive layers 46. Each of the memory opening fill structures 58 comprises a respective vertical stack of memory elements and a respective vertical semiconductor channel 60.

In an alternative embodiment, the steps shown in FIGS. 27A, 27B, 28A and 28B may be omitted if the support pillar structures 20 have the same composition and structure as the memory opening fill structures 58. In this case, the support pillar structures 20 and the memory opening fill structures 58 are formed in the respective support openings 19 and memory openings 49 during the same process steps described above with respect to FIGS. 30A-30G.

Referring to FIGS. 31A-31D, the second exemplary structure is illustrated after formation of memory opening fill structures 58. In one embodiment, a two-dimensional array of memory opening fill structures 58 and a two-dimensional array of spacer plate structure stacks (42', 44) are interlaced with each other in an alternating stack of insulating layers 32 and electrically conductive layers 46. In one embodiment, the memory opening fill structures 58 and the spacer plate structure (42', 44) stacks are located at hexagonal sites of a two-dimensional hexagonal closed packed array in a plan view along the vertical direction.

In one embodiment, the ratio of a total number of first hexagonal sites of the two-dimensional hexagonal array occupied by the memory opening fill structures 58 to a total number of second hexagonal sites of the two-dimensional hexagonal array occupied by the spacer plate structure (42', 44) stacks may be in a range from 4 to 16.

In one embodiment, each of the electrically conductive layers 46 comprises a combination of a respective metallic barrier liner 461 and a respective metallic fill material portion 462 that is embedded within the respective metallic barrier liner 461.

Figure 12A:
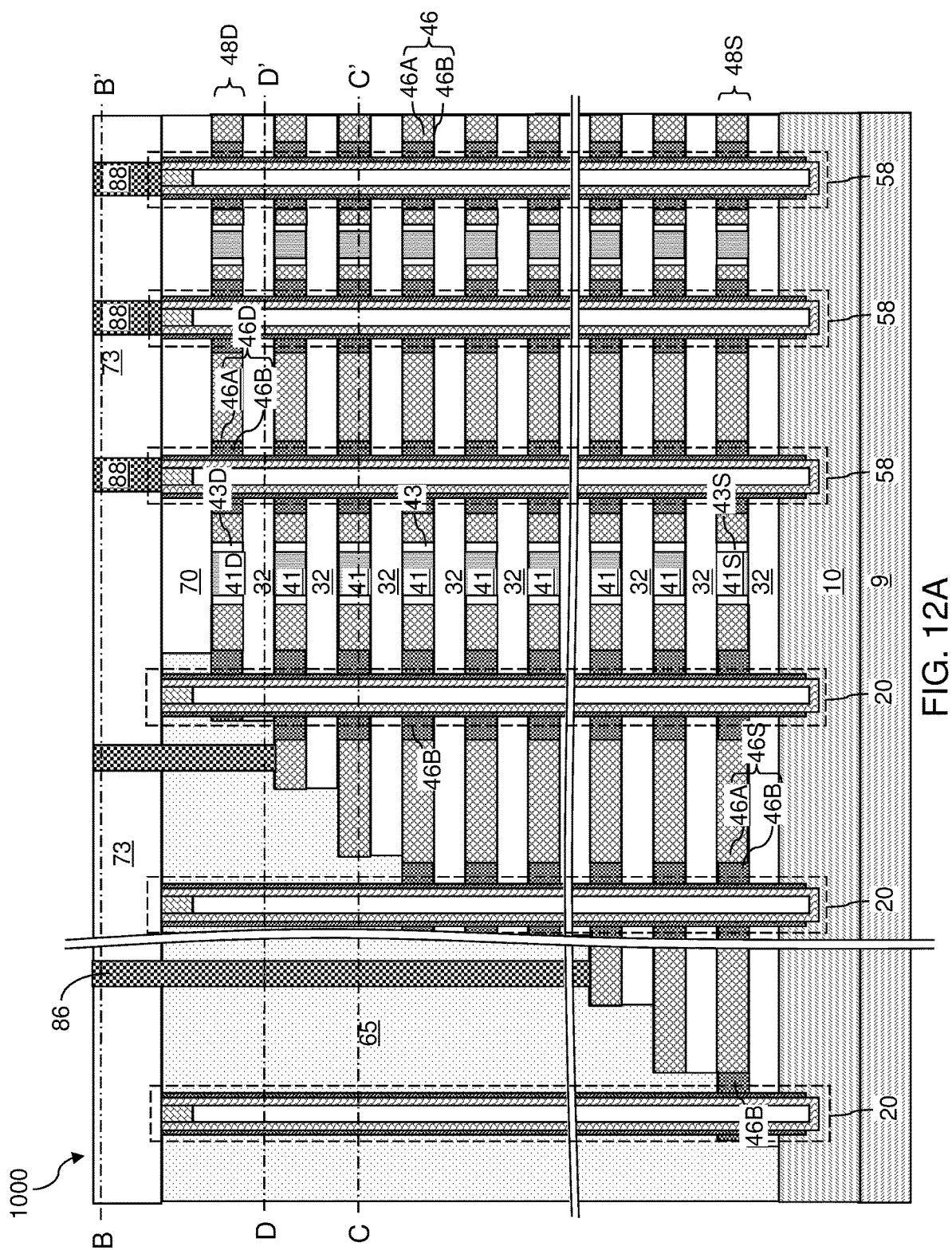
FIG. 12A is a vertical cross-sectional view of the first exemplary structure after formation of contact via structures according to an embodiment of the present disclosure.
Figure 12B:
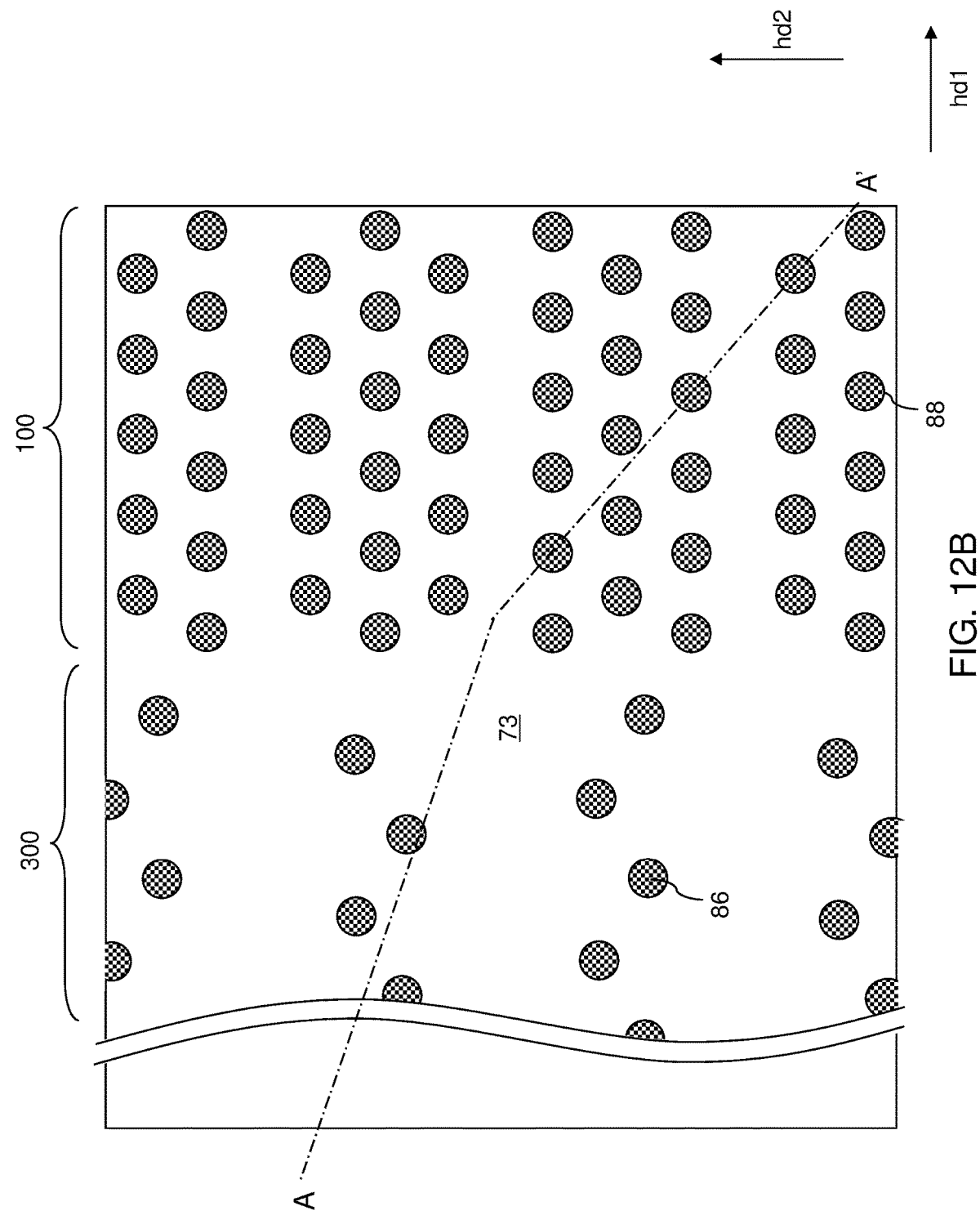
FIG. 12B is a horizontal cross-sectional view of the first exemplary structure along the horizontal plane B-B' of FIG. 12A.
Figure 12D:
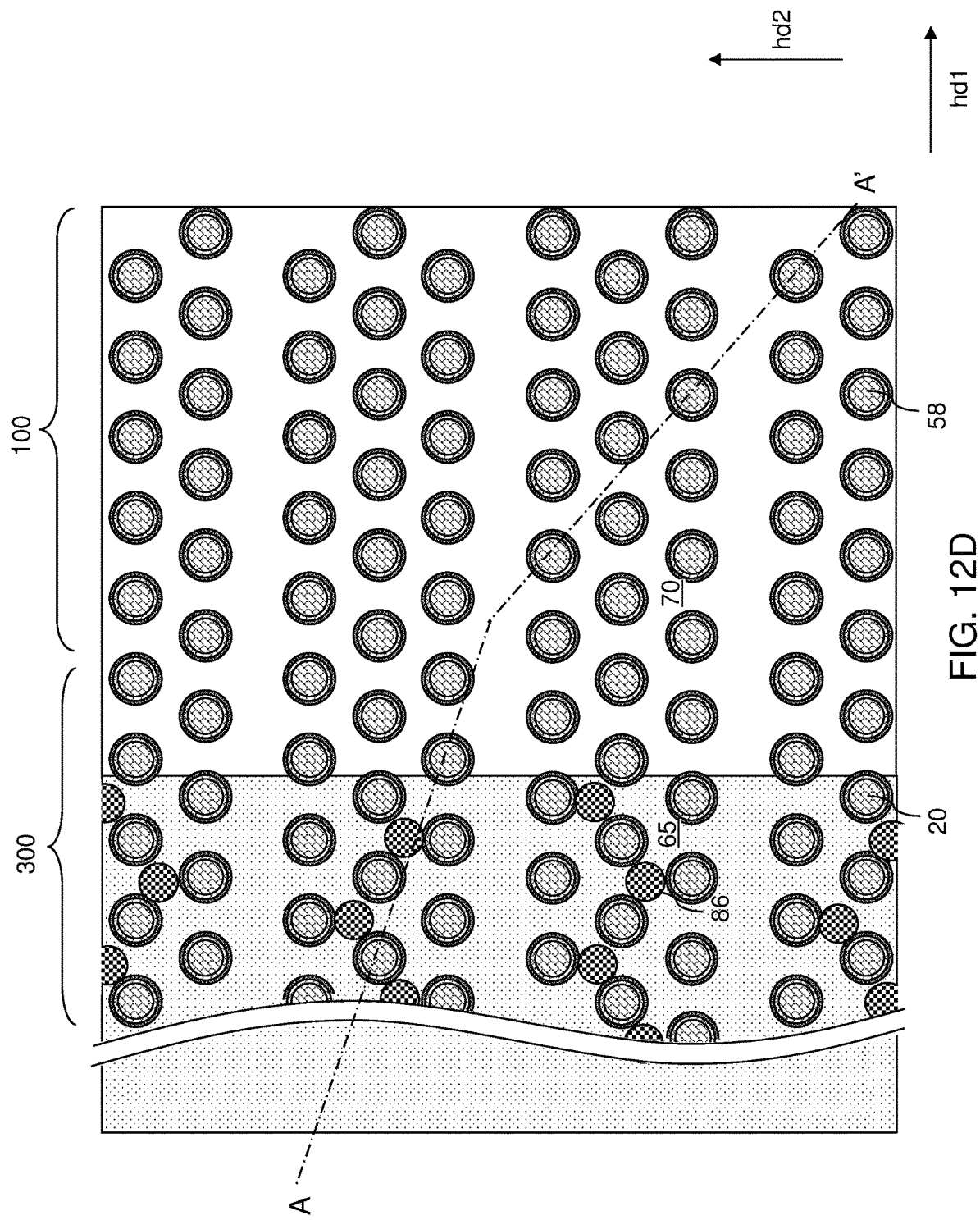
FIG. 12D is a horizontal cross-sectional view of the first exemplary structure along the horizontal plane D-D' of FIG. 12A.
Figure 32A:
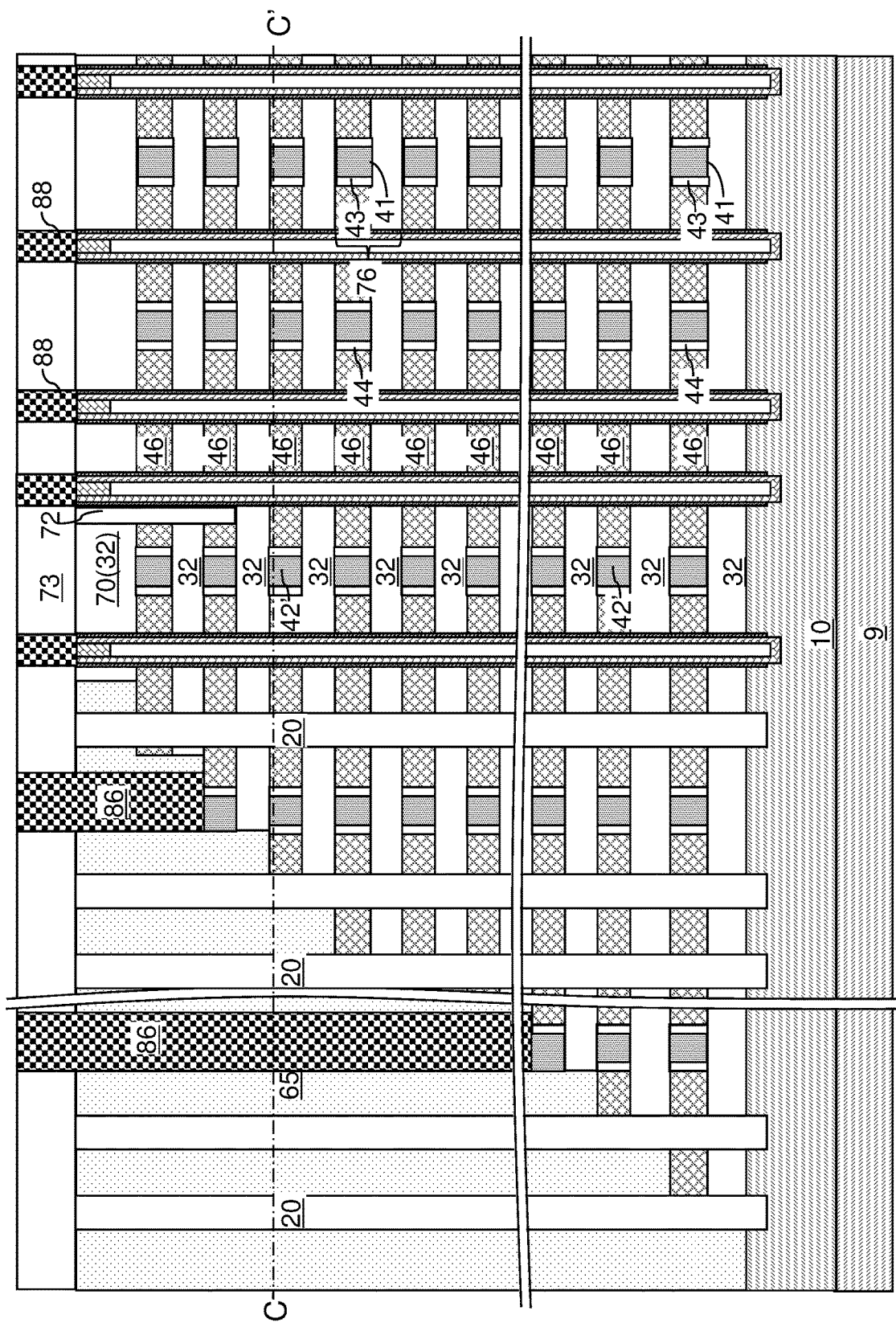
FIG. 32A is a vertical cross-sectional view of the second exemplary structure after formation of contact via structures according to an embodiment of the present disclosure.
Figure 32B:
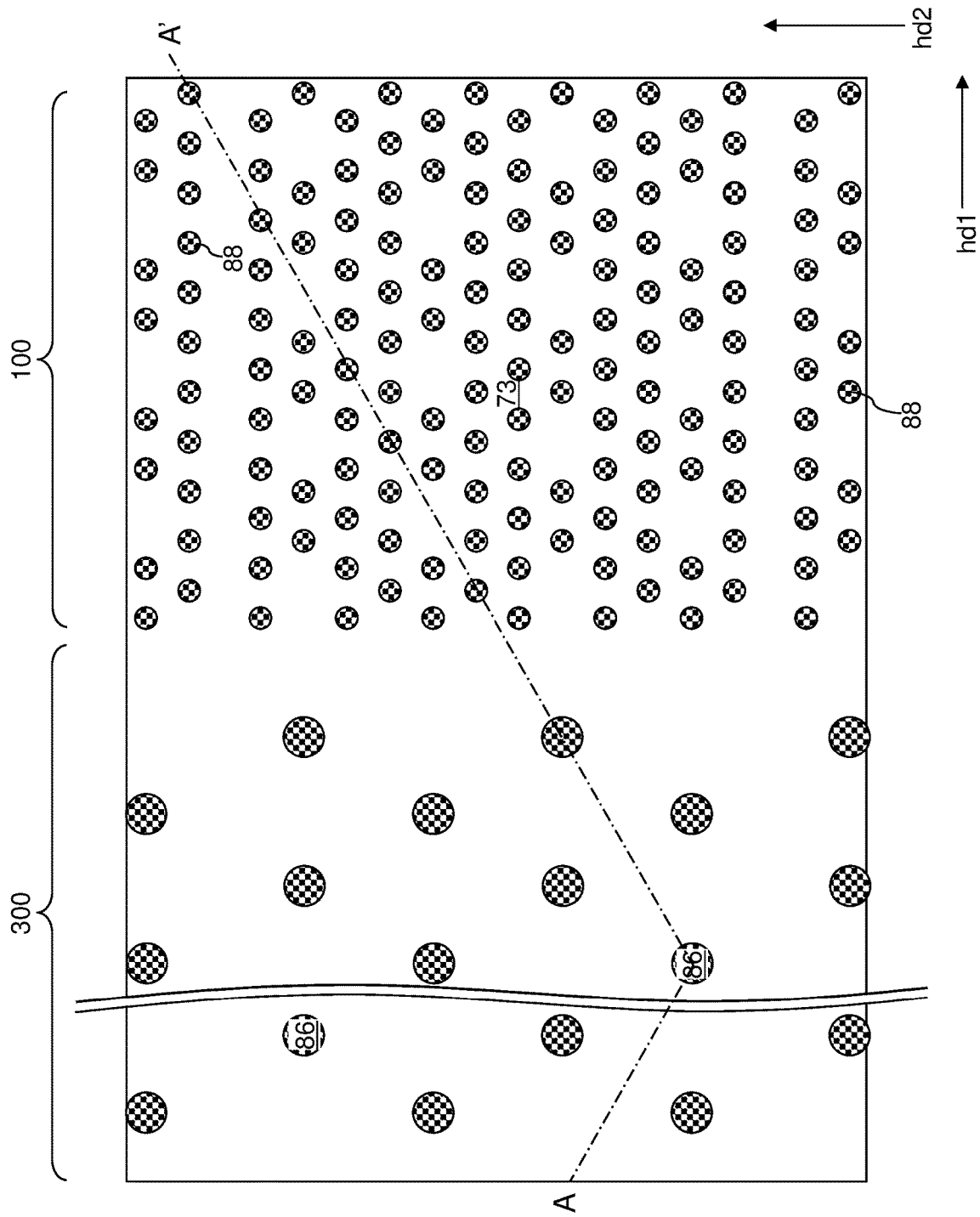
FIG. 32B is a top-down view of the second exemplary structure of FIG. 32A. The vertical plane A-A' is the plane of the cross-section for FIG. 32A.
Figure 32C:
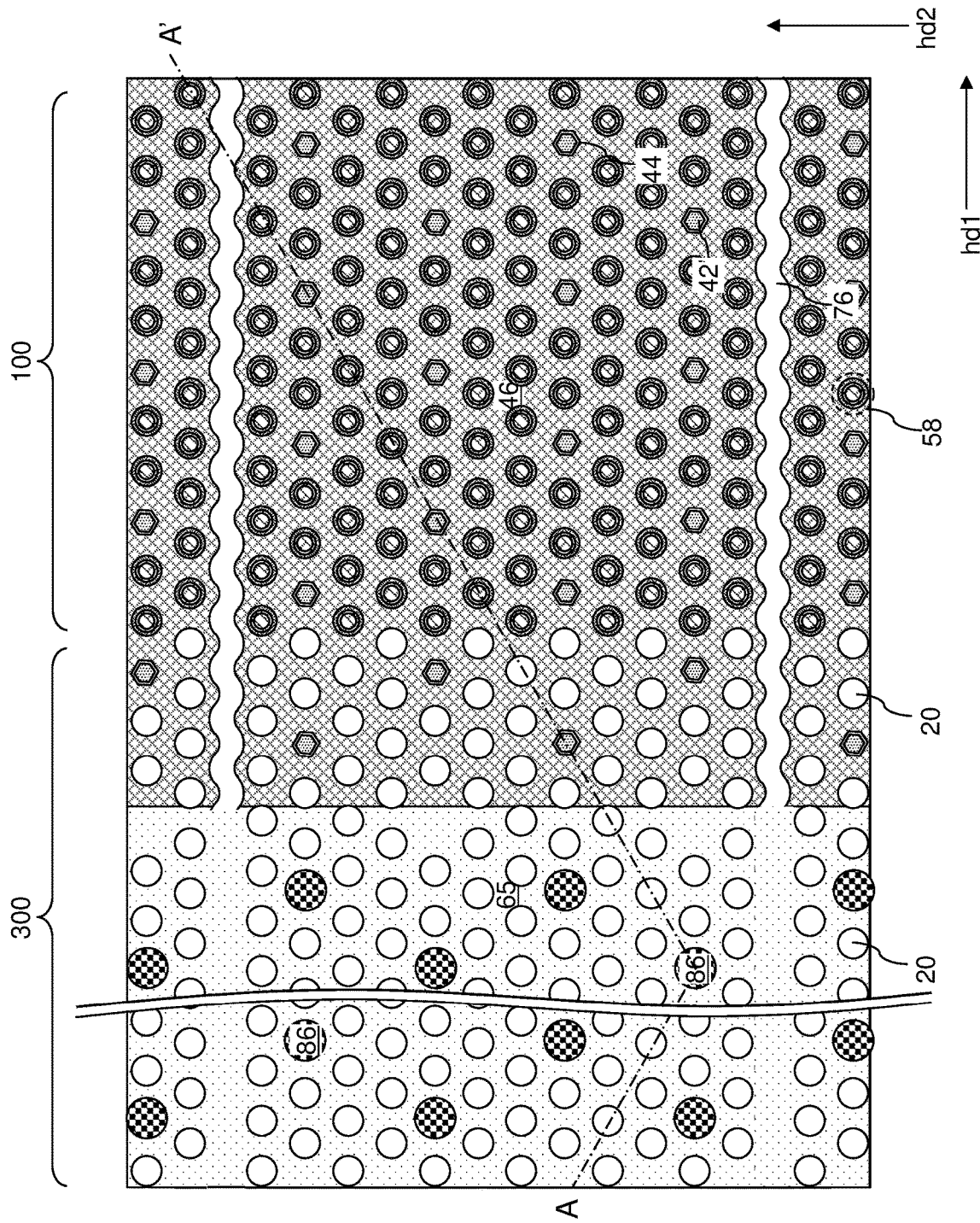
FIG. 32C is a horizontal cross-sectional view of the second exemplary structure along the horizontal plane C-C' of FIG. 32A.

Referring to FIGS. 32A-32C, the processing steps described with reference to FIGS. 12A-12C can be performed to form various contact via structures (88, 86).

Figure 33:
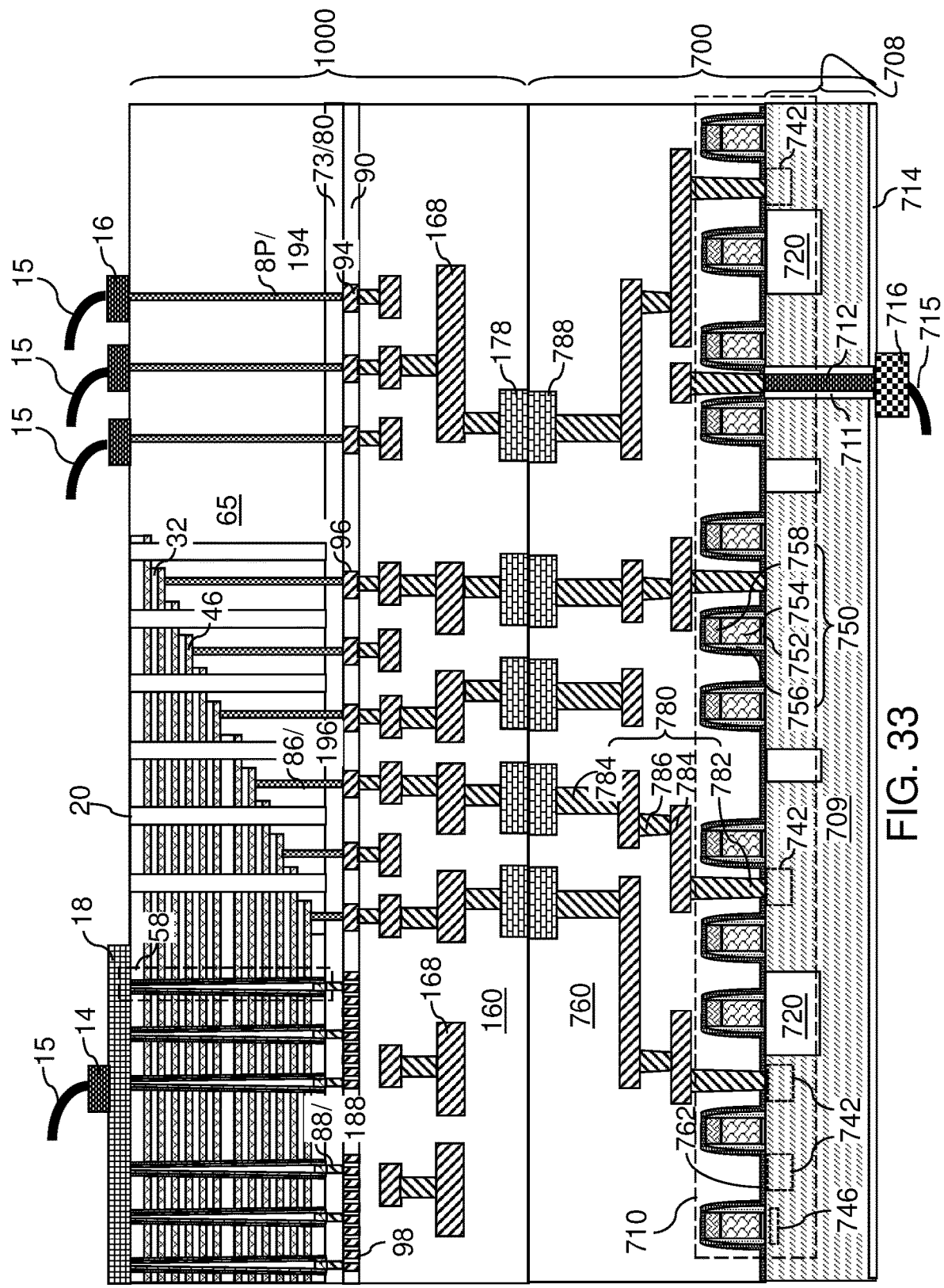
FIG. 33 is a vertical cross-sectional view of the second exemplary structure after bonding a logic die to a memory die, removal of a carrier substrate, and formation of a source layer, a source bonding pad, and backside bonding pads according to an embodiment of the present disclosure.

Referring to FIG. 33, the processing steps described with reference to FIGS. 15-21 may be performed to provide a memory die 1000, to provide a logic die 700, to bond the memory die 1000 to the logic die 700, to remove the substrate (9, 10), and to form patterned source layers 18, bonding pads (14, 16), and bonding wires 15. Generally, a logic die 700 can be bonded to a memory die 1000 containing an alternating stack (32, 46) and memory opening fill structures 58. The substrate (9, 10) can be removed to expose end portions of the vertical semiconductor channels 60. A source layer 18 can be formed in contact with a bottommost surface of the alternating stack (32, 46) and a bottom end of each of the vertical semiconductor channels 60 (i.e., the exposed end portions of the vertical semiconductor channels 60). A source-side bonding pad 14 can be formed in direct contact with or in electrical connection through at least one metal interconnect structure with the source layer 18.

Referring to all drawings related to the second exemplary structure of the present disclosure and according to various embodiments of the present disclosure, a semiconductor structure includes an alternating stack of insulating layers 32 and composite layers {46, 76, (42', 44)}, each of the composite layers includes a plurality of electrically conductive word line strips 46 and a plurality of dielectric isolation structures {76, (42', 44)}, and each of the insulating layers 32 has an areal overlap with each electrically conductive word line strip 46 and each dielectric isolation structure {76, (42', 44)} within the composite layers within a memory array region 100 in a plan view along a vertical direction, rows of memory openings 49 arranged along the first horizontal direction hd1, where each row of memory openings of the rows of memory openings vertically extends through each insulating layer 32 within the alternating stack and one electrically conductive strip 46 for each of the composite layers, and rows of memory opening fill structures 58 located within the rows of memory openings 49, where each of the memory opening fill structures 58 includes a vertical stack of memory elements (e.g., memory film 50) and a vertical semiconductor channel 60.

In one embodiment, the plurality of dielectric isolation structures {76, (42', 44)} comprises spacer plate structures (42', 44) embedded within the electrically conductive word line strips 46. In one embodiment, the spacer plate structures (42', 44) comprise an array of spacer plate structure stacks each containing a vertical stack of a respective subset of the spacer plate structures (42', 44).

In one embodiment, the rows of the memory opening fill structures 58 form two-dimensional array of memory opening fill structures which are interlaced with a two-dimensional array of the spacer plate structure (42', 44) stacks such that the memory opening fill structures 58 and the spacer plate structure (42', 44) stacks are located at hexagonal sites of a two-dimensional hexagonal close packed array in a plan view along the vertical direction. In one embodiment, a ratio of a total number of first hexagonal sites of the two-dimensional hexagonal array occupied by the memory opening fill structures 58 to a total number of second hexagonal sites of the two-dimensional hexagonal array occupied by the spacer plate structure (42', 44) stacks is in a range from 4 to 16.

In one embodiment, each of the spacer plate structures (42', 44) comprises six dielectric sidewalls that are in direct contact with a respective one of the electrically conductive word line strips 46. In one embodiment, each of the spacer plate structures (42', 44) comprises a spacer plate core 42 comprising silicon nitride and a silicon oxide liner 44 that laterally surrounds the spacer plate core 42' and contacts a respective one of the electrically conductive word line strips 46.

In one embodiment, each of the spacer plate structures (42', 44) comprises a respective plurality of sidewalls that are equidistant from sidewalls of a respective plurality of the memory opening fill structures 58. The respective plurality of sidewalls of each of the spacer plate structures (42', 44) comprises a respective set of six horizontally concave and vertically straight sidewalls. In one embodiment, each of the spacer plate structures (42', 44) is in direct contact with and has a same vertical thickness as a respective one of the electrically conductive word line strips 46.

In one embodiment, the plurality of dielectric isolation structures {76, (42', 44)} further comprises isolation strips 76 having a laterally-undulating dielectric sidewall that generally extends along a first horizontal direction hd1 and having a periodic lateral undulation along a second horizontal direction hd2 that is perpendicular to the first horizontal direction hd1. Each of the insulating layers 32 and the electrically conductive word line strips 46 in the alternating stack comprises respective laterally-undulating sidewalls that are in direct contact with the laterally-undulating dielectric sidewall of the isolation strips 76.

In one embodiment, each of the isolation strips 76 comprise a silicon nitride dielectric isolation strip 41 laterally surrounded by two silicon oxide isolation strips 43. The plurality of electrically conductive word line strips 46 laterally extend along a first horizontal direction hd1 and the plurality of the isolation strips laterally extend along the first horizontal direction hd1. The plurality of electrically conductive word line strips 46 and the plurality of isolation strips 76 are interlaced with each other along the second horizontal direction hd2 that is perpendicular to the first horizontal direction hd1. The insulating layers 32 continuously extend along the second horizontal direction hd2 between the electrically conductive word line strips 46, the isolation strips 76 and the spacer plate structures (42', 44). A pair of neighboring isolation strips 76 form boundaries of a memory block, and the spacer plate structures (42', 44) are located in the memory block between the pair of neighboring isolation strips 76.

In one embodiment, the alternating stack comprises stepped surfaces such that lateral extents of the electrically conductive word line strips 46 along the first horizontal direction hd1 decrease with an upward vertical distance from a horizontal plane including a bottommost surface of the alternating stack, a stepped dielectric material portion 65 overlies and is in contact with the stepped surfaces of the alternating stack, and the stepped dielectric material portion 65 does not encapsulate any of the spacer plate structures (42, 44).

In one embodiment shown in FIG. 33, the semiconductor structure 1000 also includes a source layer 18 contacting a bottommost surface of the alternating stack and a bottom end of each of the vertical semiconductor channels 60, and a source-side bonding pad 14 is in direct contact with or electrically connected through at least one metal interconnect structure with the source layer 18.

The various embodiments of the present disclosure can provide a three-dimensional memory array including electrically conductive layers 46 formed by replacement of portions of spacer material layers 142 by providing an isotropic etchant and at least one metal precursor material through memory openings 49 and support openings 19. Formation of the electrically conductive layers 46 through the memory openings 49 and the support openings 19 allows use of smaller gaps between neighboring pairs of memory opening fill structures 58 and the dielectric support pillar structures 20, and reduces the footprint of the device, and reduce the cost of the process steps. The spacer plate structures (42', 44) prevent collapse of the insulating layers 32 during formation of the laterally-extending cavities 47.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure, comprising:
an alternating stack of insulating layers and composite layers, wherein each of the composite layers comprises a plurality of electrically conductive word line strips and a plurality of dielectric isolation structures, and each of the insulating layers has an areal overlap with each electrically conductive word line strip and each dielectric isolation structure within the composite layers within a memory array region in a plan view along a vertical direction;
rows of memory openings arranged along a first horizontal direction, wherein each row of memory openings of the rows of memory openings vertically extends through each insulating layer within the alternating stack and one electrically conductive strip for each of the composite layers; and
rows of memory opening fill structures located within the rows of memory openings,
wherein each of the memory opening fill structures comprises a vertical stack of memory elements and a vertical semiconductor channel; and
wherein the plurality of dielectric isolation structures comprises spacer plate structures embedded within the electrically conductive word line strips.

2. The semiconductor structure of claim 1, wherein the spacer plate structures comprise an array of spacer plate structure stacks each containing a vertical stack of a respective subset of the spacer plate structures.

3. The semiconductor structure of claim 2, wherein the rows of the memory opening fill structures form two-dimensional array of memory opening fill structures which are interlaced with a two-dimensional array of the spacer plate structure stacks such that the memory opening fill structures and the spacer plate structure stacks are located at hexagonal sites of a two-dimensional hexagonal close packed array in a plan view along the vertical direction.

4. The semiconductor structure of claim 3, wherein a ratio of a total number of first hexagonal sites of the two-dimensional hexagonal array occupied by the memory opening fill structures to a total number of second hexagonal sites of the two-dimensional hexagonal array occupied by the spacer plate structure stacks is in a range from 4 to 16.

5. The semiconductor structure of claim 1, wherein each of the spacer plate structures comprises six dielectric sidewalls that are in direct contact with a respective one of the electrically conductive word line strips.

6. The semiconductor structure of claim 5, wherein each of the spacer plate structures comprises a spacer plate core comprising silicon nitride and a silicon oxide liner that laterally surrounds the spacer plate core and contacts a respective one of the electrically conductive word line strips.

7. The semiconductor structure of claim 1, wherein each of the spacer plate structures comprises a respective plurality of sidewalls that are equidistant from sidewalls of a respective plurality of the memory opening fill structures.

8. The semiconductor structure of claim 7, wherein the respective plurality of sidewalls of each of the spacer plate structures comprises a respective set of six horizontally concave and vertically straight sidewalls.

9. The semiconductor structure of claim 1, wherein each of the spacer plate structures is in direct contact with and has a same vertical thickness as a respective one of the electrically conductive word line strips.

10. The semiconductor structure of claim 1, wherein the plurality of dielectric isolation structures further comprises isolation strips having a laterally-undulating dielectric sidewall that generally extends along a first horizontal direction and having a periodic lateral undulation along a second horizontal direction that is perpendicular to the first horizontal direction, wherein each of the insulating layers and the electrically conductive word line strips in the alternating stack comprises respective laterally-undulating sidewalls that are in direct contact with the laterally-undulating dielectric sidewall of the isolation strips.

11. The semiconductor structure of claim 10, wherein:
each of the isolation strips comprise a silicon nitride dielectric isolation strip laterally surrounded by silicon oxide isolation strips;
the plurality of electrically conductive word line strips laterally extend along the first horizontal direction and the plurality of the isolation strips laterally extend along the first horizontal direction;
the plurality of electrically conductive word line strips and the plurality of isolation strips are interlaced with each other along the second horizontal direction that is perpendicular to the first horizontal direction;
the insulating layers continuously extend along the second horizontal direction between the electrically conductive word line strips, the isolation strips and the spacer plate structures;
a pair of neighboring isolation strips form boundaries of a memory block; and
the spacer plate structures are located in the memory block between the pair of neighboring isolation strips.

12. The semiconductor structure of claim 1, further comprising:
a source layer contacting a bottommost surface of the alternating stack and a bottom end of each of the vertical semiconductor channels; and
a source-side bonding pad in direct contact with or electrically connected through at least one metal interconnect structure with the source layer.

13. A semiconductor structure, comprising:
an alternating stack of insulating layers and composite layers, wherein each of the composite layers comprises a plurality of electrically conductive word line strips and a plurality of dielectric isolation structures, and each of the insulating layers has an areal overlap with each electrically conductive word line strip and each dielectric isolation structure within the composite layers within a memory array region in a plan view along a vertical direction;
rows of memory openings arranged along a first horizontal direction, wherein each row of memory openings of the rows of memory openings vertically extends through each insulating layer within the alternating stack and one electrically conductive strip for each of the composite layers; and
rows of memory opening fill structures located within the rows of memory openings, wherein each of the memory opening fill structures comprises a vertical stack of memory elements and a vertical semiconductor channel;
wherein:
the alternating stack comprises stepped surfaces such that lateral extents of the electrically conductive word line strips along the first horizontal direction decrease with an upward vertical distance from a horizontal plane including a bottommost surface of the alternating stack;
a stepped dielectric material portion overlies and is in contact with the stepped surfaces of the alternating stack; and
the stepped dielectric material portion does not encapsulate any of spacer plate structures.

14. The semiconductor structure of claim 13, wherein the plurality of dielectric isolation structures comprises the spacer plate structures embedded within the electrically conductive word line strips.

15. The semiconductor structure of claim 13, further comprising:
a source layer contacting a bottommost surface of the alternating stack and a bottom end of each of the vertical semiconductor channels; and
a source-side bonding pad in direct contact with or electrically connected through at least one metal interconnect structure with the source layer.

16. A semiconductor structure, comprising:
an alternating stack of insulating layers and composite layers, wherein each of the composite layers comprises a plurality of electrically conductive word line strips and a plurality of dielectric isolation structures, and each of the insulating layers has an areal overlap with each electrically conductive word line strip and each dielectric isolation structure within the composite layers within a memory array region in a plan view along a vertical direction;
rows of memory openings arranged along a first horizontal direction, wherein each row of memory openings of the rows of memory openings vertically extends through each insulating layer within the alternating stack and one electrically conductive strip for each of the composite layers;
rows of memory opening fill structures located within the rows of memory openings, wherein each of the memory opening fill structures comprises a vertical stack of memory elements and a vertical semiconductor channel;
a source layer contacting a bottommost surface of the alternating stack and a bottom end of each of the vertical semiconductor channels; and
a source-side bonding pad in direct contact with or electrically connected through at least one metal interconnect structure with the source layer.

\* \* \* \* \*